United States Patent [19]

Kato

[11] Patent Number: 5,526,102
[45] Date of Patent: Jun. 11, 1996

[54] METHOD OF FORMING A COLOR IMAGE AND APPARATUS USED THEREFOR

[75] Inventor: Eiichi Kato, Shizuoka, Japan

[73] Assignee: Fuji Photo Film Co., Ltd., Kanagawa, Japan

[21] Appl. No.: 294,600

[22] Filed: Aug. 23, 1994

[30] Foreign Application Priority Data

Aug. 23, 1993 [JP] Japan .................................. 5-229472

[51] Int. Cl.⁶ .................................................. G03G 15/14
[52] U.S. Cl. .......................... 355/271; 355/200; 355/210; 355/277; 355/278; 156/240; 156/277
[58] Field of Search ....................... 355/277–281, 355/271–273, 210, 326 R, 327; 156/277, 230, 235, 237, 238, 239, 240; 430/124, 126, 98, 99

[56] References Cited

U.S. PATENT DOCUMENTS

| | | | |
|---|---|---|---|
| 4,027,345 | 6/1977 | Fujisawa et al. | 156/240 X |
| 4,383,878 | 5/1983 | Young et al. | 156/235 |
| 4,600,669 | 7/1986 | Ng et al. | 430/47 |
| 4,686,163 | 8/1987 | Ng et al. | 430/126 X |
| 4,992,833 | 2/1991 | Derimiggio | 355/271 X |
| 5,114,520 | 5/1992 | Wang, Jr. et al. | 156/240 |
| 5,260,753 | 11/1993 | Haneda et al. | 430/124 X |
| 5,342,720 | 8/1994 | Zwadb et al. | 430/66 |
| 5,363,179 | 11/1994 | Cahill et al. | 355/278 |
| 5,400,126 | 3/1995 | Cahill et al. | 355/278 |
| 5,414,502 | 5/1995 | Cahill et al. | 355/278 |

FOREIGN PATENT DOCUMENTS

| | | |
|---|---|---|
| 48-33183 | 10/1973 | Japan . |
| 4-225370 | 8/1992 | Japan . |

*Primary Examiner*—Matthew S. Smith
*Attorney, Agent, or Firm*—Sughrue, Mion, Zinn, Macpeak & Seas

[57] ABSTRACT

A method of forming a color image including the steps of forming at least one color toner image on an electrophotographic light-sensitive element whose surface has releasability by an electrophotographic process, transferring the toner image onto a primary receptor having a peelable transfer layer provided thereon, and then transferring the toner image together with the transfer layer from the primary receptor onto a receiving material.

23 Claims, 4 Drawing Sheets

METHOD OF FORMING A COLOR IMAGE AND APPARATUS USED THEREFOR

FIELD OF THE INVENTION

The present invention relates to a method of forming a color image, and more particularly to a method of forming a color image using an electrophotographic process which is applicable to the field of color copy, color print, color proof, color check and the like. It also relates to an apparatus suitable for conducting the method of forming a color image.

BACKGROUND OF THE INVENTION

Methods of forming color printings, color duplicates or color proofs (proofs for printing) which comprises conducting development with electrophotographic developing agents to form a plurality of overlapping color toner images directly on the surface of electrophotographic light-sensitive element and transferring at once the resulting color images onto a receiving material such as printing paper are known.

The developing methods include a so-called dry type developing method and wet type developing method. Color images obtained by the wet type developing method are preferred because of little color shear and good resolution as compared with those formed with dry toners. However, it is very difficult to directly transfer wet type toner images entirely from the surface of the light-sensitive element to printing paper.

In order to solve this problem, a transfer technique in which a non-aqueous solvent is supplied between a light-sensitive element and a receiving material and then transfer is electrostatically performed is described in JP-A-2-272469 (the term "JP-A" as used herein means an "unexamined published Japanese patent application").

Also, a method in which a transparent film is first laminated on the surface of a light-sensitive element, wet type toner images are formed by an electrophotographic process on the film, and then the film bearing the toner images is separated from the light-sensitive element and stuck on plain paper, thereby forming transferred images is described in JP-A-2-115865 and JP-A-2-115866. According to the method, the film to be laminated has suitably a thickness of 9 μm. However, the production and handling of a film having such thickness is very troublesome and it is necessary to arrange a special system for them.

Further, in JP-B-2-43185 (the term "JP-B" as used herein means an "examined Japanese patent publication"), a method in which imagewise exposure through a transparent electrophotographic light-sensitive element and development are conducted repeatedly to form overlapping color separation images on a dielectric support releasably provided on the light-sensitive element and the dielectric support bearing the images is transferred to a receiving material is described. Since the imagewise exposure is performed from the side of substrate for the light-sensitive element according to this method, the dielectric support is required to be transparent. This is disadvantageous in view of a cost.

On the other hand, an electrophotographic transfer method using a so-called dry type developing method in which a releasable transfer layer is provided on the surface of a light-sensitive element, toner images are formed on the transfer layer and the toner images are transferred together with the transfer layer to printing paper is described in JP-A-1-112264, JP-A-1-281464 and JP-A-3-11347.

However, in order to employ the light-sensitive element repeatedly in the techniques hitherto known, a special operation is required at the time of transfer or difficulties in the formation of transfer layer are encountered. On the other hand, the method using a light-sensitive element having a transfer layer (or a releasable layer) previously formed thereon is disadvantageous in point of cost since the light-sensitive element used is inevitably thrown.

Moreover, in JP-A-2-264280 a method in which toner images on a light-sensitive layer are transferred onto a primary intermediate transfer medium having high smoothness and then transferred onto a final receiving material is described. Also, a method in which a special transfer medium is used in order to obtain final color images of good quality even when wet type toner is employed is proposed in JP-A-3-243973 and JP-A-4-9087.

It appears that tone images are transferred without being affected by irregularities on the surface of receiving material according to these methods. However, since toner images are first transferred onto the primary intermediate transfer medium and then further transferred onto the final receiving material, a lack of toner image, particularly a lack of fine images such as fine lines and fine letters and unevenness in image density are observed in the resulting color images.

Further, toner images remain on the surfaces of light-sensitive element and primary intermediate transfer medium after the transfer process. Therefore, it is necessary to clean the surfaces of light-sensitive element and primary intermediate transfer medium when they are repeatedly employed. This is disadvantageous in that a device for cleaning must be provided and in that the surfaces of light-sensitive element and primary intermediate transfer medium is damaged by cleaning.

As described above, conventional color image forming methods using an intermediate transfer medium have problems in that fully satisfactory color images can not be obtained, in that since the property of intermediate medium is changed, it is difficult to maintain stably its performance over a long period of time, when the intermediate medium is repeatedly used, in that disposable materials must be employed to maintain its performance, and in that a special transfer medium is required.

SUMMARY OF THE INVENTION

The present invention is intended to solve the above-described various problems associated with conventionally known method for forming an electrophotographic color transfer image.

An object of the present invention is to provide a method of forming a color image via an electrophotographic process using an intermediate receptor having a transfer layer which is excellent in transferability of toner image and which provides simply and stably a color image of high accuracy and high quality without color shear irrespective of the kind of final receiving material to be employed.

Another object of the present invention is to provide a method of forming a color transfer image in which a transfer layer is easily prepared on an intermediate receptor on demand in an apparatus and an electrophotographic light-sensitive element is repeatedly usable, thereby reducing a running cost.

A further object of the present invention is to provide a method of forming a color image in which an interface between an electrophotographic light-sensitive element and a toner image and an interface between a transfer layer and an intermediate receptor are definitely formed and maintained upon appropriately controlling releasabilities on the surface of light-sensitive element and on the surface of intermediate receptor, thereby easily performing transfer of toner image.

A still further object of the present invention is to provide an apparatus which is suitable for use in the above-described method of forming a color image.

Other objects of the present invention will become apparent from the following description and examples.

It has been found that the above described objects of the present invention are accomplished by a method of forming a color image comprising forming at least one color toner image on an electrophotographic light-sensitive element whose surface has releasability by an electrophotographic process, transferring the toner image onto a primary receptor having a peelable transfer layer provided thereon, and then transferring the toner image together with the transfer layer from the primary receptor onto a receiving material.

It has also been found that they are accomplished by an apparatus for forming a color image comprising a means for forming at least one color toner image on an electrophotographic light-sensitive element whose surface has releasability by an electrophotographic process, a means for providing a peelable transfer layer on a primary receptor, a means for transferring the toner image onto the primary receptor, and a means for transferring the toner image together with the transfer layer from the primary receptor onto a receiving material.

BRIEF DESCRIPTION OF THE ACCOMPANYING DRAWINGS

DETAILED DESCRIPTION OF THE INVENTION

The method of forming a color image according to the present invention will be diagrammatically described with reference to FIG. 1 of the drawings.

Figure 1:
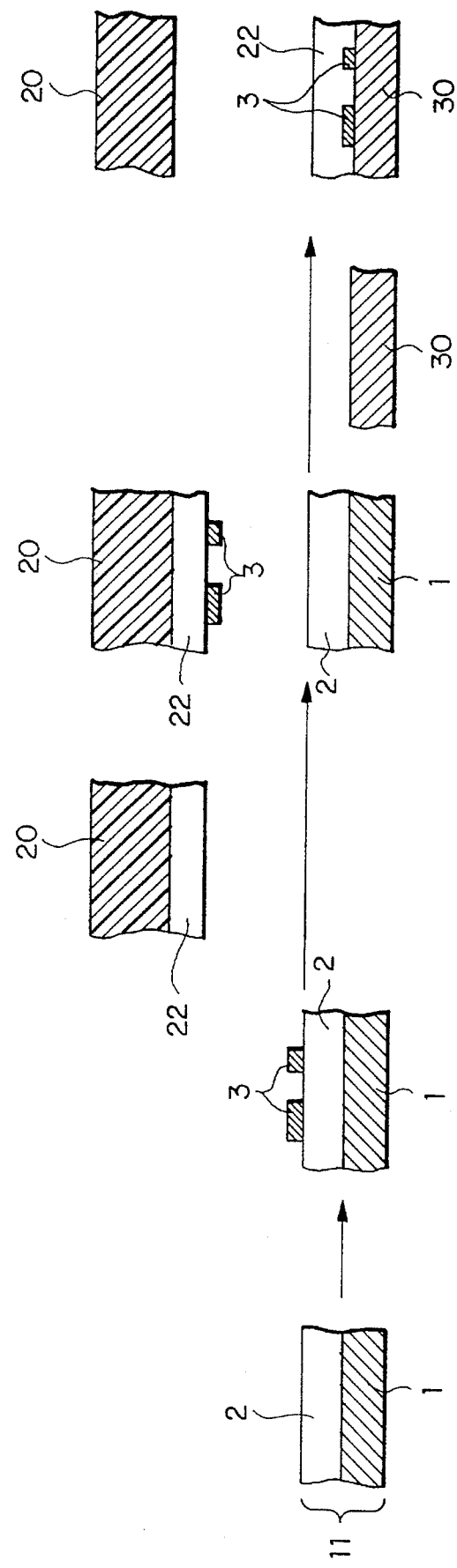
FIG. 1 is a schematic view for explanation of the method according to the present invention.

As shown in FIG. 1, the method of forming a color image comprises forming at least one color toner image 3 on an electrophotographic light-sensitive element 11 having at least a support 1 and a light-sensitive layer 2 by a conventional electrophotographic process, transferring the toner image 3 onto a peelable transfer layer 22 provided on a primary receptor 20, and then transferring the toner image 3 together with the transfer layer 22 onto a receiving material 30 to form a color duplicate.

According to the present invention, the toner image formed on the light-sensitive element is easily and completely transferred onto the primary receptor since the primary receptor has the transfer layer composed of a resin thereon. Because the toner image transferred onto the transfer layer is then transferred together with the transfer layer onto the final receiving material, a color duplicate of high accuracy and high quality free from color shear can be obtained in a simple and stable manner without specifically selecting the kind of receiving material. Further, the method according to the present invention can be performed by an apparatus having a simple structure.

Now, the electrophotographic light-sensitive element which can be used in the present invention will be described in detail below.

Any conventionally known electrophotographic light-sensitive element can be employed. What is important is that the surface of light-sensitive element has the releasability at the time for the formation of toner image so as to easily release the toner image to be formed thereon.

More specifically, an electrophotographic light-sensitive element wherein an adhesive strength of the surface thereof measured according to JIS Z 0237-1980 "Testing methods of pressure sensitive adhesive tapes and sheets" is not more than 100 gram.force is preferably employed.

The measurement of adhesive strength is conducted according to JIS Z 0237-1980 8.3.1. 180 Degrees Peeling Method with the following modifications:

(i) As a test plate, an electrophotographic light-sensitive element comprising a substrate and a photoconductive layer, on the surface of which a toner image is to be formed is used.

(ii) As a test piece, a pressure resistive adhesive tape of 6 mm in width prepared according to JIS C-2338 is used.

(iii) A peeling rate is 120 mm/min using a constant rate of traverse type tensile testing machine.

Specifically, the test piece is laid its adhesive face downward on the cleaned test plate and a roller is reciprocate one stroke at a rate of approximately 300 mm/min upon the test piece for pressure sticking. Within 20 to 40 minutes after the sticking with pressure, a part of the stuck portion is peeled approximately 25 mm in length and then peeled continuously at the rate of 120 mm/min using the constant rate of traverse type tensile testing machine. The strength is read at an interval of approximately 20 mm in length of peeling, and eventually read 4 times. The test is conducted on three test pieces. The mean value is determined from 12 measured values for three test pieces and the resulting mean value is converted in terms of 10 mm in width.

The measurement of adhesive strength of the surface of primary receptor or receiving material may also be conducted in the same manner as described above using the primary receptor or receiving material to be measured as the test plate.

The adhesive strength of the surface of electrophotographic light-sensitive element is more preferably not more than 50 gram.force (g.f), and particularly preferably not more than 30 g.f.

In addition to an electrophotographic light-sensitive element which has already the surface exhibiting the desired releasability, any conventionally known electrophotographic light-sensitive element can be employed by applying a compound (S) for imparting the desired releasability to the surface thereof.

One example of the former electrophotographic light-sensitive element, the surface of which has the releasability is an electrophotographic light-sensitive element using amorphous silicon as a photoconductive substance. Another example thereof wherein a photoconductive substance other than amorphous silicon is used is an electrophotographic light-sensitive element comprising a photoconductive layer and a separate layer (hereinafter expediently referred to as an overcoat layer sometimes), the surface of which has the releasability provided thereon, or an electrophotographic light-sensitive element in which the surface of the uppermost layer of a photoconductive layer (including a single photoconductive layer and a laminated photoconductive layer) is modified so as to exhibit the releasability.

In order to impart the releasability to the overcoat layer or the uppermost photoconductive layer, a polymer containing a silicon atom and/or a fluorine atom is used as a binder resin of the layer. It is preferred to use a small amount of a block copolymer containing a polymer segment comprising a silicon atom and/or fluorine atom-containing polymer component described in detail below (hereinafter referred to as a surface-localized type copolymer sometimes) in combination with other binder resins. Further, such polymers containing a silicon atom and/or a fluorine atom are employed in the form of grains.

In the case of providing an overcoat layer, it is preferred to use the above-described surface-localized type block copolymer together with other binder resins of the layer for maintaining sufficient adhesion between the overcoat layer and the photoconductive layer. The surface-localized type copolymer is ordinarily used in a proportion of from 0.1 to 20 parts by weight per 100 parts by weight of the total composition of the overcoat layer.

Specific examples of the overcoat layer include a protective layer which is a surface layer provided on the light-sensitive element for protection known as one means for ensuring durability of the surface of a light-sensitive element for a plain paper copier (PPC) using a dry toner against repeated use. For instance, techniques relating to a protective layer using a silicon type block copolymer are described, for example, in JP-A-61-95358, JP-A-55-83049, JP-A-62-87971, JP-A-61-189559, JP-A-62-75461, JP-A-62-139556, JP-A-62-139557, and JP-A-62-208055. Techniques relating to a protective layer using a fluorine type block copolymer are described, for example, in JP-A-61-116362, JP-A-61-117563, JP-A-61-270768, and JP-A-62-14657. Techniques relating to a protecting layer using grains of a resin containing a fluorine-containing polymer component in combination with a binder resin are described in JP-A-63-249152 and JP-A-63-221355.

On the other hand, the method of modifying the surface of the uppermost photoconductive layer so as to exhibit the releasability is effectively applied to a so-called disperse type light-sensitive element which contains at least a photoconductive substance and a binder resin.

Specifically, a layer constituting the uppermost layer of a photoconductive layer is made to contain either one or both of a block copolymer resin comprising a polymer segment containing a fluorine atom and/or silicon atom-containing polymer component as a block, and resin grains containing a fluorine atom and/or silicon atom-containing polymer component, whereby the resin material migrates to the surface of the layer and is concentrated and localized there to have the surface imparted with the releasability. The copolymers and resin grains which can be used include those described in European Patent Application No. 534,479A1.

In order to further ensure surface localization, a block copolymer comprising at least one fluorine atom and/or fluorine atom-containing polymer segment and at least one polymer segment containing a photo- and/or heat-curable group-containing component as blocks can be used as a binder resin for the overcoat layer or the photoconductive layer. Examples of such polymer segments containing a photo- and/or heat-curable group-containing component are described in European Patent Application No. 534,279A1. Alternatively, a photo- and/or heat-curable resin may be used in combination with the fluorine atom and/or silicon atom-containing resin in the present invention.

The polymer comprising a polymer component containing a fluorine atom and/or a silicon atom effectively used for modifying the surface of the electrophotographic light-sensitive material according to the present invention include a resin (hereinafter referred to as resin (P) sometimes) and resin grains (hereinafter referred to as resin grains (L) sometimes).

Where the polymer containing a fluorine atom and/or silicon atom-containing polymer component used in the present invention is a random copolymer, the content of the fluorine atom and/or silicon atom-containing polymer component is preferably at least 60% by weight, and more preferably at least 80% by weight based on the total polymer component.

In a preferred embodiment, the above-described polymer is a block copolymer comprising at least one polymer segment (A) containing at least 50% by weight of a fluorine atom and/or silicon atom-containing polymer component and at least one polymer segment (B) containing 0 to 20% by weight of a fluorine atom and/or silicon atom-containing polymer component, the polymer segments (A) and (B) being bonded in the form of blocks. More preferably, the polymer segment (B) of the block copolymer contains at least one polymer component containing at least one photo- and/or heat-curable functional group.

It is preferred that the polymer segment (B) does not contain any fluorine atom and/or silicon atom-containing polymer component.

As compared with the random copolymer, the block copolymer comprising the polymer segments (A) and (B) (surface-localized type copolymer) is more effective not only for improving the surface releasability but also for maintaining such a releasability.

More specifically, where a film is formed in the presence of a small amount of the resin or resin grains of copolymer containing a fluorine atom and/or a silicon atom, the resins (P) or resin grains (L) easily migrate to the surface portion of the film and are concentrated there by the end of a drying step of the film to thereby modify the film surface so as to exhibit the releasability.

Where the resin (P) is the block copolymer in which the fluorine atom and/or silicon atom-containing polymer segment exists as a block, the other polymer segment containing no, or if any a small proportion of, fluorine atom and/or silicon atom-containing polymer component undertakes sufficient interaction with the film-forming binder resin since it has good compatibility therewith. Thus, during the formation of the transfer layer on the light-sensitive element, further migration of the resin into the transfer layer is inhibited or prevented by an anchor effect to form and maintain the definite interface between the transfer layer and the photoconductive layer.

Further, where the segment (B) of the block copolymer contains a photo- and/or heat-curable group, crosslinking between the polymer molecules takes place during the film formation to thereby ensure retention of the releasability at the interface between the light-sensitive element and the transfer layer.

The above-described polymer may be used in the form of resin grains as described above. Preferred resin grains (L) are resin grains dispersible in a non-aqueous solvent. Such resin grains include a block copolymer comprising a non-aqueous solvent-insoluble polymer segment which contains a fluorine atom and/or silicon atom-containing polymer component and a non-aqueous solvent-soluble polymer segment which contains no, or if any not more than 20% of, fluorine atom and/or silicon atom-containing polymer component.

Where the resin grains according to the present invention are used in combination with a binder resin, the insolubilized polymer segment undertakes migration of the grains to the surface portion and concentration there while the soluble polymer segment exerts an inter-action with the binder resin (an anchor effect) similarly to the above-described resin. When the resin grains contain a photo- and/or heat-curable group, further migration of the grains to the transfer layer can be avoided.

The moiety having a fluorine atom and/or a silicon atom contained in the resin (P) or resin grains (L) includes that incorporated into the main chain of the polymer and that contained as a substituent in the side chain of the polymer.

The fluorine atom-containing moieties include monovalent or divalent organic residues, for example, —$C_hF_{2h+1}$ (wherein h represents an integer of from 1 to 18), —$(CF_2)_jCF_2H$ (wherein j represents an integer of from 1 to 17), —$CFH_2$,

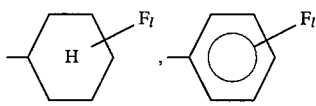

(wherein l represents an integer of from 1 to 5), —$CF_2$—, —CFH—,

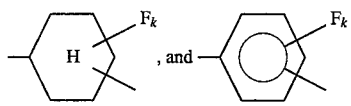

(wherein k represents an integer of from 1 to 4).

The silicon atom-containing moieties include monovalent or divalent organic residues, for example,

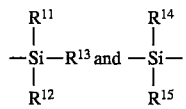

wherein $R^{11}$, $R^{12}$, $R^{13}$, $R^{14}$, and $R^{15}$, which may be the same or different, each represents a hydrocarbon group which may be substituted or —$OR^{16}$ wherein $R^{16}$ represents a hydrocarbon group which may be substituted.

The hydrocarbon group represented by $R^{11}$, $R^{12}$, $R^{13}$, $R^{14}$ or $R^{15}$ include specifically an alkyl group having from 1 to 18 carbon atoms which may be substituted (e.g., methyl, ethyl, propyl, butyl, hexyl, octyl, decyl, dodecyl, hexadecyl, 2-chloroethyl, 2-bromoethyl, 2,2,2-trifluoroethyl, 2-cyanoethyl, 3,3,3-trifluoropropyl, 2-methoxyethyl, 3-bromopropyl, 2-methoxycarbonylethyl, or 2,2,2,2',2',2'-hexafluoroisopropyl), an alkenyl group having from 4 to 18 carbon atoms which may be substituted (e.g., 2-methyl-1-propenyl, 2-butenyl, 2-pentenyl, 3-methyl-2-pentenyl, 1-pentenyl, 1-hexenyl, 2-hexenyl, or 4-methyl-2-hexenyl), an aralkyl group having from 7 to 12 carbon atoms which may be substituted (e.g., benzyl, phenethyl, 3-phenylpropyl, naphthylmethyl, 2-naphthylethyl, chlorobenzyl, bromobenzyl, methylbenzyl, ethylbenzyl, methoxybenzyl, dimethylbenzyl, or dimethoxybenzyl), an alicyclic group having from 5 to 8 carbon atoms which may be substituted (e.g., cyclohexyl, 2-cyclohexylethyl, or 2-cyclopentylethyl), or an aromatic group having from 6 to 12 carbon atoms which may be substituted (e.g., phenyl, naphthyl, tolyl, xylyl, propylphenyl, butylphenyl, octylphenyl, dodecylphenyl, methoxyphenyl, ethoxyphenyl, butoxyphenyl, decyloxyphenyl, chlorophenyl, dichlorophenyl, bromophenyl, cyanophenyl, acetylphenyl, methoxycarbonylphenyl, ethoxycarbonylphenyl, butoxycarbonylphenyl, acetamidophenyl, propionamidophenyl, or dodecyloylamidophenyl). $R^{16}$ in —$OR^{16}$ has the same meaning as the above-described hydrocarbon group for $R^{11}$.

The fluorine atom and/or silicon atom-containing organic residue may be composed of a combination thereof. In such a case, they may be combined either directly or via a linking group. The linking groups include divalent organic residues, for example, divalent aliphatic groups, divalent aromatic groups, and combinations thereof, which may or may not contain a bonding group, e.g., —O—, —S—,

—SO—, —$SO_2$—, —COO—, —OCO—, —CONHCO—, —NHCONH—,

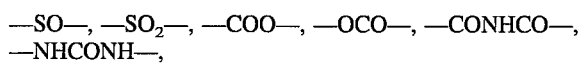

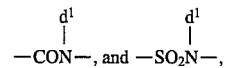

wherein $d^1$ has the same meaning as $R^{11}$ above.

Examples of the divalent aliphatic groups are shown below.

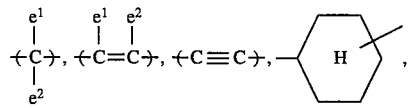

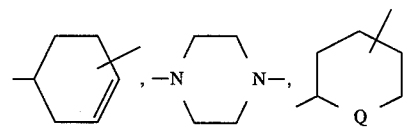

wherein $e^1$ and $e^2$ which may be the same or different, each represents a hydrogen atom, a halogen atom (e.g., chlorine or bromine) or an alkyl group having from 1 to 12 carbon atoms (e.g., methyl, ethyl, propyl, chloromethyl, bromomethyl, butyl, hexyl, octyl, nonyl or decyl); and Q represents —O—, —S—, or

wherein $d^2$ represents an alkyl group having from 1 to 4 carbon atoms, —$CH_2Cl$, or —$CH_2Br$.

Examples of the divalent aromatic groups include a benzene ring, a naphthalene ring, and a 5- or 6-membered heterocyclic ring having at least one hetero atom selected from an oxygen atom, a sulfur atom and a nitrogen atom. The aromatic groups may have a substituent, for example, a halogen atom (e.g., fluorine, chlorine or bromine), an alkyl group having from 1 to 8 carbon atoms (e.g., methyl, ethyl, propyl, butyl, hexyl or octyl) or an alkoxy group having from 1 to 6 carbon atoms (e.g., methoxy, ethoxy, propoxy or butoxy). Examples of the heterocyclic ring include a furan ring, a thiophene ring, a pyridine ring, a piperazine ring, a tetrahydrofuran ring, a pyrrole ring, a tetrahydropyran ring, and a 1,3-oxazoline ring.

Specific examples of the repeating units having the fluorine atom and/or silicon atom-containing moiety as described above are set forth below, but the present invention should not be construed as being limited thereto. In formulae (F-1) to (F-32) below, $R_f$ represents any one of the following groups of from (1) to (11); and b represents a hydrogen atom or a methyl group.

$$—C_nF_{2n+1} \quad (1)$$

$$—CH_2C_nF_{2n+1} \quad (2)$$

$$—CH_2CH_2C_nF_{2n+1} \quad (3)$$

$$—CH_2(CF_2)_mCFHCF_3 \quad (4)$$

$$—CH_2CH_2(CF_2)_mCFHCF_3 \quad (5)$$

$$—CH_2CH_2(CF_2)_mCFHCF_2H \quad (6)$$

$$—CH_2(CF_2)_mCFHCF_2H \quad (7)$$

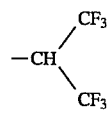 (8)

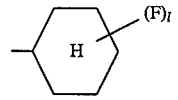 (9)

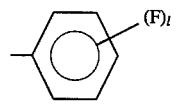 (10)

 (11)

wherein $R_f$ represents any one of the above-described groups of from (1) to (8); n represents an integer of from 1 to 18; m represents an integer of from 1 to 18; and l represents an integer of from 1 to 5.

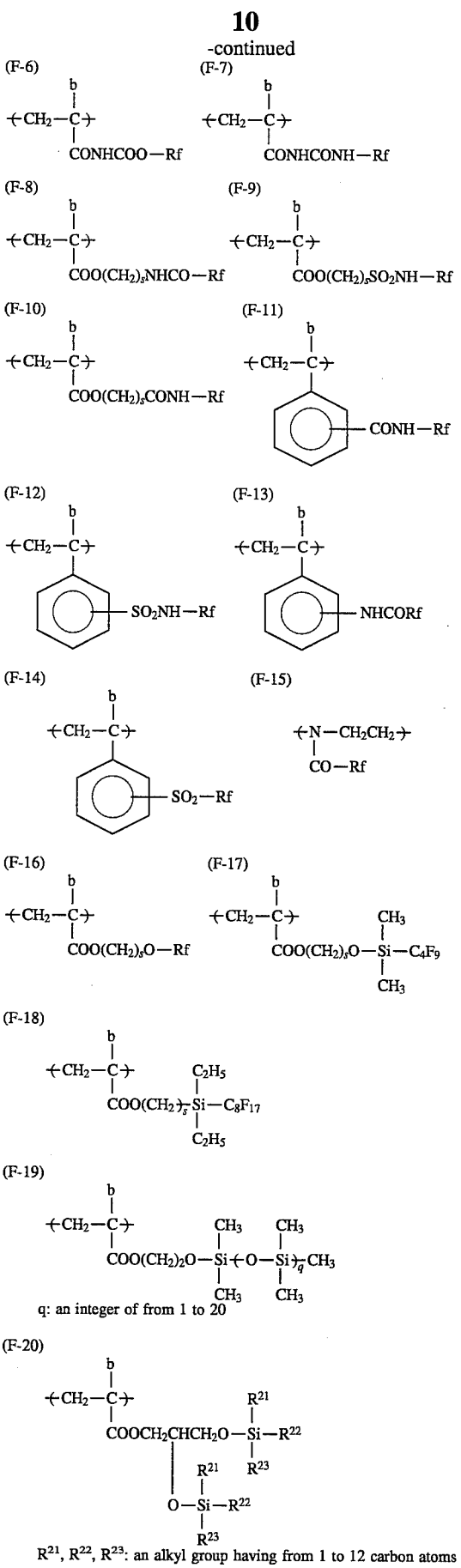

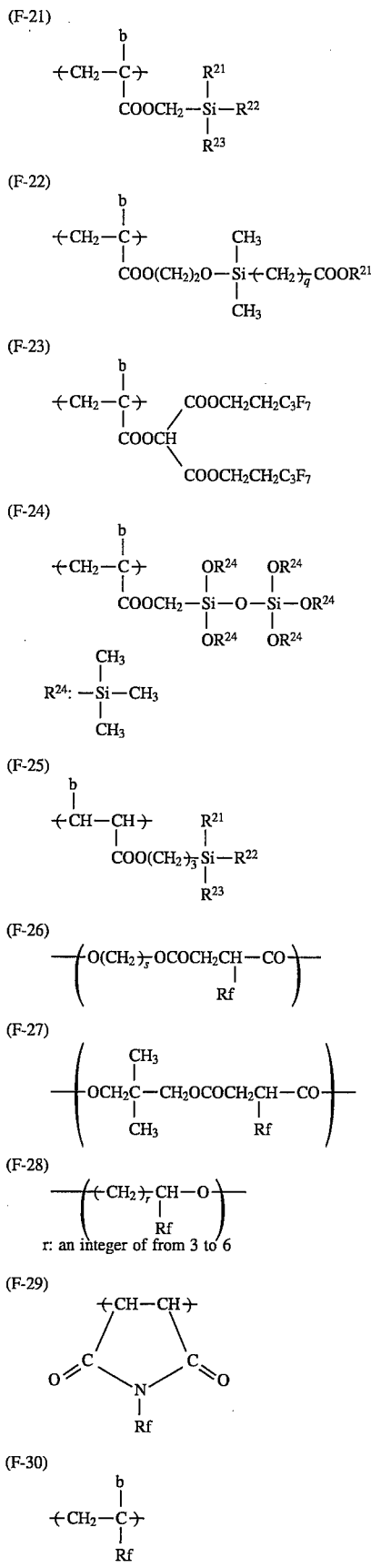

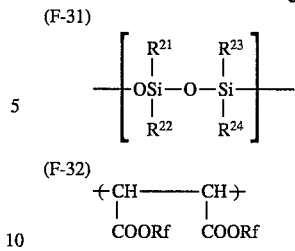

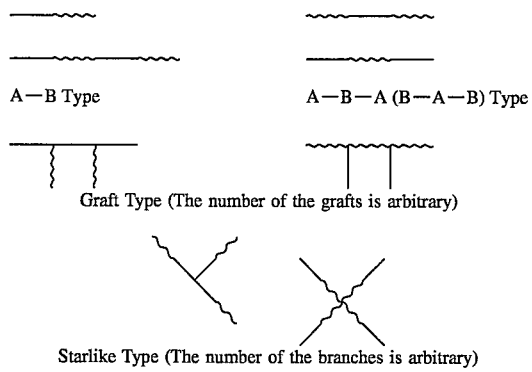

Of the resins (P) and resin grains (L) each containing silicon atom and/or fluorine atom used in the present invention, the so-called surface-localized type copolymers will be described in detail below.

The content of the silicon atom and/or fluorine atom-containing polymer component in the segment (A) is at least 50% by weight, preferably not less than 70% by weight, and more preferably not less than 80% by weight. The content of the fluorine atom and/or silicon atom-containing polymer component in the segment (B) bonded to the segment (A) is not more than 20% by weight, and preferably 0% by weight.

A weight ratio of segment (A) to segment (B) ranges usually from 1/99 to 95/5, and preferably from 5/95 to 90/10. If the weight ratio is out of this range, the migration effect and anchor effect of the resin (P) or resin grain (L) at the surface region of light-sensitive element are decreased.

The resin (P) preferably has a weight average molecular weight of from $5 \times 10^3$ to $1 \times 10^6$, and more preferably from $1 \times 10^4$ to $5 \times 10^5$. The segment (A) in the resin (P) preferably has a weight average molecular weight of at least $1 \times 10^3$.

The resin grain (L) preferably has an average grain diameter of from 0.001 to 1 μm, and more preferably from 0.05 to 0.5 μm.

A preferred embodiment of the surface-localized type copolymer in the resin (P) according to the present invention will be described below. Any type of the block copolymer can be used as far as the fluorine atom and/or silicon atom-containing polymer component is contained as a block. The term "to be contained as a block" means that the polymer has the polymer segment (A) containing not less than 50% by weight of the fluorine atom and/or silicon atom-containing polymer component. The forms of blocks include an A-B type block, an A-B-A type block, a B-A-B type block, a grafted type block, and a starlike type block as schematically illustrated below.

A—B Type        A—B—A (B—A—B) Type

Graft Type (The number of the grafts is arbitrary)

Starlike Type (The number of the branches is arbitrary)

——— : Segment A (containing fluorine atom and/or silicon atom)
∼∼∼ : Segment B (containing no or little fluorine atom and/or silicon atom)

These various types of block copolymers (P) can be synthesized in accordance with conventionally known polymerizing methods. Useful methods are described, e.g., in W. J. Burlant and A. S. Hoffman, *Block and Graft Polymers,* Reuhold (1986), R. J. Cevesa, *Block and Graft Copolymers,* Butterworths (1962), D. C. Allport and W. H. James, *Block Copolymers,* Applied Sci. (1972), A. Noshay and J. E. McGrath, *Block Copolymers,* Academic Press (1977), G. Huvtreg, D. J. Wilson, and G. Riess, *NATO ASIser. SerE.,* Vol. 1985, p. 149, and V. Perces, *Applied Polymer Sci.,* Vol. 285, p. 95 (1985).

For example, ion polymerization reactions using an organometallic compound (e.g., an alkyl lithium, lithium diisopropylamide, an alkali metal alcoholate, an alkylmagnesium halide, or an alkylaluminum halide) as a polymerization initiator are described, for example, in T. E. Hogeu-Esch and J. Smid, *Recent Advances in Anion Polymerization,* Elsevier (New York) (1987), Yoshio Okamoto, *Kobunshi,* Vol. 38, P. 912 (1989), Mitsuo Sawamoto, *Kobunshi,* Vol. 38, p. 1018 (1989), Tadashi Narita, *Kobunshi,* Vol. 37, p. 252 (1988), B. C. Anderson, et al., *Macromolecules,* Vol. 14, p. 1601 (1981), and S. Aoshima and T. Higasimura, *Macromolecules,* Vol. 22, p. 1009 (1989).

Ion polymerization reactions using a hydrogen iodide/iodine system are described, for example, in T. Higashimura, et al., *Macromol. Chem., Macromol. Symp.,* Vol. 13/14, p. 457 (1988), and Toshinobu Higashimura and Mitsuo Sawamoto, *Kobunshi Ronbunshu,* Vol. 46, p. 189 (1989).

Group transfer polymerization reactions are described, for example, in D. Y. Sogah, et al., *Macromolecules,* Vol. 20, p. 1473 (1987), O. W. Webster and D. Y. Sogah, *Kobunshi,* Vol. 36, p. 808 (1987), M. T. Reetg, et al., *Angew. Chem. Int. Ed. Engl.,* Vol. 25, p. 9108 (1986), and JP-A-63-97609.

Living polymerization reactions using a metalloporphyrin complex are described, for example, in T. Yasuda, T. Aida, and S. Inoue, *Macromolecules,* Vol. 17, p. 2217 (1984), M. Kuroki, T. Aida, and S. Inoue, *J. Am. Chem. Soc.,* Vol. 109, p. 4737 (1987), M. Kuroki, et al., *Macromolecules,* Vol. 21, p. 3115 (1988), and M. Kuroki and I. Inoue, *Yuki Gosei Kagaku,* Vol. 47, p. 1017 (1989).

Ring-opening polymerization reactions of cyclic compounds are described, for example, in S. Kobayashi and T. Saegusa, *Ring Opening Polymerization,* Applied Science Publishers Ltd. (1984), W. Seeliger, et al., *Angew. Chem. Int. Ed. Engl.,* Vol. 5, p. 875 (1966), S. Kobayashi, et al., *Poly. Bull.,* Vol. 13, p. 447 (1985), and Y. Chujo, et al., *Macromolecules,* Vol. 22, p. 1074 (1989).

Photo living polymerization reactions using a dithiocarbamate compound or a xanthate compound, as an initiator are described, for example, in Takayuki Otsu, *Kobunshi,* Vol. 37, p. 248 (1988), Shun-ichi Himori and Koichi Otsu, *Polymer Rep. Jap.,* Vol. 37, p. 3508 (1988), JP-A-64-111, JP-A-64-26619, and M. Niwa, *Macromolecules,* Vol. 189, p. 2187 (1988).

Radical polymerization reactions using a polymer containing an azo group or a peroxide group as an initiator to synthesize block copolymers are described, for example, in Akira Ueda, et al., *Kobunshi Ronbunshu,* Vol. 33, p. 931 (1976), Akira Ueda, *Osaka Shiritsu Kogyo Kenkyusho Hokoku,* Vol. 84 (1989), O. Nuyken, et al., *Macromol. Chem., Rapid. Commun.,* 9, p. 671 (1988), and Ryohei Oda, *Kagaku to Kogyo,* Vol. 61, p. 43 (1987).

Syntheses of graft type block copolymers are described in the above-cited literature references and, in addition, Fumio Ide, *Graft Jugo to Sono Oyo,* Kobunshi Kankokai (1977), and Kobunshi Gakkai (ed.), *Polymer Alloy,* Tokyo Kagaku Dojin (1981). For example, known grafting techniques including a method of grafting of a polymer chain by a polymerization initiator, an actinic ray (e.g., radiant ray, electron beam), or a mechanochemical reaction; a method of grafting with chemical bonding between functional groups of polymer chains (reaction between polymers); and a method of grafting comprising a polymerization reaction of a macromonomer may be employed.

The methods of grafting using a polymer are described, for example, in T. Shiota, et al., *J. Appl. Polym. Sci.,* Vol. 13, p. 2447 (1969), W. H. Buck, *Rubber Chemistry and Technology,* Vol. 50, p. 109 (1976), Tsuyoshi Endo and Tsutomu Uezawa, *Nippon Secchaku Kyokaishi,* Vol. 24, p. 323 (1988), and Tsuyoshi Endo, ibid., Vol. 25, p. 409 (1989).

The methods of grafting using a macromonomer are described, for example, in P. Dreyfuss and R. P. Quirk, *Encycl. Polym. Sci. Eng.,* Vol. 7, p. 551 (1987), P. F. Rempp and E. Franta, *Adv. Polym. Sci.,* Vol. 58, p. 1 (1984), V. Percec, *Appl. Poly. Sci.,* Vol. 285, p. 95 (1984), R. Asami and M. Takari, *Macromol. Chem. Suppl.,* Vol. 12, p. 163 (1985), P. Rempp, et al., *Macromol. Chem. Suppl.,* Vol. 8, p. 3 (1985), Katsusuke Kawakami, *Kagaku Kogyo,* Vol. 38, p. 56 (1987), Yuya Yamashita, *Kobunshi,* Vol. 31, p. 988 (1982), Shiro Kobayashi, *Kobunshi,* Vol. 30, p. 625 (1981), Toshinobu Higashimura, *Nippon Secchaku Kyokaishi,* Vol. 18, p. 536 (1982), Koichi Itoh, *Kobunshi Kako,* Vol. 35, p. 262 (1986), Takashiro Azuma and Takashi Tsuda, *Kino Zairyo,* Vol. 1987, No. 10, p. 5, Yuya Yamashita (ed.), *Macromonomer no Kagaku to Kogyo,* I.P.C. (1989), Tsuyoshi Endo (ed.), *Atarashii Kinosei Kobunshi no Bunshi Sekkei,* Ch. 4, C.M.C. (1991), and Y. Yamashita, et al., *Polym. Bull.,* Vol. 5, p. 361 (1981).

Syntheses of starlike block copolymers are described, for example, in M. T. Reetz, *Angew. Chem. Int. Ed. Engl.,* Vol. 27, p. 1373 (1988), M. Sgwarc, *Carbanions, Living Polymers and Electron Transfer Processes,* Wiley (New York) (1968), B. Gordon, et al., *Polym. Bull.,* Vol. 11, p. 349 (1984), R. B. Bates, et al., *J. Org. Chem.,* Vol. 44, p. 3800 (1979), Y. Sogah, *A.C.S. Polym. Rapr.,* Vol. 1988, No. 2, p. 3, J. W. Mays, *Polym. Bull.,* Vol. 23, p. 247 (1990), I. M. Khan et al., *Macromolecules,* Vol. 21, p. 2684 (1988), A. Morikawa, *Macromolecules,* Vol. 24, p. 3469 (1991), Akira Ueda and Toru Nagai, *Kobunshi,* Vol. 39, p. 202 (1990), and T. Otsu, *Polymer Bull.,* Vol. 11, p. 135 (1984).

While reference can be made to known techniques described in the literatures cited above, the method for synthesizing the block copolymers (P) according to the present invention is not limited to these methods.

A preferred embodiment of the resin grains (L) according to the present invention will be described below. As described above, the resin grains (L) preferably comprises the fluorine atom and/or silicon atom-containing polymer segment (A) insoluble in a non-aqueous solvent and the polymer segment (B) which is soluble in a non-aqueous solvent and contains substantially no fluorine atom and/or silicon atom, and have an average grain diameter of not more than 1 μm. The polymer segment (A) constituting the insoluble portion of the resin grain may have a crosslinked structure.

Preferred methods for synthesizing the resin grains (L) described above include the non-aqueous dispersion polymerization method.

The non-aqueous solvents which can be used in the preparation of the non-aqueous solvent-dispersed resin grains include any organic solvents having a boiling point of not more than 200° C., either individually or in combination of two or more thereof. Specific examples of such organic solvents include alcohols such as methanol, ethanol, propanol, butanol, fluorinated alcohols and benzyl alcohol, ketones such as acetone, methyl ethyl ketone, cyclohexanone and diethyl ketone, ethers such as diethyl ether, tetrahydrofuran and dioxane, carboxylic acid esters such as methyl acetate, ethyl acetate, butyl acetate and methyl propionate, aliphatic hydrocarbons containing from 6 to 14 carbon atoms such as hexane, octane, decane, dodecane, tridecane, cyclohexane and cyclooctane, aromatic hydrocarbons such as benzene, toluene, xylene and chlorobenzene, and halogenated hydrocarbons such as methylene chloride, dichloroethane, tetrachloroethane, chloroform, methylchloroform, dichloropropane and trichloroethane. However, the present invention should not be construed as being limited thereto.

Dispersion polymerization in such a non-aqueous solvent system easily results in the production of mono-dispersed resin grains having an average grain diameter of not greater than 1 μm with a very narrow size distribution.

More specifically, a monomer corresponding to the polymer component constituting the segment (A) (hereinafter referred to as a monomer (a)) and a monomer corresponding to the polymer component constituting the segment (B) (hereinafter referred to as a monomer (b)) are polymerized by heating in a non-aqueous solvent capable of dissolving a monomer (a) but incapable of dissolving the resulting polymer in the presence of a polymerization initiator, for example, a peroxide (e.g., benzoyl peroxide or lauroyl peroxide), an azobis compound (e.g., azobisisobutyronitrile or azobisisovaleronitrile), or an organometallic compound (e.g., butyl lithium). Alternatively, a monomer (a) and a polymer comprising the segment (B) (hereinafter referred to as a polymer (PB)) are polymerized in the same manner as described above.

The inside of the polymer grain (L) according to the present invention may have a crosslinked structure. The formation of crosslinked structure can be conducted by any of conventionally known techniques. For example, (i) a method wherein a polymer containing the polymer segment (A) is crosslinked in the presence of a crosslinking agent or a curing agent; (ii) a method wherein at least the monomer (a) corresponding to the polymer segment (A) is polymerized in the presence of a polyfunctional monomer or oligomer containing at least two polymerizable functional groups to form a network structure over molecules; or (iii) a method wherein the polymer segment (A) and a polymer containing a reactive group-containing polymer component are subjected to a polymerization reaction or a polymer reaction to cause crosslinking may be employed.

The crosslinking agents to be used in the method (i) include those commonly employed as described, e.g., in Shinzo Yamashita and Tosuke Kaneko (ed.), *Kakyozai Handbook,* Taiseisha (1981) and Kobunshi Gakkai (ed.), *Kobunshi Data Handbook (Kiso-hen),* Baifukan (1986).

Specific examples of suitable crosslinking agents include organosilane compounds known as silane coupling agents (e.g., vinyltrimethoxysilane, vinyltributoxysilane, γ-glycidoxypropyltrimethoxysilane, γ-mercaptopropyltriethoxysilane, and γ-aminopropyltriethoxysilane), polyisocyanate compounds (e.g., toluylene diisocyanate, diphenylmethane diisocyanate, triphenylmethane triisocyanate, polymethylenepolyphenyl isocyanate, hexamethylene diisocyanate, isophorone diisocyanate, and polymeric polyisocyanates), polyol compounds (e.g., 1,4-butanediol, polyoxypropylene glycol, polyoxyethylene glycols, and 1,1,1-trimethylolpropane), polyamine compounds (e.g., ethylenediamine, γ-hydroxypropylated ethylenediamine, phenylenediamine, hexamethylenediamine, N-aminoethylpiperazine, and modified aliphatic polyamines), polyepoxy-containing compounds and epoxy resins (e.g., the compounds as described in Hiroshi Kakiuchi (ed.), *Shin-Epoxy Jushi,* Shokodo (1985) and Kuniyuki Hashimoto (ed.), *Epoxy Jushi,* Nikkan Kogyo Shinbunsha (1969)), melamine resins (e.g., the compounds as described in Ichiro Miwa and Hideo Matsunaga (ed.), *Urea.Melamine Jushi,* Nikkan Kogyo Shinbunsha (1969)), and poly(meth)acrylate compounds (e.g., the compounds as described in Shin Okawara, Takeo Saegusa, and Toshinobu Higashimura (ed.), *Oligomer,* Kodansha (1976), and Eizo Omori, *Kinosei Acryl-kei Jushi,* Techno System (1985)).

Specific examples of the polymerizable functional groups which are contained in the polyfunctional monomer or oligomer (the monomer will sometimes be referred to as a polyfunctional monomer (d)) having two or more polymerizable functional groups used in the method (ii) above include $CH_2=CH-CH_2-$, $CH_2=CH-CO-O-$, $CH_2=CH-$, $CH_2=C(CH_3)-CO-O-$, $CH(CH_3)=CH-CO-O-$, $CH_2=CH-CONH-$, $CH_2=C(CH_3)-CONH-$, $CH(CH_3)=CH-CONH-$, $CH_2=CH-O-CO-$, $CH_2=C(CH_3)-O-CO-$, $CH_2=CH-CH_2-O-CO-$, $CH_2=CH-NHCO-$, $CH_2=CH-CH_2-NHCO-$, $CH_2=CH-SO_2-$, $CH_2=CH-CO-$, $CH_2=CH-O-$, and $CH_2=CH-S-$. The two or more polymerizable functional groups present in the polyfunctional monomer or oligomer may be the same or different.

Specific examples of the monomer or oligomer having the same two or more polymerizable functional groups include styrene derivatives (e.g., divinylbenzene and trivinylbenzene); methacrylic, acrylic or crotonic acid esters, vinyl ethers, or allyl ethers of polyhydric alcohols (e.g., ethylene glycol, diethylene glycol, triethylene glycol, polyethylene glycol 200, 400 or 600, 1,3-butylene glycol, neopentyl glycol, dipropylene glycol, polypropylene glycol, trimethylolpropane, trimethylolethane, and pentaerythritol) or polyhydric phenols (e.g., hydroquinone, resorcin, catechol, and derivatives thereof); vinyl esters, allyl esters, vinyl amides, or allyl amides of dibasic acids (e.g., malonic acid, succinic acid, glutaric acid, adipic acid, pimelic acid, maleic acid, phthalic acid, and itaconic acid); and condensation products of polyamines (e.g., ethylenediamine, 1,3-propylenediamine, and 1,4-butylenediamine) and vinyl-containing carboxylic acids (e.g., methacrylic acid, acrylic acid, crotonic acid, and allylacetic acid).

Specific examples of the monomer or oligomer having two or more different polymerizable functional groups include reaction products between vinyl-containing carboxylic acids (e.g., methacrylic acid, acrylic acid, methacryloylacetic acid, acryloylacetic acid, methacryloylpropionic acid, acryloylpropionic acid, itaconyloylacetic acid, itaconyloylpropionic acid, and a carboxylic acid anhydride) and alcohols or amines, vinyl-containing ester derivatives or amide derivatives (e.g., vinyl methacrylate, vinyl acrylate, vinyl itaconate, allyl methacrylate, allyl acrylate, allyl itaconate, vinyl methacryloylacetate, vinyl methacryloylpropionate, allyl methacryloylpropionate, vinyloxycarbonylmethyl methacrylate, vinyloxycarbonylmethyloxycarbonylethylene acrylate, N-allylacrylamide, N-allylmethacrylamide, N-allylitaconamide, and methacryloylpropionic acid allylamide) and condensation products between amino alcohols (e.g., aminoethanol, 1-aminopropanol, 1-aminobutanol, 1-aminohexanol, and 2-aminobutanol) and vinyl-containing carboxylic acids.

The monomer or oligomer containing two or more polymerizable functional groups is used in an amount of not more than 10 mol%, and preferably not more than 5 mol %, based on the total amount of monomer (a) and other monomers copolymerizable with monomer (a) to form the resin.

Where crosslinking between polymer molecules is conducted by the formation of chemical bonds upon the reaction of reactive groups in the polymers according to the method (iii), the reaction may be effected in the same manner as usual reactions of organic low-molecular weight compounds.

From the standpoint of obtaining mono-dispersed resin grains having a narrow size distribution and easily obtaining fine resin grains having a diameter of 0.5 μm or smaller, the method (ii) using a polyfunctional monomer is preferred for the formation of network structure. Specifically, a monomer (a), a monomer (b) and/or a polymer (PB) and, in addition, a polyfunctional monomer (d) are subjected to polymerization granulation reaction to obtain resin grains. Where the above-described polymer (PB) comprising the segment (B) is used, it is preferable to use a polymer (PB') which has a polymerizable double bond group copolymerizable with the monomer (a) in the side chain or at one terminal of the main chain of the polymer (PB).

The polymerizable double bond group is not particularly limited as far as it is copolymerizable with the monomer (a). Specific examples thereof include

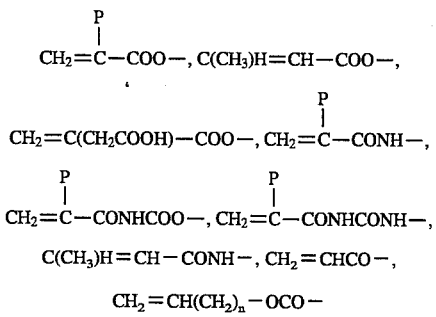

(wherein n represents 0 or an integer of from 1 to 3), $CH_2=CHO-$, and $CH_2=CH-C_6H_4-$, wherein p represents $-H$ or $-H_3$.

The polymerizable double bond group may be bonded to the polymer chain either directly or via a divalent organic residue. Specific examples of these polymers include those described, for example, in JP-A-61-43757, JP-A-1-257969, JP-A-2-74956, JP-A-1-282566, JP-A-2-173667, JP-A-3-15862, and JP-A-4-70669.

In the preparation of resin grains, the total amount of the polymerizable compounds used is from about 5 to about 80 parts by weight, preferably from 10 to 50 parts by weight, per 100 parts by weight of the non-aqueous solvent. The polymerization initiator is usually used in an amount of from 0.1 to 5% by weight based on the total amount of the polymerizable compounds. The polymerization is carried out at a temperature of from about 30° to about 180° C., and preferably from 40° to 120° C. The reaction time is preferably from 1 to 15 hours.

Now, an embodiment in which the resin (P) contains a photo- and/or heat-curable group or the resin (P) is used in combination with a photo- and/or heat-curable resin will be described below.

The polymer components containing at least one photo- and/or heat-curable group, which may be incorporated into the resin (P), include those described in the above-cited literature references. More specifically, the polymer components containing the above-described polymerizable functional group(s) can be used.

The content of the polymer component containing at least one photo- and/or heat-curable group in the block copolymer (P) ranges from 0.1 to 40 parts by weight, and preferably from 1 to 30 parts by weight, based on 100 parts by weight of the polymer segment (B) therein. If the content is less than the lower limit, curing of the photoconductive layer after film formation does not proceed sufficiently, and thus giving adverse influences on the releasability of toner image. If the content exceeds the upper limit, the electrophotographic characteristics of the photoconductive layer are deteriorated, sometimes resulting in reduction in reproducibility of original in duplicated image and occurrence of background fog in non-image areas.

The photo- and/or heat-curable group-containing block copolymer (P) is preferably used in an amount of not more than 40% by weight based on the total binder resin. If the proportion of the resin (P) is more than 40% by weight, the electrophotographic characteristics of the light-sensitive element tend to be deteriorated.

The fluorine atom and/or silicon atom-containing resin may also be used in combination with the photo- and/or heat-curable resin (D) in the present invention. The photo- and/or heat-curable group in the resin (D) is not particularly limited and includes those described above with respect to the block copolymer.

Any of conventionally known curable resins may be used as the photo- and/or heat-curable resin (D). For example, resins containing the curable group as described with respect to the block copolymer (P) may be used.

Further, conventionally known binder resins for an electrophotographic light-sensitive layer are employed. These resins are described, e.g., in Takaharu Shibata and Jiro Ishiwatari, *Kobunshi*, Vol. 17, p. 278 (1968), Harumi Miyamoto and Hidehiko Takei, *Imaging*, Vol. 1973, No. 8, Koichi Nakamura (ed.), *Kiroku Zairyoyo Binder no Jissai Gijutsu*, Ch. 10, C. M.C. (1985), Denshishashin Gakkai (ed.), *Denshishashinyo Yukikankotai no Genjo Symposium* (preprint) (1985), Hiroshi Kokado (ed.), *Saikin no Kododenzairyo to Kankotai no Kaihatsu.Jitsuyoka*, Nippon Kagaku Joho (1986), Denshishashin Gakkai (ed.), *Denshishashin Gijutsu no Kiso To Oyo*, Ch. 5, Corona (1988), D. Tatt and S. C. Heidecker, *Tappi*, Vol. 49, No. 10, p. 439 (1966), E. S. Baltazzi and R. G. Blanchlotte, et al., *Photo. Sci. Eng.*, Vol. 16, No. 5, p. 354 (1972), and Nguyen Chank Keh, Isamu Shimizu and Eiichi Inoue, *Denshishashin Gakkaishi*, Vol. 18, No. 2, p. 22 (1980).

Specific examples of these known binder resins used include olefin polymers or copolymers, vinyl chloride copolymers, vinylidene chloride copolymers, vinyl alkanoate polymers or copolymers, allyl alkanoate polymers or copolymers, polymers or copolymers of styrene or derivatives thereof, butadiene-styrene copolymers, isoprene-styrene copolymers, butadiene-unsaturated carboxylic ester copolymers, acrylonitrile copolymers, methacrylonitrile copolymers, alkyl vinyl ether copolymers, acrylic ester polymers or copolymers, methacrylic ester polymers or copolymers, styrene-acrylic ester copolymers, styrene-methacrylic ester copolymers, itaconic diester polymers or copolymers, maleic anhydride copolymers, acrylamide copolymers, methacrylamide copolymers, hydroxy-modified silicone resins, polycarbonate resins, ketone resins, polyester resins, silicone resins, amide resins, hydroxy- or carboxy-modified polyester resins, butyral resins, polyvinyl acetal resins, cyclized rubber-methacrylic ester copolymers, cyclized rubber-acrylic ester copolymers, copolymers containing a heterocyclic ring containing no nitrogen atom (the heterocyclic ring including furan, tetrahydrofuran, thiophene, dioxane, dioxofuran, lactone, benzofuran, benzothiophene and 1,3-dioxetane rings), and epoxy resins.

More specifically, reference can be made to Tsuyoshi Endo, *Netsukokasei Kobunshi no Seimitsuka*, C.M.C.

(1986), Yuji Harasaki, *Saishin Binder Gijutsu Binran*, Ch. II-1, Sogo Gijutsu Center (1985), Takayuki Otsu, *Acryl Jushi no Gosei.Sekkei to Shinyoto Kaihatsu*, Chubu Kei-ei Kaihatsu Center Shuppanbu (1985), and Eizo Omori, *Kinosei Acryl-Kei Jushi*, Techno System (1985).

As described above, while the overcoat layer or the photoconductive layer contains the silicon atom and/or fluorine atom-containing block copolymer (P) and, if desired, other binder resins, it is preferred that the layer further contains a small amount of photo- and/or heat-curable resin (D) and/or a crosslinking agent for further improving film curability.

The amount of photo- and/or heat-curable resin (D) and/or crosslinking agent to be added is from 0.01 to 20% by weight, and preferably from 0.1 to 15% by weight, based on the total amount of the whole binder resin. If the amount is less than 0.01% by weight, the effect of improving film curability decreases. If it exceeds 20% by weight, the electrophotographic characteristics may be adversely affected.

A combined use of a crosslinking agent is preferable. Any of ordinarily employed crosslinking agents may be utilized. Suitable crosslinking agents are described, e.g., in Shinzo Yamashita and Tosuke Kaneko (ed.), *Kakyozai Handbook*, Taiseisha (1981) and Kobunshi Gakkai (ed.), *Kobunshi Data Handbook (Kiso-hen)*, Baifukan (1986).

Specific examples of suitable crosslinking agents include organosilane compounds (such as silane coupling agents, e.g., vinyltrimethoxysilane, vinyltributoxysilane, γ-glycidoxypropyltrimethoxysilane, γ-mercaptopropyltriethoxysilane, and γ-aminopropylethoxysilane), polyisocyanate compounds (e.g., toluylene diisocyanate, diphenylmethane diisocyanate, triphenylmethane triisocyanate, polymethylenepolyphenyl isocyanate, hexamethylene diisocyanate, isophorone diisocyanate, and polymeric polyisocyanates), polyol compounds (e.g., 1,4-butanediol, polyoxypropylene glycol, a polyoxyethylene glycol, and 1,1,1-trimethylolpropane), polyamine compounds (e.g., ethylenediamine, γ-hydroxypropylated ethylenediamine, phenylenediamine, hexamethylenediamine, N-aminoethylpiperazine, and modified aliphatic polyamines), titanate coupling compounds (e.g., titanium tetrabutoxide, titanium tetrapropoxide, and isopropyltristearoyl titanate), aluminum coupling compounds (e.g., aluminum butylate, aluminum acetylacetate, aluminum oxide octate, and aluminum trisacetylacetate), polyepoxy-containing compounds and epoxy resins (e.g., the compounds as described in Hiroshi Kakiuchi (ed.), *Epoxy Jushi*, Shokodo (1985) and Kuniyuki Hashimoto (ed.), *Epoxy Jushi*, Nikkan Kogyo Shinbunsha (1969)), melamine resins (e.g., the compounds as described in Ichiro Miwa and Hideo Matsunaga (ed.), *Urea.Melamine Jushi*, Nikkan Kogyo Shinbunsha (1969)), and poly(meth)acrylate compounds (e.g., the compounds as described in Shin Okawara, Takeo Saegusa, and Toshinobu Higashimura (ed.), *Oligomer*, Kodansha (1976), and Eizo Omori, *Kinosei Acryl-kei Jushi*, Techno System (1985)). In addition, monomers containing a polyfunctional polymerizable group (e.g., vinyl methacrylate, acryl methacrylate, ethylene glycol diacrylate, polyethylene glycol diacrylate, divinyl succinate, divinyl adipate, diacryl succinate, 2-methylvinyl methacrylate, trimethylolpropane trimethacrylate, divinylbenzene, and pentaerythritol polyacrylate) may also be used as the crosslinking agent.

As described above, the uppermost layer of the photoconductive layer is preferably cured after film formation. It is preferred that the binder resin, the block copolymer (P), the curable resin (D), and the crosslinking agent to be used in the photoconductive layer are so selected and combined that their functional groups easily undergo chemical bonding to each other.

Combinations of functional groups which easily undergo a polymer reaction are well known. Specific examples of such combinations are shown in Table A below, wherein a functional group selected from Group A can be combined with a functional group selected from Group B. However, the present invention should not be construed as being limited thereto.

TABLE A

| Group A | Group B |
|---|---|
| —COOH, —PO$_3$H$_2$, —OH, | $\underset{-CH-CH_2}{\overset{O}{\diagup\diagdown}}$, $\underset{-CH-CH_2}{\overset{S}{\diagup\diagdown}}$, $-N\overset{CH_2}{\underset{CH_2}{\diagup\diagdown}}$, —COCl, |
| —SH, —NH$_2$, —NHR, —SO$_2$H | —SO$_2$Cl, a cyclic acid anhydride group, —N=C=O, —N=C=S, $O=C\overset{CH=CH}{\diagup\diagdown}C=O$, $-\underset{R^{22}}{\overset{R^{21}}{\mid}}Si-X$ (X: Cl, Br), $-\underset{R^{24}}{\overset{R^{23}}{\mid}}Si-R^{25}$, a blocked isocyanate group, —NHCOOR' (R': —CH$\overset{CF_3}{\underset{CF_3}{\diagup\diagdown}}$, —⟨phenyl⟩–Y'); Y': —CH$_3$, —Cl, —OCH$_3$), |

TABLE A-continued

| Group A | Group B |
|---|---|
| —NHCOCH(B¹)(B²) | ($B^1$, $B^2$: an electron attracting group), |
| —NHCO—N (ring with C) | (e.g., an imidazole ring) |

In Table A, $R^{21}$ and $R^{22}$ each represents an alkyl group; $R^{23}$, $R^{24}$, and $R^{25}$ each represents an alkyl group or an alkoxy group, provided that at least one of them is an alkoxy group; R represents a hydrocarbon group; $B^1$ and $B^2$ each represent an electron attracting group, e.g., —CN, —CR$_3$, —COR$^{26}$, —COOR$^{26}$, —SO$_2$OR$^{26}$ ($R^{26}$ represents a hydrocarbon group, e.g., $C_nH_{2n+1}$ (n: an integer of from 1 to 4), —CH$_2$C$_6$H$_5$, or —C$_6$H$_5$).

If desired, a reaction accelerator may be added to the binder resin for accelerating the crosslinking reaction in the light-sensitive layer.

The reaction accelerators which may be used for the crosslinking reaction forming a chemical bond between functional groups include organic acids (e.g., acetic acid, propionic acid, butyric acid, benzenesulfonic acid, and p-toluenesulfonic acid), phenols (e.g., phenol, chlorophenol, nitrophenol, cyanophenol, bromophenol, naphthol, and dichlorophenol), organometallic compounds (e.g., zirconium acetylacetonate, zirconium acetylacetone, cobalt acetylacetonate, and dibutoxytin dilaurate), dithiocarbamic acid compounds (e.g., diethyldithiocarbamic acid salts), thiuram disulfide compounds (e.g., tetramethylthiuram disulfide), and carboxylic acid anhydrides (e.g., phthalic anhydride, maleic anhydride, succinic anhydride, butylsuccinic anhydride, benzophenone-3,3',4,4'-tetracarboxylic acid benzophenone dianhydride, and trimellitic anhydride).

The reaction accelerators which may be used for the crosslinking reaction involving polymerization include polymerization initiators, such as peroxides and azobis compounds.

After a coating composition for the light-sensitive layer is coated, the binder resin is cured by light and/or heat. Heat curing can be carried out by drying under severer conditions than those for the production of a conventional light-sensitive element. For example, elevating the drying temperature and/or increasing the drying time may be utilized. After drying the solvent of the coating composition, the film is preferably subjected to a further heat treatment, for example, at 60° to 150° C. for 5 to 120 minutes. The conditions of the heat treatment may be made more moderately by using the above-described reaction accelerator in combination.

Curing of the resin containing a photo-curable functional group can be carried out by incorporating a step of irradiation of actinic ray into the production line. The actinic rays to be used include visible light, ultraviolet light, far ultraviolet light, electron beam, X-ray, γ-ray, and α-ray, with ultraviolet light being preferred. Actinic rays having a wavelength range of from 310 to 500 nm are more preferred. In general, a low-, high- or ultrahigh-pressure mercury lamp or a halogen lamp is employed as a light source. Usually, the irradiation treatment can be sufficiently performed at a distance of from 5 to 50 cm for 10 seconds to 10 minutes.

Now, the latter method for obtaining an electrophotographic light-sensitive element whose surface has releasability by applying the compound (S) for imparting the desired releasability to the surface of a conventionally known electrophotographic light-sensitive element before the formation of toner image will be described in detail below.

The compound (S) is a compound containing a fluorine atom and/or a silicon atom. The compound (S) containing a moiety having a fluorine and/or silicon atom is not particularly limited in its structure as far as it can improve releasability of the surface of electrophotographic light-sensitive element, and includes a low molecular weight compound, an oligomer, and a polymer. The compound (S) which is soluble at least 0.01 g in one liter of an electrically insulating organic solvent having an electric resistance of not less than $10^8$ Ω·cm and a dielectric constant of not more than 3.5 at 25° C. is preferred.

When the compound (S) is an oligomer or a polymer, the moiety having a fluorine and/or silicon atom includes that incorporated into the main chain of the oligomer or polymer and that contained as a substituent in the side chain thereof. Of the oligomers and polymers, those containing repeating units containing the moiety having a fluorine and/or silicon atom as a block are preferred since they adsorb on the surface of electrophotographic light-sensitive element to impart good releasability.

The fluorine atom-containing moieties include those described with respect to the resin (P) above.

Specific examples of the compound (S) containing a fluorine and/or silicon atom which can be used in the present invention include fluorine and/or silicon-containing organic compounds described, for example, in Tokiyuki Yoshida, et al. (ed.), *Shin-ban Kaimenkasseizai Handbook*, Kogaku Tosho (1987), Takao Karikome, *Saishin Kaimenkasseizai Oyo Gijutsu*, C.M.C. (1990), Kunio Ito (ed.), *Silicone Handbook*, Nikkan Kogyo Shinbunsha (1990), Takao Karikome, *Tokushukino Kaimenkasseizai*, C.M.C. (1986), and A. M. Schwartz, et al., *Surface Active Agents and Detergents*, Vol. II.

Further, the compound (S) according to the present invention can be synthesized by utilizing synthesis methods as described, for example, in Nobuo Ishikawa, *Fussokagobutsu no Gosei to Kino*, C.M.C. (1987), Jiro Hirano et al. (ed.), *Ganfussoyukikagobutsu—Sono Gosei to Oyo*, Gijutsu Joho Kokai (1991), and Mitsuo Ishikawa, *Yukikeiso Senryaku Shiryo*, Chapter 3, Science Forum (1991).

Specific examples of repeating units having the fluorine atom and/or silicon atom-containing moiety used in the oligomer or polymer as described above include those with respect to the resin (P) above, but the present invention should not be construed as being limited thereto.

Of the oligomers or polymers of compounds (S), so-called block copolymers are preferred as described above. Specifically, the compound (S) may be any type of copolymer as far as it contains the fluorine atom and/or silicon atom-containing polymer components as a block. The term "to be contained as a block" means that the compound (S) has a polymer segment comprising at least 70% by weight of the fluorine atom and/or silicon atom-containing polymer component based on the weight of the polymer segment. The content of the polymer components present in the polymer segment constituting a block is preferably 90% by weight, more preferably 100% by weight. The forms of blocks include an A-B type block, an A-B-A type block, a B-A-B type block, a grafted type block, and a starlike type block as schematically illustrated with respect to the resin (P) above. These block copolymers can be synthesized according to the methods described with respect to the resin (P) above.

By the application of compound (S) onto the surface of electrophotographic light-sensitive element, the surface is modified to have the desired releasability. The term "application of compound (S) onto the surface of electrophotographic light-sensitive element" means that the compound is supplied on the surface of electrophotographic light-sensitive element to form a state wherein the compound (S) is adsorbed or adhered thereon.

In order to apply the compound (S) to the surface of electrophotographic light-sensitive element, conventionally known various methods can be employed. For example, methods using an air doctor coater, a blade coater, a knife coater, a squeeze coater, a dip coater, a reverse roll coater, a transfer roll coater, a gravure coater, a kiss roll coater, a spray coater, a curtain coater, or a calender coater as described, for example, in Yuji Harasaki, *Coating Kogaku*, Asakura Shoten (1971), Yuji Harasaki, *Coating Hoshiki*, Maki Shoten (1979), and Hiroshi Fukada, *Hot-melt Secchaku no Jissai* Kobunshi Kankokai (1979) can be used.

A method wherein cloth, paper or felt impregnated with the compound (S) is pressed on the surface of light-sensitive element, a method of pressing a curable resin impregnated with the compound (S), a method wherein the light-sensitive element is wetted with a non-aqueous solvent containing the compound (S) dissolved therein, and then dried to remove the solvent, and a method wherein the compound (S) dispersed in a non-aqueous solvent is migrated and adhered on the surface of light-sensitive element due to electrophoresis according to a wet-type electrodeposition method as described hereinafter can also be employed.

Further, the compound (S) can be applied on the surface of light-sensitive element by utilizing a non-aqueous solvent containing the compound (S) according to an ink jet method, followed by drying. The ink jet method can be performed with reference to the descriptions in Shin Ohno (ed.), *Non-impact Printing*, C.M.C. (1986). More specifically, a Sweet process or Hartz process of a continuous jet type, a Winston process of an intermittent jet type, a pulse jet process of an ink on-demand type, a bubble jet process, and a mist process of an ink mist type are illustrated. In any system, the compound (S) itself or diluted with a solvent is filled in an ink tank or ink head cartridge in place of an ink to use. The solution of compound (S) used ordinarily has a viscosity of from 1 to 10 cp and a surface tension of from 30 to 60 dyne/cm, and may contain a surface active agent, or may be heated if desired. Although a diameter of ink droplet is in a range of from 30 to 100 μm due to a diameter of an orifice of head in a conventional ink jet printer in order to reproduce fine letters, droplets of a larger diameter can also be used in the present invention. In such a case, an amount of jet of the compound (S) becomes large and thus a time necessary for the application can be shortened. Further, to use multiple nozzles is very effective to shorten the time for application.

When silicone rubber is used as the compound (S), it is preferred that silicone rubber is provided on a metal axis to cover and the resulting silicone rubber roller is directly pressed on the surface of electrophotographic light-sensitive element. In such a case, a nip pressure is ordinarily in a range of from 0.5 to 10 Kgf/cm$^2$ and a time for contact is ordinarily in a range of from 1 second to 30 minutes. Also, the light-sensitive element and/or silicone rubber roller may be heated up to a temperature of 150° C. According to this method, it is believed that a part of low molecular weight components contained in silicone rubber is moved from the silicone rubber roller onto the surface of light-sensitive element during the press. The silicone rubber may be swollen with silicone oil. Moreover, the silicone rubber may be a form of sponge and the sponge roller may be impregnated with silicone oil or a solution of silicone surface active agent.

The application method of the compound (S) is not particularly limited, and an appropriate method can be selected depending on a state (i.e., liquid, wax or solid) of the compound (S) used. A flowability of the compound (S) can be controlled using a heat medium, if desired.

The application of compound (S) is preferably performed by a means which is easily incorporated into an electrophotographic apparatus.

An amount of the compound (S) applied to the surface of electrophotographic light-sensitive element is adjusted in a range wherein the electrophotographic characteristics of light-sensitive element do not adversely affected in substance. Ordinarily, a thickness of the coating is sufficiently 1 μm or less. By the formation of weak boundary layer as defined in Bikerman, *The Science of Adhesive Joints*, Academic Press (1961), the releasability-imparting effect of the present invention can be obtained. Specifically, when an adhesive strength of the surface of an electrophotographic light-sensitive element to which the compound (S) has been applied is measured according to JIS Z 0237-1980 "Testing methods of pressure sensitive adhesive tapes and sheets" described above, the resulting adhesive strength is preferably not more than 100 gram.force.

In accordance with the present invention, the surface of electrophotographic light-sensitive element is provided with the desired releasability by the application of compound (S), and the light-sensitive element can be repeatedly employed as far as the releasability is maintained. Specifically, the application of compound (S) is not always necessarily whenever a series of steps comprising the formation of toner image, transfer of the toner image onto a transfer layer of primary receptor and transfer of the transfer layer onto a receiving material is repeated.

Any conventionally known electrophotographic light-sensitive element can be employed in the present invention.

Suitable examples of electrophotographic light-sensitive element used are described, for example, in R. M. Schaffert, *Electrophotography*, Forcal Press, London (1980), S. W. Ing, M. D. Tabak and W. E. Haas, *Electrophotography Fourth International Conference*, SPSE (1983), Isao Shinohara, Hidetoshi Tsuchida and Hideaki Kusakawa (ed.), *Kirokuzairyo to Kankoseijushi*, Gakkai Shuppan Center (1979), Hiroshi Kokado, *Kagaku to Kogyo*, Vol. 39, No. 3, p. 161 (1986), *Saikin no Kododen Zairyo to Kankotai no Kaihatsu.Jitsuyoka*, Nippon Kagaku Joho Shuppanbu (1986), Denshishashin Gakkai (ed.), *Denshishashin no Kiso to Oyo*, Corona (1986), and Denshishashin Gakkai (ed.), *Denshishashinyo Yukikankotai no Genjo Symposium* (preprint), (1985).

A photoconductive layer for the electrophotographic light-sensitive element which can be used in the present invention is not particularly limited, and any known photoconductive layer may be employed.

Specifically, the photoconductive layer includes a single layer made of a photoconductive compound itself and a photoconductive layer comprising a binder resin having dispersed therein a photoconductive compound. The dispersed type photoconductive layer may have a single layer structure or a laminated structure.

The photoconductive compounds used in the present invention may be inorganic compounds or organic compounds.

Inorganic photoconductive compounds used in the present invention include those conventionally known for example, zinc oxide, titanium oxide, zinc sulfide, cadmium sulfide, selenium, selenium-tellurium, silicon, lead sulfide. These compounds are used together with a binder resin to form a photoconductive layer, or they are used alone to form a photoconductive layer by vacuum evaporation or spattering.

Where an inorganic photoconductive compound, e.g., zinc oxide or titanium oxide, is used, a binder resin is usually used in an amount of from 10 to 100 parts by weight, and preferably from 15 to 40 parts by weight, per 100 parts by weight of the inorganic photoconductive compound.

Organic photoconductive compounds used may be selected from conventionally known compounds. Suitable photoconductive layers containing an organic photoconductive compound include (i) a layer mainly comprising an organic photoconductive compound, a sensitizing dye, and a binder resin as described, e.g., in JP-B-37-17162, JP-B-62-51462, JP-A-52-2437, JP-A-54-19803, JP-A-56-107246, and JP-A-57-161863; (ii) a layer mainly comprising a charge generating agent, a charge transporting agent, and a binder resin as described, e.g., in JP-A-56-146145, JP-A-60-17751, JP-A-60-17752, JP-A-60-17760, JP-A-60-254142, and JP-A-62-54266; and (iii) a double-layered structure containing a charge generating agent and a charge transporting agent in separate layers as described, e.g., in JP-A-60-230147, JP-A-60-230148, and JP-A-60-238853.

The photoconductive layer of the electrophotographic light-sensitive element according to the present invention may have any of the above-described structure.

The organic photoconductive compounds which may be used in the present invention include (a) triazole derivatives described, e.g., in U.S. Pat. No. 3,112,197, (b) oxadiazole derivatives described, e.g., in U.S. Pat. No. 3,189,447, (c) imidazole derivatives described in JP-B-37-16096, (d) polyarylalkane derivatives described, e.g., in U.S. Pat. Nos. 3,615,402, 3,820,989, and 3,542,544, JP-B-45-555, JP-B-51-10983, JP-A-51-93224, JP-A-55-108667, JP-A-55-156953, and JP-A-56-36656, (e) pyrazoline derivatives and pyrazolone derivatives described, e.g., in U.S. Pat. Nos. 3,180,729 and 4,278,746, JP-A-55-88064, JP-A-55-88065, JP-A-49-105537, JP-A-55-51086, JP-A-56-80051, JP-A-56-88141, JP-A-57-45545, JP-A-54-112637, and JP-A-55-74546, (f) phenylenediamine derivatives described, e.g., in U.S. Pat. No. 3,615,404, JP-B-51-10105, JP-B-46-3712, JP-B-47-28336, JP-A-54-83435, JP-A-54-110836, and JP-A-54-119925, (g) arylamine derivatives described, e.g., in U.S. Pat. Nos. 3,567,450, 3,180,703, 3,240,597, 3,658,520, 4,232,103, 4,175,961, and 4,012,376, JP-B-49-35702, West German Patent (DAS) 1,110,518, JP-B-39-27577, JP-A-55-144250, JP-A-56-119132, and JP-A-56-22437, (h) amino-substituted chalcone derivatives described, e.g., in U.S. Pat. No. 3,526,501, (i) N,N-bicarbazyl derivatives described e.g., in U.S. Pat. No. 3,542,546, (j) oxazole derivatives described, e.g., in U.S. Pat. No. 3,257,203, (k) styrylanthracene derivatives described, e.g., in JP-A-56-46234, (l) fluorenone derivatives described, e.g., in JP-A-54-110837, (m) hydrazone derivatives described, e.g., in U.S. Pat. No. 3,717,462, JP-A-54-59143 (corresponding to U.S. Pat. No. 4,150,987), JP-A-55-52063, JP-A-55-52064, JP-A-55-46760, JP-A-55-85495, JP-A-57-11350, JP-A-57-148749, and JP-A-57-104144, (n) benzidine derivatives described, e.g., in U.S. Pat. Nos. 4,047,948, 4,047,949, 4,265,990, 4,273,846, 4,299,897, and 4,306,008, (o) stilbene derivatives described, e.g., in JP-A-59-95540, JP-A-59-97148, JP-A-59-195658, and JP-A-62-36674, (p) polyvinylcarbazole and derivatives thereof described in JP-B-34-10966, (q) vinyl polymers, such as polyvinylpyrene, polyvinylanthracene, poly-2-vinyl-4-(4'-dimethylaminophenyl)-5-phenyloxazole, and poly-3-vinyl-N-ethylcarbazole, described in JP-B-43-18674 and JP-B-43-19192, (r) polymers, such as polyacenaphthylene, polyindene, and an acenaphthylene-styrene copolymer, described in JP-B-43-19193, (s) condensed resins, such as pyrene-formaldehyde resin, bromopyrene-formaldehyde resin, and ethylcarbazole-formaldehyde resin, described, e.g., in JP-B-56-13940, and (t) triphenylmethane polymers described in JP-A-56-90833 and JP-A-56-161550.

The organic photoconductive compounds which can be used in the present invention are not limited to the above-described compounds (a) to (t), and any of known organic photoconductive compounds may be employed in the present invention. The organic photoconductive compounds may be used either individually or in combination of two or more thereof.

The sensitizing dyes which can be used in the photoconductive layer of (i) include those conventionally known as described, e.g., in *Denshishashin*, Vol. 12, p. 9 (1973) and *Yuki Gosei Kagaku*, Vol. 24, No. 11, p. 1010 (1966). Specific examples of suitable sensitizing dyes include pyrylium dyes described, e.g., in U.S. Pat. Nos. 3,141,770 and 4,283,475, JP-A-48-25658, and JP-A-62-71965; triarylmethane dyes described, e.g., in *Applied Optics Supplement*, Vol. 3, p. 50 (1969) and JP-A-50-39548; cyanine dyes described, e.g., in U.S. Pat. No. 3,597,196; and styryl dyes described, e.g., in JP-A-60-163047, JP-A-59-164588, and JP-A-60-252517.

The charge generating agents which can be used in the photoconductive layer of (ii) include various conventionally known charge generating agents, either organic or inorganic, such as selenium, seleniumtellurium, cadmium sulfide, zinc oxide, and organic pigments, for example, (1) azo pigments (including monoazo, bisazo, and trisazo pigments) described, e.g., in U.S. Pat. Nos. 4,436,800 and 4,439,506, JP-A-47-37543, JP-A-58-123541, JP-A-58-192042, JP-A-58-219263, JP-A-59-78356, JP-A-60-179746, JP-A-61-148453, JP-A-61-238063, JP-B-60-5941, and JP-B-60-45664, (2) metal-free or metallized phthalocyanine pigments described, e.g., in U.S. Pat. Nos. 3,397,086 and 4,666,802, JP-A-51-90827, and JP-A-52-55643, (3) perylene pigments described, e.g., in U.S. Pat. No. 3,371,884 and JP-A-47-30330, (4) indigo or thioindigo derivatives described, e.g., in British Patent 2,237,680 and JP-A-47-30331, (5) quinacridone pigments described, e.g., in British Patent 2,237,679 and JP-A-47-30332, (6) polycyclic quinone dyes described, e.g., in British Patent 2,237,678, JP-A-59-184348, JP-A-62-28738, and JP-A-47-18544, (7) bisbenzimidazole pigments described, e.g., in JP-A-47-30331 and JP-A-47-18543, (8) squarylium salt pigments described, e.g., in U.S. Pat. Nos. 4,396,610 and 4,644,082, and (9) azulenium salt pigments described, e.g., in JP-A-59-53850 and JP-A-61-212542.

These organic pigments may be used either individually or in combination of two or more thereof.

With respect to a mixing ratio of the organic photoconductive compound and a binder resin, particularly the upper limit of the organic photoconductive compound is determined depending on the compatibility between these materials. The organic photoconductive compound, if added in an amount over the upper limit, may undergo undesirable crystallization. The lower the content of the organic photoconductive compound, the lower the electrophotographic sensitivity. Accordingly, it is desirable to use the organic photoconductive compound in an amount as much as possible within such a range that crystallization does not occur. In general, 5 to 120 parts by weight, and preferably from 10 to 100 parts by weight, of the organic photoconductive compound is used per 100 parts by weight of the total binder resins.

The binder resins which can be used in the light-sensitive element according to the present invention include those for conventionally known electrophotographic light-sensitive elements. A preferred weight average molecular weight of the binder resin is from $5 \times 10^3$ to $1 \times 10^6$, and particularly from $2 \times 10^4$ to $5 \times 10^5$. A preferred glass transition point of the binder resin is from $-40°$ to $200°$ C., and particularly from $-10°$ to $140°$ C.

Conventional binder resins which may be used in the present invention are described, e.g., in Takaharu Shibata and Jiro Ishiwatari, *Kobunshi*, Vol. 17, p. 278 (1968), Harumi Miyamoto and Hidehiko Takei, *Imaging*, Vol. 1973, No. 8, Koichi Nakamura (ed.), *Kiroku Zairyoyo Binder no Jissai Gijutsu*, Ch. 10, C.M.C. (1985), Denshishashin Gakkai (ed.), *Denshishashinyo Yukikankotai no Genjo Symposium* (preprint) (1985), Hiroshi Kokado (ed.), *Saikin no Kododen Zairyo to Kankotai no Kaihatsu.Jitsuyoka*, Nippon Kagaku Joho (1986), Denshishashin Gakkai (ed.), *Denshishashin Gijutsu no Kiso to Oyo*, Ch. 5, Corona (1988), D. Tatt and S. C. Heidecker, *Tappi*, Vol. 49, No. 10, p. 439 (1966), E. S. Baltazzi and R. G. Blanchlotte, et al., *Photo. Sci. Eng.*, Vol. 16, No. 5, p. 354 (1972), and Nguyen Chank Keh, Isamu Shimizu and Eiichi Inoue, *Denshi Shashin Gakkaishi*, Vol. 18, No. 2, p. 22 (1980).

Specific examples of these known binder resins used include olefin polymers or copolymers, vinyl chloride copolymers, vinylidene chloride copolymers, vinyl alkanoate polymers or copolymers, allyl alkanoate polymers or copolymers, polymers or copolymers of styrene or derivatives thereof, butadiene-styrene copolymers, isoprene-styrene copolymers, butadiene-unsaturated carboxylic ester copolymers, acrylonitrile copolymers, methacrylonitrile copolymers, alkyl vinyl ether copolymers, acrylic ester polymers or copolymers, methacrylic ester polymers or copolymers, styrene-acrylic ester copolymers, styrene-methacrylic ester copolymers, itaconic diester polymers or copolymers, maleic anhydride copolymers, acrylamide copolymers, methacrylamide copolymers, hydroxy-modified silicone resins, polycarbonate resins, ketone resins, polyester resins, silicone resins, amide resins, hydroxy- or carboxy-modified polyester resins, butyral resins, polyvinyl acetal resins, cyclized rubber-methacrylic ester copolymers, cyclized rubber-acrylic ester copolymers, copolymers containing a heterocyclic ring containing no nitrogen atom (the heterocyclic ring including furan, tetrahydrofuran, thiophene, dioxane, dioxofuran, lactone, benzofuran, benzothiophene and 1,3-dioxetane rings), and epoxy resins.

Further, the electrostatic characteristics of the photoconductive layer are improved by using, as a binder resin, a resin having a relatively low molecular weight (e.g., a weight average molecular weight of from $10^3$ to $10^4$) and containing an acidic group such as a carboxy group, a sulfo group or a phosphono group. For instance, JP-A-63-217354 discloses a resin having polymer components containing an acidic group at random in the polymer main chain, JP-A-64-70761 discloses a resin having an acidic group bonded at one terminal of the polymer main chain, JP-A-2-67563, JP-A-2-236561, JP-A-2-238458, JP-A-2-236562 and JP-A-2-247656 disclose a resin of graft type copolymer having an acidic group bonded at one terminal of the polymer main chain or a resin of graft type copolymer containing acidic groups in the graft portion, and JP-A-3-181948 discloses an AB block copolymer containing acidic groups as a block.

Moreover, in order to obtain a satisfactorily high mechanical strength of the photoconductive layer which may be insufficient by only using the low molecular weight resin, a medium to high molecular weight resin is preferably used together with the low molecular weight resin. For instance, JP-A-2-68561 discloses a thermosetting resin capable of forming crosslinked structures between polymers, JP-A-2-68562 discloses a resin partially having crosslinked structures, and JP-A-2-69759 discloses a resin of graft type copolymer having an acidic group bonded at one terminal of the polymer main chain. Also, in order to maintain the relatively stable performance even when ambient conditions are widely fluctuated, a specific medium to high molecular weight resin is employed in combination. For instance, JP-A-3-29954, JP-A-3-77954, JP-A-3-92861 and JP-A-3-53257 disclose a resin of graft type copolymer having an acidic group bonded at the terminal of the graft portion or a resin of graft type copolymer containing acidic groups in the graft portion. Moreover, JP-A-3-206464 and JP-A-3-223762 discloses a medium to high molecular weight resin of graft type copolymer having a graft portion formed from an AB block copolymer comprising an A block containing acidic groups and a B block containing no acidic group.

In a case of using these resins, the photoconductive substance is uniformly dispersed to form a photoconductive layer having good smoothness. Also, excellent electrostatic characteristics can be maintained even when ambient conditions are fluctuated or when a scanning exposure system using a semiconductor laser beam is utilized for the image exposure.

The photoconductive layer usually has a thickness of from 1 to 100 μm, and preferably from 10 to 50 μm.

Where a photoconductive layer functions as a charge generating layer of a laminated type light-sensitive element composed of a charge generating layer and a charge transporting layer, the charge generating layer has a thickness of from 0.01 to 5 μm, and preferably from 0.05 to 2 μm.

Depending on the kind of a light source for exposure, for example, visible light or semiconductor laser beam, various dyes may be used as spectral sensitizers. The sensitizing dyes used include carbonium dyes, diphenylmethane dyes, triphenylmethane dyes, xanthene dyes, phthalein dyes, polymethine dyes (including oxonol dyes, merocyanine dyes, cyanine dyes, rhodacyanine dyes, and styryl dyes), and phthalocyanine dyes (including metallized dyes), as described e.g., in Harumi Miyamoto and Hidehiko Takei, *Imaging*, Vol. 1973, No. 8, p. 12, C. J. Young et al., *RCA Review*, Vol. 15, p. 469 (1954), Kohei Kiyota et al., *Denkitsushin Gakkai Ronbunshi*, Vol. J 63-C, No. 2, p. 97 (1980), Yuji Harasaki et al., *Kogyo Kagaku Zasshi*, Vol. 66, p. 78 and 188 (1963), and Tadaaki Tani, *Nihon Shashin Gakkaishi*, Vol. 35, p. 208 (1972).

Specific examples of carbonium dyes, triphenylmethane dyes, xanthene dyes, and phthalein dyes are described, e.g., in JP-B-51-452, JP-A-50-90334, JP-A-50-114227, JP-A-53-

39130, JP-A-53-82353, U.S. Pat. Nos. 3,052,540 and 4,054,450, and JP-A-57-16456.

Usable polymethine dyes, such as oxonol dyes, merocyanine dyes, cyanine dyes, and rhodacyanine dyes, are described in F. M. Hamer, *The Cyanine Dyes and Related Compounds*. Specific examples of these dyes are described, e.g., in U.S. Pat. Nos. 3,047,384, 3,110,591, 3,121,008, 3,125,447, 3,128,179, 3,132,942, and 3,622,317, British Patents 1,226,892, 1,309,274, and 1,405,898, JP-B-48-7814, and JP-B-55-18892.

Further, polymethine dyes capable of performing spectral sensitization in the near infrared to infrared region of 700 nm or more include those described, e.g., in JP-A-47-840, JP-A-47-44180, JP-B-51-41061, JP-A-49-5034, JP-A-49-45122, JP-A-57-46245, JP-A-56-35141, JP-A-57-157254, JP-A-61-26044, JP-A-61-27551, U.S. Pat. Nos. 3,619,154 and 4,175,956, and *Research Disclosure*, No. 216, pp. 117–118 (1982).

The light-sensitive element of the present invention is excellent in that the characteristics thereof hardly vary with the combined use of various sensitizing dyes.

If desired, the light-sensitive element may further contain various additives conventionally known for electrophotographic light-sensitive elements. The additives include chemical sensitizers for increasing electrophotographic sensitivity and plasticizers or surface active agents for improving film properties.

Suitable examples of the chemical sensitizers include electron attracting compounds such as a halogen, benzoquinone, chloranil, fluoranil, bromanil, dinitrobenzene, anthraquinone, 2,5-dichlorobenzoquinone, nitrophenol, tetrachlorophthalic anhydride, phthalic anhydride, maleic anhydride, N-hydroxymaleimide, N-hydroxyphthalimide, 2,3-dichloro-5,6-dicyanobenzoquinone, dinitrofluorenone, trinitrofluorenone, tetracyanoethylene, nitrobenzoic acid, and dinitrobenzoic acid; and polyarylalkane compounds, hindered phenol compounds and p-phenylenediamine compounds as described in the literature references cited in Hiroshi Kokado, et al., *Saikin no Kododen Zairyo to Kankotai no Kaihatsu.Jitsuyoka*, Chs. 4 to 6, Nippon Kagaku Joho (1986). In addition, the compounds as described in JP-A-58-65439, JP-A-58-102239, JP-A-58-129439, and JP-A-62-71965 may also be used.

Suitable examples of the plasticizers, which may be added for improving flexibility of a photoconductive layer, include dimethyl phthalate, dibutyl phthalate, dioctyl phthalate, diphenyl phthalate, triphenyl phosphate, diisobutyl adipate, dimethyl sebacate, dibutyl sebacate, butyl laurate, methyl phthalyl glycolate, and dimethyl glycol phthalate. The plasticizer can be added in an amount that does not impair electrostatic characteristics of the photoconductive layer.

The amount of the additive to be added is not particularly limited, but ordinarily ranges from 0.001 to 2.0 parts by weight per 100 parts by weight of the photoconductive substance.

The photoconductive layer of the present invention can be provided on a conventionally known support. In general, a support for an electrophotographic light-sensitive layer is preferably electrically conductive. The electrically conductive support which can be used includes a substrate (e.g., a metal plate, paper, or a plastic sheet) having been rendered conductive by impregnation with a low-resistant substance, a substrate whose back side (opposite to the light-sensitive layer side) is rendered conductive and further having coated thereon at least one layer for, for example, curling prevention, the above-described substrate having formed on the surface thereof a water-resistant adhesive layer, the above-described substrate having on the surface thereof at least one precoat layer, and a paper substrate laminated with a plastic film on which aluminum, etc. has been vacuum deposited.

Specific examples of the conductive substrate and materials for rendering non-conductive substrates electrically conductive are described, for example, in Yukio Sakamoto, *Denshishashin*, Vol. 14, No. 1, pp. 2–11 (1975), Hiroyuki Moriga, *Nyumon Tokushushi no Kagaku*, Kobunshi Kankokai (1975), and M. F. Hoover, *J. Macromol. Sci. Chem.*, Vol. A-4, No. 6, pp. 1327–1417 (1970).

Now, the formation of toner image on the electrophotographic light-sensitive element whose surface has releasability will be described in detail below.

When the releasability of surface is insufficient, the compound (S) can be applied to the surface in order to obtain the desired releasability before the start of electrophotographic process. For the formation of toner image, a conventional electrophotographic process can be utilized. Specifically, each step of charging, light exposure, development and fixing is performed in a conventionally known manner.

In order to form the toner image by an electrophotographic process according to the present invention, any methods and apparatus conventionally known can be employed.

The developers which can be used in the present invention include conventionally known developers for electrostatic photography, either dry type or liquid type. For example, specific examples of the developer are described in *Denshishashin Gijutsu no Kiso to Oyo*, supra., pp. 497–505, Koichi Nakamura (ed.), *Toner Zairyo no Kaihatsu.Jitsuyoka*, Ch. 3, Nippon Kagaku Joho (1985), Gen Machida, *Kirokuyo Zairyo to Kankosei Jushi*, pp. 107–127 (1983), and Denshishasin Gakkai (ed.), *Imaging*, Nos. 2–5, "Denshishashin no Genzo.Teichaku.Taiden.Tensha", Gakkai Shuppan Center.

Dry developers practically used include one-component magnetic toners, two-component toners, one-component non-magnetic toners, and capsule toners. Any of these dry developers may be employed in the present invention.

The typical liquid developer is basically composed of an insulating organic solvent, for example, an isoparaffinic aliphatic hydrocarbon (e.g., Isopar H or Isopar G (manufactured by Esso Chemical Co.), Shellsol 70 or Shellsol 71 (manufactured by Shell Oil Co.) or IP-Solvent 1620 (manufactured by Idemitsu Petro-Chemical Co., Ltd.)) as a dispersion medium, having dispersed therein a colorant (e.g., an organic or inorganic dye or pigment) and a resin for imparting dispersion stability, fixability, and chargeability to the developer (e.g., an alkyd resin, an acrylic resin, a polyester resin, a styrene-butadiene resin, and rosin). If desired, the liquid developer can contain various additives for enhancing charging characteristics or improving image characteristics.

The colorant is appropriately selected from known dyes and pigments, for example, benzidine type, azo type, azomethine type, xanthene type, anthraquinone type, phthalocyanine type (including metallized type), titanium white, nigrosine, aniline black, and carbon black.

Other additives include, for example, those described in Yuji Harasaki, *Denshishashin*, Vol. 16, No. 2, p. 44, such as di-2-ethylhexylsufosuccinic acid metal salts, naphthenic acid metal salts, higher fatty acid metal salts, alkylbenzenesulfonic acid metal salts, alkylphosphoric acid metal salts, lecithin, polyvinylpyrrolidone, copolymers containing a maleic acid monoamido component, coumarone-indene resins, higher alcohols, polyethers, polysiloxanes, and waxes.

With respect to the content of each of the main components of the liquid developer, toner particles mainly comprising a resin (and, if desired, a colorant) are preferably present in an amount of from 0.5 to 50 parts by weight per 1000 parts by weight of a carrier liquid. If the toner content is less than 0.5 part by weight, the image density is insufficient, and if it exceeds 50 parts by weight, the occurrence of fog in the non-image areas may be tended to.

If desired, the above-described resin for dispersion stabilization which is soluble in the carrier liquid is added in an amount of from about 0.5 to about 100 parts by weight per 1000 parts by weight of the carrier liquid. The above-described charge control agent can be preferably added in an amount of from 0.001 to 1.0 part by weight per 1000 parts by weight of the carrier liquid. Other additives may be added to the liquid developer, if desired. The upper limit of the total amount of other additives is determined, depending on electrical resistance of the liquid developer. Specifically, the amount of each additive should be controlled so that the liquid developer exclusive of toner particles has an electrical resistivity of not less than $10^8$ $\Omega$cm. If the resistivity is less than $10^8$ $\Omega$cm, a continuous gradation image of good quality can hardly be obtained.

The liquid developer can be prepared, for example, by mechanically dispersing a colorant and a resin in a dispersing machine, e.g., a sand mill, a ball mill, a jet mill, or an attritor, to produce colored particles, as described, for example, in JP-B-35-5511, JP-B-35-13424, JP-B-50-40017, JP-B-49-98634, JP-B-58-129438, and JP-A-61-180248.

The colored particles may also be obtained by a method comprising preparing dispersed resin grains having a fine grain size and good monodispersity in accordance with a non-aqueous dispersion polymerization method and coloring the resulting resin grains. In such a case, the dispersed grains prepared can be colored by dyeing with an appropriate dye as described, e.g., in JP-A-57-48738, or by chemical bonding of the dispersed grains with a dye as described, e.g., in JP-A-53-54029. It is also effective to polymerize a monomer already containing a dye at the polymerization granulation to obtain a dye-containing copolymer as described, e.g., in JP-B-44-22955.

Particularly, a combination of a scanning exposure system using a laser beam based on digital information and a development system using a liquid developer is an advantageous process since the process is particularly suitable to form highly accurate images.

One specific example of the methods for preparing a color transfer image is illustrated below. An electrophotographic light-sensitive element is positioned on a flat bed by a register pin system and fixed on the flat bed by air suction from the backside. Then it is charged by means of a charging device, for example, the device as described in Denshishashin Gakkai (ed.), *Denshishashin Gijutsu no Kiso to Oyo*, p. 212 et seq., Corona Sha (1988). A corotton or scotron system is usually used for the charging process. In a preferred charging process, the charging conditions may be controlled by a feedback system of the information on charged potential from a detector connected to the light-sensitive element thereby to control the surface potential within a predetermined range.

Thereafter, the charged light-sensitive element is exposed to light by scanning with a laser beam in accordance with the system described, for example, in ibidem, p. 254 et seq. Of four color separation images, first the image corresponding to a yellow part is converted to a dot pattern and exposed.

Toner development is then conducted using a liquid developer. The light-sensitive element charged and exposed is removed from the flat bed and developed according to a wet type developing method as described, for example, in ibidem, p. 275 et seq. The exposure mode is determined in accord with the toner image development mode. Specifically, in case of reversal development, a negative image is irradiated with a laser beam, and a toner having the same charge polarity as that of the charged light-sensitive element is electrodeposited on the exposed area with a bias voltage applied. For the details, reference can be made to ibidem, p. 157 et seq.

After the toner development, the light-sensitive element is squeezed to remove the excess developer as described in ibidem, p. 283 and dried. Preferably, the light-sensitive element is rinsed with the carrier liquid used in the liquid developer before squeezing.

The above electrophotographic process for forming toner image is repeated with respect to a magenta, cyan and black part in case forming a full-color duplicate.

The thus-formed toner image on the light-sensitive element is then heat-transferred onto a primary receptor having a peelable transfer layer provided thereon.

Now, the transfer layer which can be used in the present invention will be described in greater detail below.

The transfer layer of the present invention comprises a resin (hereinafter referred to as a resin (A) sometimes) and is light-transmittive. Specifically, it is not particularly limited as far as hue of toner image formed thereon is distinguishable. The layer may be colored. In a case wherein duplicated images transferred on a receiving material are color images, particularly full-color images, a colorless and transparent transfer layer is usually employed.

The resin (A) is preferably a resin which is peelable from a primary receptor at a temperature of not more than 180° C. or at a pressure not more than 20 kgf/cm$^2$. When a resin only peelable under condition exceeding the above described value is used, there may arise a difficult problem for practical purpose in that a device for releasing the transfer layer from the surface of a primary receptor and transferring onto a receiving material must be large-sized in order to maintain the desired heat capacity and pressure therefor or in that a transfer speed must be very lowered to conduct sufficiently the transfer. While there is no particular lower limit thereof, ordinarily it is preferred to use a resin which is peelable at a temperature of not less than room temperature or at a pressure of not less than 100 gf/cm$^2$.

The resin (A) preferably used may be any resin which is peelable under the transfer condition described above.

With respect to the thermal property, the resin (A) has preferably a glass transition point of not more than 140° C. or a softening point of not more than 180° C., and more preferably a glass transition point of not more than 100° C. or a softening point of not more than 150° C.

The resins (A) may be employed either individually or in combination of two or more thereof. For instance, at least two resins having a glass transition point or a softening point different from each other are preferably used in combination. Specifically, a resin (A) having a glass transition point of not less than 30° C. or a softening point of not less than 35° C. (hereinafter referred to as a resin (AH) sometimes) and a resin (A) having a glass transition point or a softening point at least 2° C. lower than the glass transition point or the softening point, respectively, of the resin (AH) (hereinafter referred to as a resin (AL) sometimes) are used in combination. Such a combination of the resins (A) is effective to improve transferability of the transfer layer onto a receiving material and to enlarge a latitude of the transfer condition. The difference in the glass transition point or softening point between the resin (AH) and the resin (AL) is more preferably at least 5° C. The resin (AL) preferably has a glass transition point of from −30° C. to 40° C. or a softening point of from 0° C. to 45° C. The difference in the glass transition point or softening point between the resin (AH) and the resin (AL) means a difference between the lowest glass transition point or softening point of those of the resins (AH) and the highest glass transition point or softening point of those of the resins (AL) when two or more of the resins (AH) and/or resins (AL) are employed.

A weight ratio of the thermoplastic resin (AH)/the thermoplastic resin (AL) used in the transfer layer is preferably from 5/95 to 90/10, more preferably from 10/90 to 70/30 to obtain the above described effects.

The resins (A) which can be used in the transfer layer include thermoplastic resins and resins conventionally known as adhesive or stick. Suitable examples of these resins include olefin polymers or copolymers, vinyl chloride copolymers, vinylidene chloride copolymers, vinyl alkanoate polymers or copolymers, allyl alkanoate polymers or copolymers, polymers or copolymers of styrene or derivatives thereof, olefin-styrene copolymers, olefin-unsaturated carboxylic ester copolymers, acrylonitrile copolymers, methacrylonitrile copolymers, alkyl vinyl ether copolymers, acrylic ester polymers or copolymers, methacrylic ester polymers or copolymers, styrene-acrylic ester copolymers, styrene-methacrylic ester copolymers, itaconic diester polymers or copolymers, maleic anhydride copolymers, acrylamide copolymers, methacrylamide copolymers, hydroxy-modified silicone resins, polycarbonate resins, ketone resins, polyester resins, silicone resins, amide resins, hydroxy- or carboxy-modified polyester resins, butyral resins, polyvinyl acetal resins, cyclized rubber-methacrylic ester copolymers, cyclized rubber-acrylic ester copolymers, copolymers containing a heterocyclic ring (the heterocyclic ring including, for example, furan, tetrahydrofuran, thiophene, dioxane, dioxofuran, lactone, benzofuran, benzothiophene and 1,3-dioxetane rings), cellulose resins, fatty acid-modified cellulose resins and epoxy resins. Specific examples of resins are described, e.g., in *Plastic Zairyo Koza Series*, Vols. 1 to 18, Nikkan Kogyo Shinbunsha (1961), Kinki Kagaku Kyokai Vinyl Bukai (ed.), *Polyenka Vinyl*, Nikkan Kogyo Shinbunsha (1988), Eizo Omori, *Kinosei Acryl Jushi*, Techno System (1985), Ei-ichiro Takiyama, *Polyester Jushi Handbook*, Nikkan Kogyo Shinbunsha (1988), Kazuo Yuki, *Howa Polyester Jushi Handbook*, Nikkan Kogyo Shinbunsha (1989), Kobunshi Gakkai (ed.), *Kobunshi Data Handbook (Oyohen)*, Ch. 1, Baifukan (1986), Yuji Harasaki, *Saishin Binder Gijutsu Binran*, Ch. 2, Sogo Gijutsu Center (1985), Taira Okuda (ed.), *Kobunshi Kako*, Vol. 20, Supplement "Nenchaku", Kobunshi Kankokai (1976), Keizi Fukuzawa, *Nenchaku Gijutsu*, Kobunshi Kankokai (1987), Mamoru Nishiguchi, *Secchaku Binran*, 14th Ed., Kobunshi Kankokai (1985), and Nippon Secchaku Kokai (ed.), *Secchaku Handbook*, 2nd Ed., Nikkan Kogyo Shinbunsha (1980).

The resin (A) used in the transfer layer according to the present invention may contain a polymer component (f) containing a moiety having at least one of a fluorine atom and a silicon atom which is effective to increase the peelability of the resin (A) itself. Using such a resin, releasability of the transfer layer from a primary receptor is increased and as a result, the transferability is improved.

The moiety having a fluorine atom and/or a silicon atom contained in the resin (A) includes that incorporated into the main chain of the polymer and that contained as a substituent in the side chain of the polymer.

The polymer component (f) is the same as the polymer component containing a fluorine atom and/or a silicon atom described with respect to the resin (P) above. The content of polymer component (f) is preferably from 3 to 40 parts by weight, more preferably from 5 to 25 parts by weight per 100 parts by weight of the resin (A).

The polymer component (f) may be incorporated into any of the resin (AH) and the resin (AL), when at least two resins (A) having a glass transition point or a softening point different from each other are employed in combination.

The polymer components (f) are preferably present as a block in the resin (A). The resin (A) may be any type of copolymer as far as it contains the fluorine atom and/or silicon atom-containing polymer components (f) as a block. The term "to be contained as a block" means that the resin has a polymer segment comprising at least 70% by weight of the fluorine atom and/or silicon atom-containing polymer component based on the weight of the polymer segment. The forms of blocks include an A-B type block, an A-B-A type block, a B-A-B type block, a grafted type block, and a starlike type block as schematically illustrated with respect to the resin (P) above.

These various types of block copolymers of the thermoplastic resins can be synthesized in accordance with conventionally known polymerization methods. Specifically, those described with respect to the resin (P) above can be employed.

The resin (A) is preferably used at least 70% by weight, more preferably at least 90% by weight based on the total amount of the composition for the transfer layer.

If desired, the transfer layer may contain various additives for improving physical characteristics, such as adhesion, film-forming property, and film strength. For example, rosin, petroleum resin, or silicone oil may be added for controlling adhesion; polybutene, DOP, DBP, low-molecular weight styrene resins, low molecular weight polyethylene wax, microcrystalline wax, or paraffin wax, as a plasticizer or a softening agent for improving wetting property to the light-sensitive element or decreasing melting viscosity; and a polymeric hindered polyvalent phenol, or a triazine derivative, as an antioxidant. For the details, reference can be made to Hiroshi Fukada, *Hot-melt Secchaku no Jissai*, pp. 29 to 107, Kobunshi Kankokai (1983).

The transfer layer may be composed of two or more layers, if desired. In accordance with a preferred embodiment, the transfer layer is composed of a first layer which is in contact with the surface of primary receptor and which comprises a resin having a relatively high glass transition point or softening point, for example, one of the resins (AH) described above, and a second layer provided thereon comprising a resin having a relatively low glass transition point or softening point, for example, one of the resins (AL) described above, and in which the difference in the glass transition point or softening point therebetween is at least 2° C., and preferably at least 5° C. By introducing such a configuration of the transfer layer, transferability of the transfer layer onto a receiving material is remarkably improved, a further enlarged latitude of transfer conditions (e.g., heating temperature, pressure, and transportation speed) can be achieved, and the transfer can be easily performed irrespective of the kind of receiving material. Moreover, a filing property (an anti-sticking property after filing) is improved since the surface of the transfer layer transferred onto a receiving material is composed of the resin having a relatively high glass transition point or softening point, and the retouching property and sealing property similar to those of normal paper may be imparted to the resulting color duplicate by appropriately selecting the thermoplastic resin having a relatively high glass transition point or softening point. In case of the transfer layer of a double-layered structure, the polymer component (f) described above is preferably incorporated into the resin (A) which is used for forming the first layer adjacent to the primary receptor.

The transfer layer suitably has a thickness of from 0.2 to 20 μm, and preferably from 0.5 to 10 μm. When the transfer layer is composed of a plurality of layers, a thickness of a single layer is at least 0.1 μm while the thickness of the total layers is usually at most 20 μm.

According to the method of the present invention, the transfer layer should be formed on a primary receptor until the completion of the process for forming toner image on the electrophotographic light-sensitive element. Although a primary receptor having provided thereon the peelable transfer layer can be used, an embodiment in which the transfer layer is formed on a primary receptor in an apparatus for performing the electrophotographic process is preferred.

According to this embodiment, since the transfer layer is formed each time on the primary receptor, the primary receptor can be repeatedly employed after the transfer layer is released therefrom. Therefore, it is advantageous in that the formation and release of the transfer layer can be performed in sequence with the electrophotographic process in an electrophotographic color image-forming apparatus without throwing the primary receptor away after using it only once. As a result, a cost for the formation of color image can be remarkably reduced.

In order to form the transfer layer in the present invention, conventional layer-forming methods can be employed. For instance, a solution or dispersion containing the composition for the transfer layer is applied onto the surface of primary receptor in a known manner. In particular, for the formation of transfer layer on the surface of primary receptor, a hot-melt coating method, an electrodeposition coating method or a transfer method from a releasable support is preferably used. These methods are preferred in view of easy formation of the transfer layer on the surface of primary receptor in an electrophotographic apparatus. Each of these methods will be described in greater detail below.

The hot-melt coating method comprises hot-melt coating of the composition for the transfer layer by a known method. For such a purpose, a mechanism of a non-solvent type coating machine, for example, a hot-melt coating apparatus for a hot-melt adhesive (hot-melt coater) as described in the above-mentioned *Hot-melt Secchaku no Jissai*, pp. 197 to 215 can be utilized with modification to suit with coating onto the primary receptor. Suitable examples of coating machines include a direct roll coater, an offset gravure roll coater, a rod coater, an extrusion coater, a slot orifice coater, and a curtain coater.

A melting temperature of the resin (A) at coating is usually in a range of from 50° to 180° C., while the optimum temperature is determined depending on the composition of the resin to be used. It is preferred that the resin is first molten using a closed pre-heating device having an automatic temperature controlling means and then heated in a short time to the desired temperature in a position to be coated on the primary receptor. To do so can prevent from degradation of the resin upon thermal oxidation and unevenness in coating.

A coating speed may be varied depending on flowability of the resin at the time of being molten by heating, a kind of coater, and a coating amount, etc., but is suitably in a range of from 1 to 100 mm/sec, preferably from 5 to 40 mm/sec.

Now, the electrodeposition coating method will be described below. According to this method, the resin (A) is electrostatically adhered or electrodeposited (hereinafter simply referred to as electrodeposition sometimes) on the surface of primary receptor in the form of resin grains and then transformed into a uniform thin film, for example, by heating, thereby the transfer layer being formed. Grains of the resins (A), (AH) and (AL) are sometimes referred to as resin grains (AR), (ARH) and (ARL), respectively hereinafter.

The resin grains must have either a positive charge or a negative charge. The electroscopicity of the resin grains is appropriately determined depending on a charging property of the primary receptor to be used in combination.

The resin grains may contain two or more resins, if desired. For instance, when a combination of resins, for example, those selected from the resins (AH) and (AL), whose glass transition points or softening points are different at least 2° C., preferably at least 5° C. from each other is used, improvement in transferability of the transfer layer formed therefrom to a receiving material and an enlarged latitude of transfer conditions can be achieved. In such a case, these resins may be present as a mixture in the grains or may form a layered structure such as a core/shell structure wherein a core part and a shell part are composed of different resins respectively. Resin grains having a core/shell structure wherein the core part is composed of one of the resins (AL) and (AH) and the shell part is composed of the other resin are preferred to form the transfer layer since the transfer onto a receiving material can be rapidly performed under moderate conditions.

An average grain diameter of the resin grains having the physical property described above is generally in a range of from 0.01 to 15 μm, preferably from 0.05 to 5 μm and more preferably from 0.1 to 1 μm. The resin grains may be employed as powder grains (in case of dry type electrodeposition) or grains dispersed in a non-aqueous system (in case of wet type electrodeposition). The resin grains dispersed in a non-aqueous system are preferred since they can easily prepare a thin layer of uniform thickness.

The resin grains used in the present invention can be produced by a conventionally known mechanical powdering method or polymerization granulation method. These methods can be applied to the production of resin grains for both of dry type electrodeposition and wet type electrodeposition.

The mechanical powdering method for producing powder grains used in the dry type electrodeposition method includes a method wherein the resin is directly powdered by a conventionally known pulverizer to form fine grains (for example, a method using a ball mill, a paint shaker or a jet mill). If desired, mixing, melting and kneading of the materials for resin grains before the powdering and classification for a purpose of controlling a grain diameter and after-treatment for treating the surface of grain after the powdering may be performed in an appropriate combination. A spray dry method is also employed.

Specifically, the powder grains can be easily produced by appropriately using a method as described in detail, for example, in Shadanhojin Nippon Funtai Kogyo Gijutsu Kyokai (ed.), *Zoryu Handbook*, II ed., Ohm Sha (1991), Kanagawa Keiei Kaihatsu Center, *Saishin Zoryu Gijutsu no Jissai*, Kanagawa Keiei Kaihatsu Center Shuppan-bu (1984), and Masafumi Arakawa et al (ed.), *Saishin Funtai no Sekkei Gijutsu*, Techno System (1988).

The polymerization granulation methods include conventionally known methods using an emulsion polymerization reaction, a seed polymerization reaction or a suspension polymerization reaction each conducted in an aqueous system, or using a dispersion polymerization reaction conducted in a non-aqueous solvent system.

More specifically, grains are formed according to the methods as described, for example, in Soichi Muroi, *Kobunshi Latex no Kagaku,* Kobunshi Kankokai (1970), Taira Okuda and Hiroshi Inagaki, *Gosei Jushi Emulsion,* Kobunshi Kankokai (1978), Soichi Muroi, *Kobunshi Latex Nyumon,* Kobunsha (1983), I. Pürma and P. C. Wang, *Emulsion Polymerization,* I. Pürma and J. L. Gaudon, *ACS Symp. Sev.,* 24, p. 34 (1974), Fumio Kitahara et al, *Bunsan Nyukakei no Kagaku,* Kogaku Tosho (1979), and Soichi Muroi (supervised), *Chobiryushi Polymer no Saisentan Gijutsu,* C.M.C. (1991), and then collected and pulverized in such a manner as described in the reference literatures cited with respect to the mechanical method above, thereby the resin grains being obtained.

In order to conduct dry type electrodeposition of the fine powder grains thus-obtained, a conventionally known method, for example, a coating method of electrostatic powder and a developing method with a dry type electrostatic developing agent can be employed. More specifically, a method for electrodeposition of fine grains charged by a method utilizing, for example, corona charge, triboelectrification, induction charge, ion flow charge, and inverse ionization phenomenon, as described, for example, in J. F. Hughes, *Seiden Funtai Toso,* translated by Hideo Nagasaka and Machiko Midorikawa, or a developing method, for example, a cascade method, a magnetic brush method, a fur brush method, an electrostatic method, an induction method, a touchdown method and a powder cloud method, as described, for example, in Koich Nakamura (ed.), *Saikin no Denshishashin Genzo System to Toner Zairyo no Kaihatsu.Jitsuyoka,* Ch. 1, Nippon Kogaku Joho (1985) is appropriately employed.

The production of resin grains dispersed in a non-aqueous system which are used in the wet type electrodeposition method can also be performed by any of the mechanical powdering method and polymerization granulation method as described above.

The mechanical powdering method includes a method wherein the thermoplastic resin is dispersed together with a dispersion polymer in a wet type dispersion machine (for example, a ball mill, a paint shaker, Keddy mill, and Dyno-mill), and a method wherein the materials for resin grains and a dispersion assistant polymer (or a covering polymer) have been previously kneaded, the resulting mixture is pulverized and then is dispersed together with a dispersion polymer. Specifically, a method of producing paints or electrostatic developing agents can be utilized as described, for example, in Kenji Ueki (translated), *Toryo no Ryudo to Ganryo Bunsan,* Kyoritsu Shuppan (1971), D. H. Solomon, *The Chemistry of Organic Film Formers,* John Wiley & Sons (1967), *Paint and Surface Coating Theory and Practice,* Yuji Harasaki, *Coating Kogaku,* Asakura Shoten (1971), and Yuji Harasaki, *Coating no Kiso Kagaku,* Maki Shoten (1977).

The polymerization granulation method includes a dispersion polymerization method in a non-aqueous system conventionally known and is specifically described, for example, in *Chobiryushi Polymer no Saisentan Gijutsu,* Ch. 2, mentioned above, *Saikin no Denshishashin Genzo System to Toner Zairyo no Kaihatsu.Jitsuyoka,* Ch. 3, mentioned above, and K. E. J. Barrett, *Dispersion Polymerization in Organic Media,* John Wiley & Sons (1975).

The resin grains composed of a random copolymer containing the polymer component (f) to increase the peelability of the resin (A) can be easily obtained by performing a polymerization reaction using one or more monomers forming the resin (A) which are soluble in an organic solvent but becomes insoluble therein by being polymerized together with a monomer corresponding to the polymer component (f) according to the polymerization granulation method described above.

The resin grains containing the polymer component (f) as a block can be prepared by conducting a polymerization reaction using, as a dispersion stabilizing resins, a block copolymer containing the polymer component (f) as a block, or conducting polymerization reaction using a monofunctional macromonomer having a weight average molecular weight of from $1\times10^3$ to $2\times10^4$, preferably from $3\times10^3$ to $1.5\times10^4$ and containing the polymer component (f) as the main repeating unit together with one or more monomers forming the resin (A). Alternatively, the resin grains composed of block copolymer can be obtained by conducting a polymerization reaction using a polymer initiator (for example, azobis polymer initiator or peroxide polymer initiator) containing the polymer component (f) as the main repeating unit.

The resin grains having a core/shell structure described above can also be prepared easily using the polymerization granulation method. Specifically, fine grains composed of the first resin are prepared by a dispersion polymerization method in a non-aqueous system and then using these fine grains as seeds, a monomer corresponding to the second resin is supplied to conduct polymerization in the same manner as above, whereby resin grains having a core part composed of the first resin and a shell part composed of the second resin are obtained.

As the non-aqueous solvent used in the dispersion polymerization method in a non-aqueous system, there can be used any of organic solvents having a boiling point of at most 200° C., individually or in a combination of two or more thereof. Specific examples of the organic solvent include alcohols such as methanol, ethanol, propanol, butanol, fluorinated alcohols and benzyl alcohol, ketones such as acetone, methyl ethyl ketone, cyclohexanone and diethyl ketone, ethers such as diethyl ether, tetrahydrofuran and dioxane, carboxylic acid esters such as methyl acetate, ethyl acetate, butyl acetate and methyl propionate, aliphatic hydrocarbons containing from 6 to 14 carbon atoms such as hexane, octane, decane, dodecane, tridecane, cyclohexane and cyclooctane, aromatic hydrocarbons such as benzene, toluene, xylene and chlorobenzene, and halogenated hydrocarbons such as methylene chloride, dichloroethane, tetrachloroethane, chloroform, methylchloroform, dichloropropane and trichloroethane. However, the present invention should not be construed as being limited thereto.

When the dispersed resin grains are synthesized by the dispersion polymerization method in a non-aqueous solvent system, the average grain diameter of the dispersed resin grains can readily be adjusted to at most 1 μm while simultaneously obtaining grains of mono-disperse system with a very narrow distribution of grain diameters.

A dispersive medium used for the resin grains dispersed in a non-aqueous system is usually a non-aqueous solvent having an electric resistance of not less than $10^8$ Ω·cm and a dielectric constant of not more than 3.5, since the dispersion is employed in a method wherein the resin grains are electrodeposited utilizing a wet type electrostatic photographic developing process or electrophoresis in electric fields.

The insulating solvents which can be used include straight chain or branched chain aliphatic hydrocarbons, alicyclic hydrocarbons, aromatic hydrocarbons, and halogen-substituted derivatives thereof. Specific examples of the solvent include octane, isooctane, decane, isodecane, decalin, nonane, dodecane, isododecane, cyclohexane, cyclooctane, cyclodecane, benzene, toluene, xylene, mesitylene, Isopar E, Isopar G, Isopar H, Isopar L (Isopar: trade name of Exxon Co.), Shellsol 70, Shellsol 71 (Shellsol: trade name of Shell Oil Co.), Amsco OMS and Amsco 460 Solvent (Amsco: trade name of Americal Mineral Spirits Co.). They may be used singly or as a combination thereof.

The insulating organic solvent described above is preferably employed as a non-aqueous solvent from the beginning of polymerization granulation of resin grains dispersed in the non-aqueous system. However, it is also possible that the granulation is performed in a solvent other than the above-described insulating solvent and then the dispersive medium is substituted with the insulating solvent to prepare the desired dispersion.

Another method for the preparation of a dispersion of resin grains in non-aqueous system is that a block copolymer comprising a polymer portion which is soluble in the above-described non-aqueous solvent having an electric resistance of not less than $10^8$ Ω·cm and a dielectric constant of not more than 3.5 and a polymer portion which is insoluble in the non-aqueous solvent, is dispersed in the non-aqueous solvent by a wet type dispersion method. Specifically, the block copolymer is first synthesized in an organic solvent which dissolves the resulting block copolymer according to the synthesis method of block copolymer as described above and then dispersed in the non-aqueous solvent described above.

In order to electrodeposit dispersed grains in a dispersive medium upon electrophoresis, the grains must be electroscopic grains of positive charge or negative charge. The impartation of electroscopicity to the grains can be performed by appropriately utilizing techniques on developing agents for wet type electrostatic photography. More specifically, it can be carried out using electroscopic materials and other additives as described, for example, in *Saikin no Denshishashin Genzo System to Toner Zairyo no Kaihatsu.Jitsuyoka*, pp. 139 to 148, mentioned above, Denshishashin Gakkai (ed.), *Denshishashin Gijutsu no Kiso to Oyo*, pp. 497 to 505, Corona Sha (1988), and Yuji Harasaki, *Denshishashin*, Vol. 16, No. 2, p. 44 (1977). Further, compounds as described, for example, in British Patents 893,429 and 934,038, U.S. Pat. Nos. 1,122,397, 3,900,412 and 4,606,989, JP-A-60-179751, JP-A-60-185963 and JP-A-2-13965.

The dispersion of resin grains in a non-aqueous system (latex) which can be employed for electrodeposition usually comprises from 0.1 to 20 g of grains mainly containing the resin (A), from 0.01 to 50 g of a dispersion stabilizing resin and if desired, from 0.0001 to 10 g of a charge control agent in one liter of an electrically insulating dispersive medium.

Moreover, the dispersion of resin grains for electrodeposition may contain the compound (S) in order to improve peelability of the transfer layer to be formed therefrom from the surface of primary receptor.

Furthermore, if desired, other additives may be added to maintain the dispersion of resin grains in order to maintain dispersion stability and charging stability of grains. Suitable examples of such additives include rosin, petroleum resins, higher alcohols, polyethers, silicone oil, paraffin wax and triazine derivatives. The total amount of these additives is restricted by the electric resistance of the dispersion. Specifically, if the electric resistance of the dispersion in a state of excluding the grains therefrom becomes lower than $10^8$ Ω·cm, a sufficient amount of the resin grains deposited is reluctant to obtain and, hence, it is necessary to control the amounts of these additives in the range of not lowering the electric resistance than $10^8$ Ω·cm.

The resin grains which are prepared, provided with an electrostatic charge and dispersed in an electrically insulting liquid behave in the same manner as an electrophotographic wet type developing agent. For instance, the resin grains can be subjected to electrophoresis on the surface of primary receptor using a developing device, for example, a slit development electrode device as described in *Denshishashin Gijutsu no Kiso to Oyo*, pp. 275 to 285, mentioned above. Specifically, the grains comprising the resin (A) are supplied between a primary receptor and an electrode placed in face of the primary receptor, and migrate due to electrophoresis according to potential gradient applied from an external power source to adhere to or electrodeposit on the primary receptor, thereby a film being formed.

In general, if the charge of grains is positive, an electric voltage was applied between an electroconductive support of the primary receptor and a development electrode of a developing device from an external power source so that the primary receptor is negatively charged, thereby the grains being electrostatically electrodeposited on the surface of primary receptor.

Electrodeposition of grains can also be performed by wet type toner development in a conventional electrophotographic process. Specifically, the primary receptor is uniformly charged and then subjected to a conventional wet type toner development without exposure to light or after conducting a so-called print-off in which only unnecessary regions are exposed to light, as described in *Denshishashin Gijutsu no Kiso to Oyo*, pp. 46 to 79, mentioned above.

The amount of resin grain adhered to the primary receptor can be appropriately controlled, for example, by an external bias voltage applied, a potential of the primary receptor charged and a developing time.

After the electrodeposition of grains, the developing solution is wiped off upon squeeze using a rubber roller, a gap roller or a reverse roller. Other known methods, for example, corona squeeze and air squeeze can also be employed. Then, the deposit is dried with cool air or warm air or by a infrared lamp preferably to be rendered the resin grains in the form of a film, thereby the transfer layer being formed.

The electrodeposition coating method is particularly preferred since a device used therefor is simple and compact and a uniform layer of a small thickness can be stably and easily prepared.

Now, the formation of transfer layer by the transfer method from a releasable support will be described below. According to this method, the transfer layer provided on a releasable support typically represented by release paper (hereinafter simply referred to as release paper) is transferred onto the surface of primary receptor.

The release paper having the transfer layer thereon is simply supplied to a transfer device in the form of a roll or sheet.

The release paper which can be employed in the present invention include those conventionally known as described, for example, in *Nenchaku (Nensecchaku) no Shin Gijutsu to Sono Yoto.Kakushu Oyoseihin no Kaihatsu Siryo*, published by Keiei Kaihatsu Center Shuppan-bu (May 20, 1978), and *All Paper Guide Shi no Shohin Jiten, Jo Kan, Bunka Sangyo Hen*, published by Shigyo Times Sha (Dec. 1, 1983).

Specifically, the release paper comprises a substrate such as nature Clupak paper laminated with a polyethylene resin, high quality paper pre-coated with a solvent-resistant resin, kraft paper, a PET film having an under-coating or glassine, each having coated thereon a release agent mainly composed of silicone.

A solvent type of silicone is usually employed and a solution thereof having a concentration of from 3 to 7% by weight is coated on the substrate, for example, by a gravure roll, a reverse roll or a wire bar, dried and then subjected to heat treatment at not less than 150° C. to be cured. The coating amount is usually about 1 g/m².

Release paper for tapes, labels, formation industry use and cast coat industry use each manufactured by a paper making company and put on sale are also generally employed. Specific examples thereof include Separate Shi (manufactured by Oji Paper Co., Ltd.), King Rease (manufactured by Shikoku Seishi K.K.), San Release (manufactured by Sanyo Kokusaku Pulp K.K.) and NK High Release (manufactured by Nippon Kako Seishi K.K.).

In order to form the transfer layer on release paper, a composition for the transfer layer mainly composed of the resin (A) is applied to releasing paper in a conventional manner, for example, by bar coating, spin coating or spray coating to form a film. The transfer layer may also be formed on release paper by a hot-melt coating method or an electrodeposition coating method.

Figure 4:
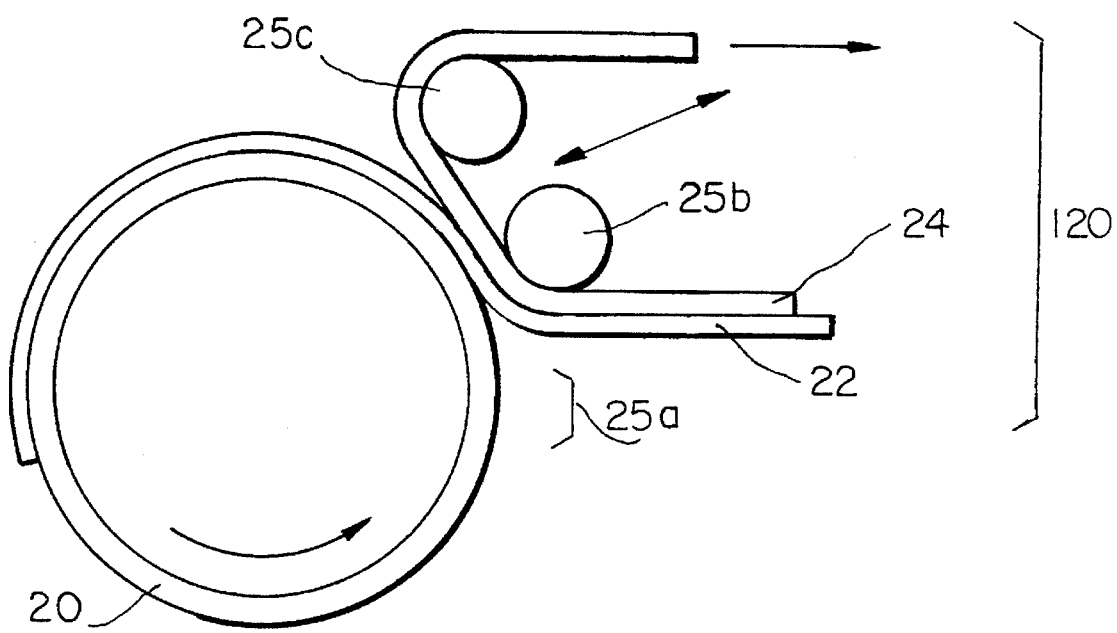
FIG. 4 is a partially schematic view of a device for providing a transfer layer on a primary receptor utilizing release paper.

For a purpose of heat transfer of the transfer layer on release paper to the primary receptor, conventional heat transfer methods are utilized. Specifically, release paper having the transfer layer thereon is pressed on the primary receptor to heat transfer the transfer layer. For instance, a device shown in FIG. 4 is employed for such a purpose. In FIG. 4, release paper 24 having thereon the transfer layer 22 comprising the resin (A) is heat-pressed on the primary receptor by a heating roller 25b, thereby the transfer layer 22 being transferred on the surface of primary receptor 20. The release paper 24 is cooled by a cooling roller 25c and recovered. The primary receptor is heated by a pre-heating means 25a to improve transferability of the transfer layer 22 upon heat-press, if desired.

The conditions for transfer of the transfer layer from release paper to the surface of primary receptor are preferably as follows. A nip pressure of the roller is from 0.1 to 10 kgf/cm² and more preferably from 0.2 to 8 kgf/cm². A temperature at the transfer is from 25° to 100° C. and more preferably from 40° to 80° C. A speed of the transportation is from 0.5 to 100 mm/sec and more preferably from 3 to 50 mm/sec. The speed of transportation may differ from that of the electrophotographic step, that of the transfer of toner image on a transfer layer, or that of the heat transfer step of the transfer layer to a receiving material.

Now, the primary receptor which can be used n the present invention will be described in detail below.

According to the present invention, the toner image formed on the surface of light-sensitive element is transferred onto the transfer layer provided on a primary receptor by an electrostatic transfer method or upon bringing the light-sensitive element into intimate contact with the primary receptor under applying heat and/or pressure and then the transfer layer is released from the primary receptor and transferred together with the toner image onto a receiving material under applying heat and/or pressure thereby forming a color duplicate.

It is important therefore that releasability of the surface of primary receptor is less than releasability of the surface of light-sensitive element but is sufficient for peeling and transferring onto a receiving material. Specifically, the surface of primary receptor has the adhesive strength larger, preferably 10 g.f larger, more preferably 50 g.f larger, than the adhesive strength of the surface of light-sensitive element. On the other hand, the adhesive strength of the surface of primary receptor is preferably at most 250 g.f, more preferably at most 200 g.f.

Any type of primary receptor can be employed. For example, primary receptors of a drum type and an endless belt type which are repeatedly usable are preferred in the present invention. Also, any material can be employed for the primary receptor as far as the conditions described above are fulfilled. In the primary receptor of drum type or endless belt type, an elastic material layer or a stratified structure of an elastic material layer and a reinforcing layer is preferably provided on the surface thereof stationarily or removably so as to be replaced.

Any of conventionally known natural resins and synthetic reins can be used as the elastic material. These resins may be used either individually or as a combination of two or more thereof in a single or plural layer. Specifically, various resins described, for example, in A. D. Roberts, *Natural Rubber Science and Technology,* Oxford Science Publications (1988), W. Hofmann, *Rubber Technology Handbook,* Hanser Publisher (1989) and *Plastic Zairyo Koza,* Vols. 1 to 18, Nikkan Kogyo Shinbunsha can be employed.

Specific examples of the elastic material include styrene-butadiene rubber, butadiene rubber, acrylo-nitrile-butadiene rubber, cyclized rubber, chloroprene rubber, ethylene-propylene rubber, butyl rubber, chloro-sulfonated polyethylene rubber, silicone rubber fluoro-rubber, polysulfide rubber, natural rubber, isoprene rubber and urethane rubber. The desired elastic material can be appropriately selected by taking releasability from the transfer layer, durability, etc. into consideration. The thickness of elastic material layer is preferably from 0.01 to 10 mm.

Examples of materials used in the reinforcing layer for the elastic material layer include cloth, glass fiber, resin-impregnated specialty paper, aluminum and stainless steel. A spongy rubber layer may be provided between the surface elastic material layer and the reinforcing layer.

Conventionally known materials can be used as materials for the primary receptor of endless belt type. For example, those described in U.S. Pat. Nos. 3,893,761, 4,684,238 and 4,690,539 are employed. Further, a layer serving as a heating medium may be provided in the belt as described in JP-W-4-503265 (the term "JP-W" as used herein means an "unexamined published international patent application").

The adhesive strength of the surface of primary receptor can be easily adjusted by applying the method as described with respect to the releasability of the surface of light-sensitive element hereinbefore, including the application of the compound (S). The surface of primary receptor has preferably an average roughness of 0.01 mm or below.

The heat transfer of toner image onto a primary receptor can be performed using known method and apparatus. In order to heat the light-sensitive element, a non-contact type heater such as an infrared line heater, a flash heater or the like is preferably used. The surface temperature of light-sensitive element at the time of heat transfer is preferably in a range of from 40° to 150° C., and more preferably from 50° to 120° C.

The nip pressure of rollers is preferably in a range of from 0.2 to 20 kgf/cm² and more preferably from 0.5 to 15 kgf/cm². The rollers may be pressed by springs provided on opposite ends of the roller shaft or by an air cylinder using compressed air. A speed of the transportation is preferably in a range of from 0.1 to 100 mm/sec and more preferably in a range of from 0.5 to 50 mm/sec. The speed of transportation may differ between the electrophotographic process and the heat transfer step.

The transfer layer bearing the toner image on the primary receptor is then heat-transferred onto a receiving material. The heat-transfer of the toner image together with the transfer layer onto a receiving material can be performed using known methods and apparatus.

The receiving material used in the present invention is not particularly limited and any material conventionally known can be employed. Suitable examples of the receiving materials include those of reflective type, for example, natural paper such as high quality paper, coated paper or art paper, synthetic paper, a metal plate such as an aluminum, iron or SUS plate, and those of transmittive type, for example, a plastic film such as a polyester, polyolefin, polyvinyl chloride or polyacetate film.

Preferred ranges of temperature, nip pressure and transportation speed for the heat-transfer of transfer layer onto the receiving material are same as those described for the heat transfer step of toner image to the primary receptor respectively. Further, the conditions of transfer onto the receiving material may be the same as or different from those of transfer of toner image to the primary receptor.

The heat-transfer behavior of transfer layer onto the receiving material is considered as follows. Specifically, when the transfer layer softened to a certain extent, for example, by a pre-heating means is further heated, for example, a heating roller, the tackiness of the transfer layer increases and the transfer layer is closely adhered to the receiving material.

After the transfer layer is passed under a roller for release, for example, a cooling roller, the temperature of the transfer layer is decreased to reduce the flowability and the tackiness and thus the transfer layer is peeled as a film from the surface of the primary receptor together with the toner thereon. Accordingly, the transfer conditions should be set so as to realize such a situation.

The cooling roller comprises a metal roller which has a good thermal conductivity such as aluminum, copper or the like and is covered with silicone rubber. It is preferred that the cooling roller is provided with a cooling means therein or on a portion of the outer surface which is not brought into contact with the receiving material in order to radiate heat. The cooling means includes a cooling fan, a coolant circulation or a thermoelectric cooling element, and it is preferred that the cooling means is coupled with a temperature controller so that the temperature of the cooling roller is maintained within a predetermined range.

In the method of the present invention, the transfer of toner image from the light-sensitive element to the primary receptor and the transfer of toner image together with the transfer layer from the primary receptor to the receiving material may be simultaneously performed within one sheet. Alternatively, after the transfer of all of one sheet from the light-sensitive element to the primary receptor is completed, the image is transferred to the receiving material.

According to the present invention, the toner image transferred on the receiving material is covered with the transfer layer, and hence the toner image is protected from being scratched or stained.

Further, by stopping the apparatus in the stage where the transfer layer has been formed on the primary receptor, the next operation can start with the electrophotographic process.

It is needless to say that the above-described conditions for the transfer of toner image or transfer layer should be optimized depending on the physical properties of the light-sensitive element (i.e., the light-sensitive layer and the support), the primary receptor, the transfer layer, and the receiving material. Especially it is important to determine the conditions of temperature, in the heat transfer step taking into account the factors such as glass transition point, softening temperature, flowability, tackiness, film properties and film thickness of the transfer layer.

Now, the method of forming a color image using an electrophotographic process according to the present invention will be described with reference to the accompanying drawings hereinbelow.

Figure 2:
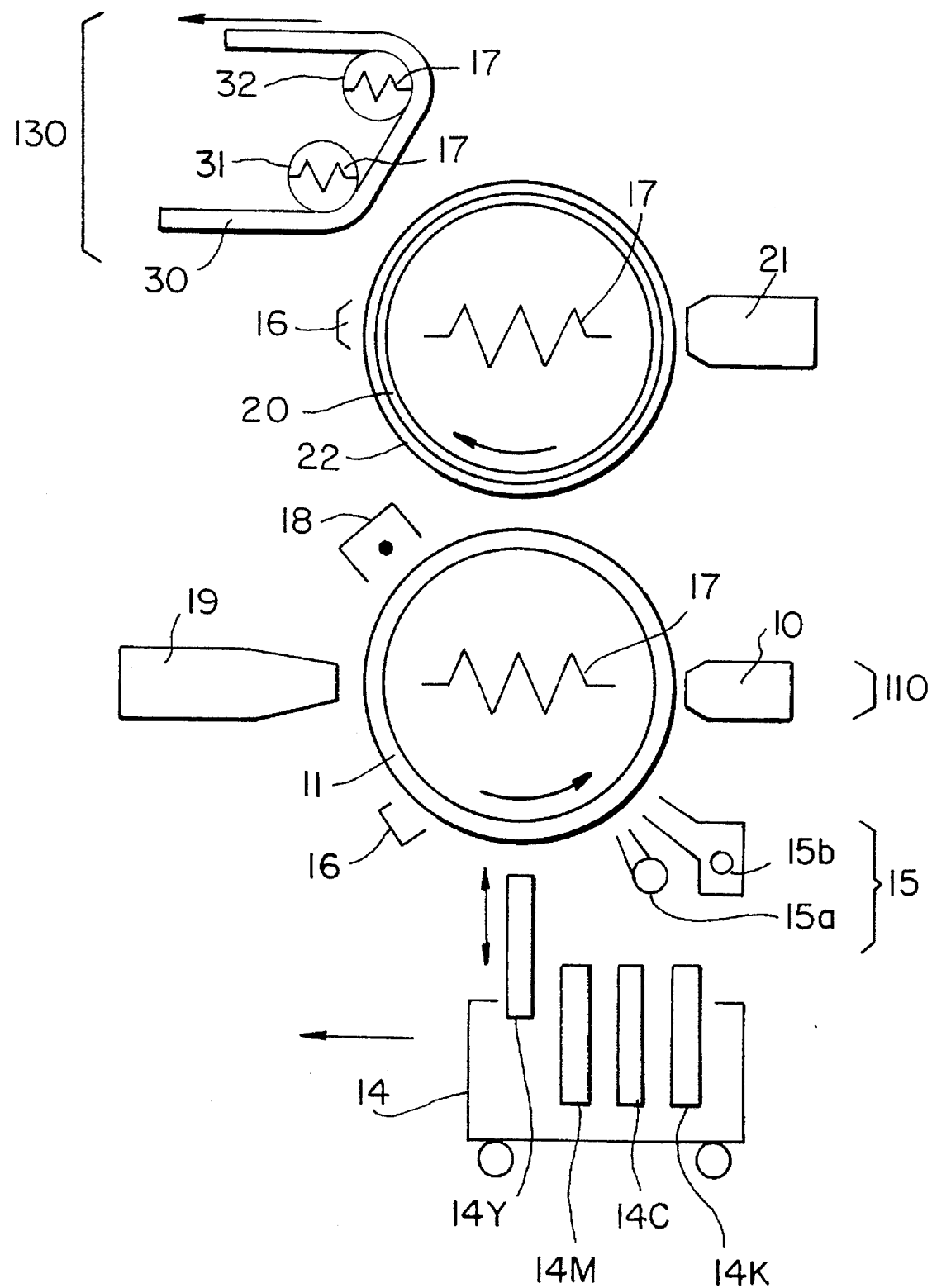
FIG. 2 is a schematic view of an apparatus for performing the method according to the present invention in which a primary receptor of a drum type is used.

FIG. 2 is a schematic view of an apparatus for forming a color image suitable for conducting the method according to the present invention wherein a primary receptor of a drum type is employed.

As described above, when an electrophotographic light-sensitive element 11 whose surface has been modified to have releasability, a toner image 3 is formed on the light-sensitive element 11 by a conventional electrophotographic process. On the other hand, when releasability of the surface of light-sensitive element 11 is insufficient, the compound (S) is applied to the surface of light-sensitive element before the start of electrophotographic process thereby the desired releasability being imparted to the surface of light-sensitive element 11. Specifically, the compound (S) is supplied from an applying device for compound (S) 10 which utilizes any one of the embodiments as described above onto the surface of light-sensitive element 11. The applying device for compound (S) 10 may be stationary or movable.

The light-sensitive element whose surface has the releasability is then subjected to the electrophotographic process. In this example, a wet type developing method is employed.

The light-sensitive element is uniformly charged to, for instance, a positive polarity by a corona charger 18 and then is exposed imagewise by an exposure device (e.g., a semiconductor laser) 19 on the basis of yellow image information, whereby the potential is lowered in the exposed regions and thus, a contrast in potential is formed between the exposed regions and the unexposed regions. A yellow liquid developing unit 14Y containing a liquid developer comprising yellow pigment particles having a positive electrostatic charge dispersed in an electrically insulating liquid is brought near the surface of a light-sensitive element 11 from a liquid developing unit 14 and is kept stationary with a gap of 1 mm therebetween.

The light-sensitive element 11 is first prebathed by a pre-bathing means provided in the developing unit, and then the yellow liquid developer is supplied on the surface of the light-sensitive element while applying a developing bias voltage between the light-sensitive element and a development electrode by a bias voltage source and wiring (not shown). The bias voltage is applied so that it is slightly lower than the surface potential of the unexposed regions, while the development electrode is charged to positive and the light-sensitive element is charged to negative. When the bias voltage applied is too low, a sufficient density of the toner image cannot be obtained.

The liquid developer is subsequently washed off by a rinsing means provided in the developing unit and the rinse solution adhering to the surface of the light-sensitive element is removed by a squeeze means. Then, the light-sensitive element is dried by passing under the suction/exhaust unit 15 comprising a suction part 15a and a exhaust part 15b. The above described electrophotographic process is repeated with respect to each image information of magenta, cyan and black using a magenta liquid developing unit 14M, a cyan liquid developing unit 14C, and a black liquid developing unit, respectively. Meanwhile a primary receptor 20 is kept away from the surface of the light-sensitive element.

On the other hand, a transfer layer 22 is formed on the primary receptor 20 by a transfer layer-forming device 21 before the end of the formation of toner image on the light-sensitive element 11 by the electrophotographic process. In this example, the transfer layer is formed by the electrodeposition coating method. On electrodeposition unit containing a dispersion of resin grains is first brought near the surface of primary receptor 20 and is kept stationary with a gap of 1 mm between the surface thereof and a development electrode. The primary receptor 20 is rotated while supplying the dispersion of resin grains into the gap and applying an electric voltage across the gap from an external power source (not shown), whereby the grains are deposited over the entire areas of the surface of the primary receptor 20.

The dispersion of resin grains excessively adhered to the surface of the primary receptor 20 is removed by a squeezing device built in the electrodeposition unit, and the primary receptor. Then the resin grains are fused by a heating means and thus a transfer layer 22 in the form of resin film is obtained.

In order to conduct the exhaustion of solvent in the dispersion, the suction/exhaust unit 15 provided for the electrophotographic light-sensitive element may be used together by arranging it in an appropriate position. Alternatively, a suction/exhaust unit similar to the unit 15 is independently provided for the primary receptor. As the pre-bathing solution and the rinse solution, a carrier liquid for the liquid developer is generally used.

After the four color images are formed on the light-sensitive element 11, the light-sensitive element is pre-heated in the desired range of temperature by a pre-heating means 16 and a temperature controller 17, the transfer layer 22 on primary receptor 20 is also pre-heated in the desired range of temperature if desired, and then the toner image 3 is brought into close contact with the transfer layer 22 on the primary receptor, whereby the toner image 3 is heat-transferred to the transfer layer on the primary receptor.

The toner image 3 transferred on the primary receptor is then heat-transferred onto a receiving material 30, for example, coated paper together with the transfer layer 22. Specifically, the primary receptor is pre-heated in the desired range of temperature by a pre-heating means 16, the receiving material 30 is also pre-heated in the desired range of temperature by a back-up roller for transfer 31, the primary receptor 20 bearing the toner image 3 is brought into close contact with the receiving material 30 and then the receiving material is cooled by a back-up roller for release 32, thereby heat-transferring the toner image 3 to the receiving material 30 together with the transfer layer 22. Thus a cycle of steps is terminated.

Figure 3:
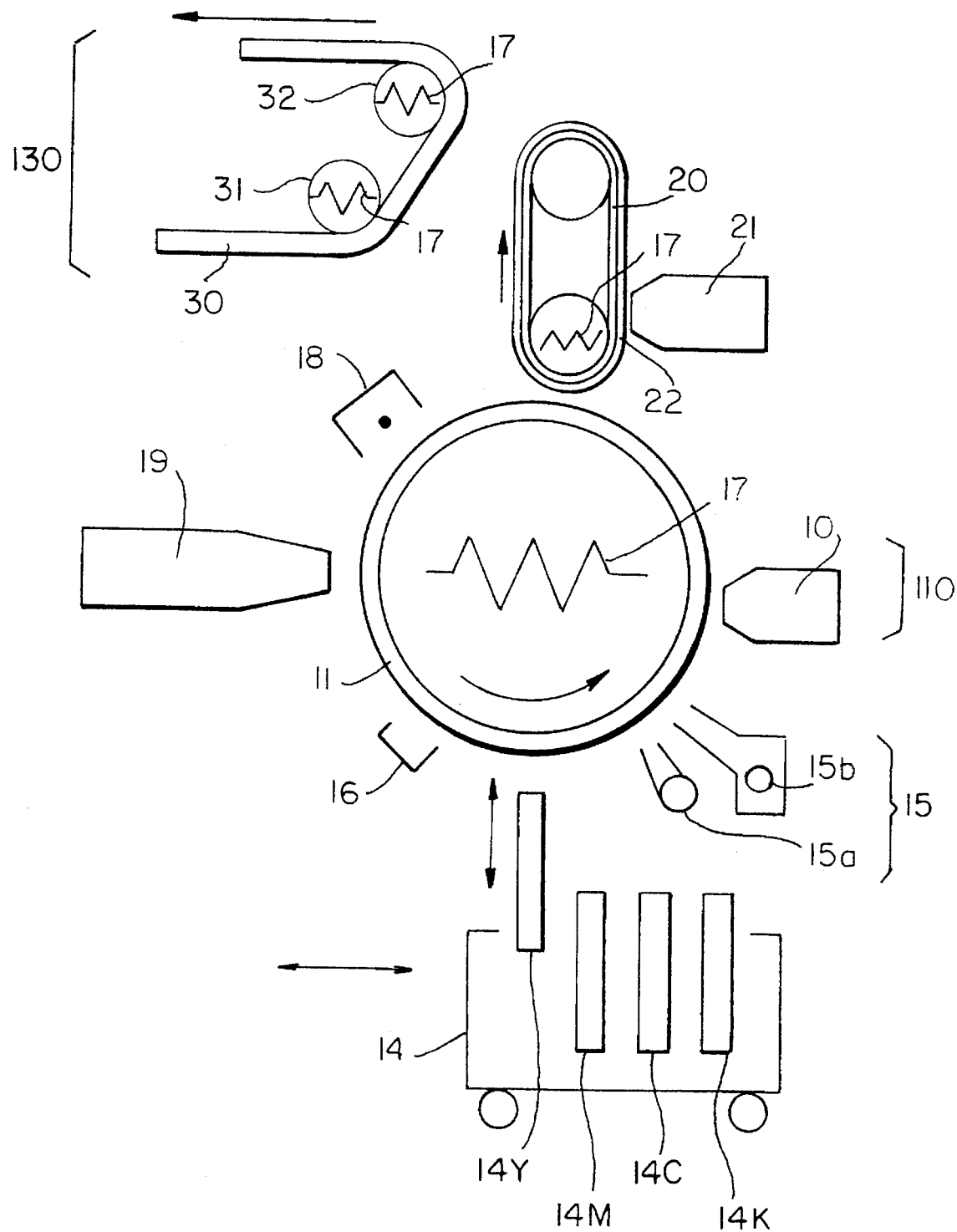
FIG. 3 is a schematic view of an apparatus for performing the method according to the present invention in which a primary receptor of an endless belt type is used.

FIG. 3 is a schematic view of another example of apparatus for forming a color image according to the present invention wherein a primary receptor of an endless belt type is employed. In the apparatus of FIG. 3, its construction is essentially the same as that of the apparatus shown in FIG. 2 except for the primary receptor.

Further, in order to form the transfer layer on the primary receptor, a device utilizing the hot-melt coating method or a device utilizing the transfer method from a release support can be used in place of the transfer layer-forming device 21 described above utilizing the electrodeposition coating method.

In case of using the hot-melt coating method, thermoplastic resin is coated on the surface of a primary receptor provided on the peripheral surface of a drum by a hot-melt coater and is caused to pass under a suction/exhaust unit to be cooled to a predetermined temperature to form a transfer layer. Thereafter, the hot-melt coater is moved to the stand-by position.

A device for simply forming the transfer layer on the primary receptor using release paper is schematically shown in FIG. 4.

A transfer layer-forming portion 120 in FIG. 4, is first employed to transfer a transfer layer 22 from release paper 24 to a primary receptor 20 and then used for transfer of the transfer layer to a receiving material 30 by replacing the transfer portion 130 shown in FIG. 2 or 3 with the transfer layer-forming position 120. Alternatively, both the transfer layer-forming portion 120 for transfer the transfer layer 22 from release paper 24 to the primary receptor 20 and the transfer portion 130 for transfer the transfer layer bearing the toner image 3 to the receiving material 30 are installed in the apparatus for forming a color image according to the present invention.

In accordance with the present invention, color images of high accuracy and high quality can be obtained in a simple manner by conducting toner development to form a toner image on an electrophotographic light-sensitive element whose surface has the releasability, transferring the toner image onto a transfer layer provided on a primary receptor, and then transferring the transfer layer bearing the toner image onto a receiving material. A color duplicate obtained is excellent in storage stability.

Further, when a step of forming a transfer layer on a primary receptor is performed in an apparatus which conducts a step of electrophotographic process and a step of heat-transfer on a receiving material, the primary receptor is repeatedly usable, thereby reducing a running cost.

Moreover, a conventional electrophotographic light-sensitive element can be employed in the method of the present invention by imparting the desired releasability on the surface thereof using the compound (S).

The present invention is illustrated in greater detail with reference to the following examples, but the present invention is not to be construed as being limited thereto.

Synthesis Examples of Resin Grain (AR) for Transfer Layer:

SYNTHESIS EXAMPLE 1 OF THERMOPLASTIC RESIN GRAIN (ARH):
(ARH-1)

A mixed solution of 10 g of Dispersion Stabilizing Resin (Q-1) having the structure shown below, 100 g of vinyl acetate, and 384 g of Isopar H was heated to a temperature of 70° C. under nitrogen gas stream while stirring. To the solution was added 0.8 g of 2,2'-azobis(isovaleronitrile) (abbreviated as AIVN) as a polymerization initiator, followed by reacting for 3 hours. Twenty minutes after the addition of the polymerization initiator, the reaction mixture became white turbid, and the reaction temperature rose to 88° C. Then, 0.5 g of the above-described initiator was added to the reaction mixture, the reaction were carried out for 2 hours. The temperature was raised to 100° C. and stirred for 2 hours to remove the unreacted vinyl acetate by distillation. After cooling, the reaction mixture was passed through a nylon cloth of 200 mesh to obtain a white dispersion which was a latex of good monodispersity with a polymerization ratio of 90% and an average grain diameter of 0.23 µm. The grain diameter was measured by CAPA-500 manufactured by Horiba Ltd. (hereinafter the same).

A part of the white dispersion was centrifuged at a rotation of $1\times10^4$ r.p.m. for 60 minutes and the resin grains precipitated were collected and dried. A weight average molecular weight (Mw) of the resin grain measured by a GPC method and calculated in terms of polystyrene (hereinafter the same) was $2\times10^5$. A glass transition point (Tg) thereof was 38° C.

Dispersion Stabilizing Resin (Q-1)

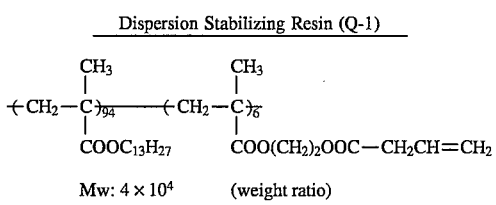

Mw: $4 \times 10^4$ (weight ratio)

added 0.8 g of ACPP, followed by reacting for 2 hours. Then, 0.8 g of AIVN was added thereto and the temperature was adjusted to 80° C., and the reaction was continued for 2 hours. To the reaction mixture was further added 0.5 g of AIVN, followed by reacting for 2 hours. Then, the temperature was raised to 100° C., and the unreacted monomers were distilled off under a reduced pressure of 10 to 20 mm Hg. After cooling, the reaction mixture was passed through a nylon cloth of 200 mesh to obtain a white dispersion which was a latex of good monodispersity with a polymerization ratio of 90% and an average grain diameter of 0.17 μm. An Mw of the resin grain was $1\times10^5$ and a Tg thereof was 55° C.

Dispersion Stabilizing Resin (Q-3)

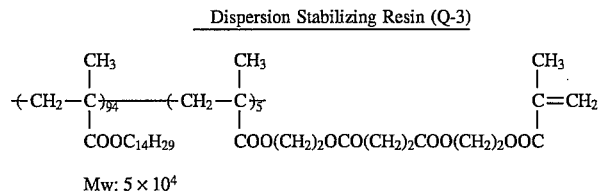

Mw: $5 \times 10^4$

SYNTHESIS EXAMPLE 2 OF THERMOPLASTIC RESIN GRAIN (ARH): (ARH-2)

A mixed solution of 15 g of Dispersion Stabilizing Resin (Q-2) having the structure shown below, 75 g of benzyl methacrylate, 25 g of methyl acrylate, 1.3 g of methyl 3-mercaptopropionate and 552 g of Isopar H was heated to a temperature of 50° C. under nitrogen gas stream while stirring. To the solution was added 1 g of 2,2'-azobis(2-cyclopropylpropionitrile) (abbreviated as ACPP) as a polymerization initiator, followed by reacting for 2 hours. To the reaction mixture was added 0.8 g of ACPP, followed by reacting for 2 hours. Further, 0.8 g of AIVN was added thereto and the reaction temperature was adjusted to 75° C., and the reaction was continued for 3 hours. Then, the temperature was raised to 90° C., and the unreacted monomers were distilled off under a reduced pressure of 20 to 30 mm Hg. After cooling the reaction mixture was passed through a nylon cloth of 200 mesh to obtain a white dispersion which was a latex of good monodispersity with a polymerization ratio of 98% and an average grain diameter of 0.20 μm. An Mw of the resin grain was $2.8\times10^4$ and a Tg thereof was 55° C.

SYNTHESIS EXAMPLE 4 OF THERMOPLASTIC RESIN GRAIN (ARH): (ARH-4)

A mixed solution of 14 g of Dispersion Stabilizing Resin (Q-4) having the structure shown below, 10 g of a monofunctional macromonomer of dimethylsiloxane (Macromonomer (M-1)) (FM-0725 manufactured of Chisso Corp.; a weight average molecular weight (Mw): $1\times10^4$) and 553 g of Isopar H was heated to a temperature of 50° C. under nitrogen gas stream while stirring. To the solution was added dropwise a mixture of 70 g of methyl methacrylate, 20 g of ethyl acrylate, 1.3 g of methyl 3-mercaptopropionate and 1.0 g of ACPP over a period of 30 minutes, followed by reacting for 1.5 hours. To the reaction mixture was further added 0.8 g of ACPP, followed by reacting for 2 hours. Then, 0.8 g of AIVN was added thereto and the temperature was adjusted to 80° C., and the reaction was continued for 2 hours. To the reaction mixture was further added 0.5 g of ACPP, followed by reacting for 2 hours. After cooling, the reaction mixture was passed through a nylon cloth of 200 mesh to obtain a white dispersion which was a latex of good monodispersity with a polymerization ratio of 99% and an average grain diameter of 0.15 μm. An Mw of the resin grain was $3\times10^4$ and a Tg thereof was 50° C.

Dispersion Stabilizing Resin (Q-2)

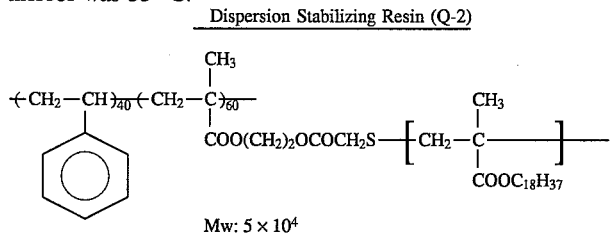

Mw: $5 \times 10^4$

SYNTHESIS EXAMPLE 3 OF THERMOPLASTIC RESIN GRAIN (ARH): (ARH-3)

A mixed solution of 14 g of Dispersion Stabilizing Resin (Q-3) having the structure shown below and 382 g of Isopar G was heated to a temperature of 50° C. under nitrogen gas stream while stirring. To the solution was added dropwise a mixture of 80 g of benzyl methacrylate, 20 g of vinyl toluene and 0.8 g of ACPP over a period of one hour, followed by reacting for one hour. To the reaction mixture was further Dispersion Stabilizing Resin (Q-4)

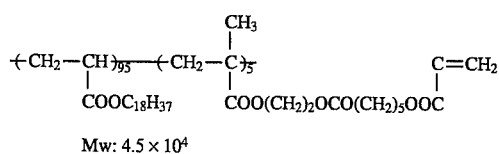

Mw: $4.5 \times 10^4$

SYNTHESIS EXAMPLES 5 TO 9 OF THERMOPLASTIC RESIN GRAIN (ARH): (ARH-5)

Each of the thermoplastic resin grains (ARH-5) to (ARH-9) was synthesized in the same manner as in Synthesis Examples 4 of Thermoplastic Resin Grain (ARH) except for using each of the macromonomers (Mw thereof being in a range of from $8 \times 10^3$ to $1 \times 10^4$) shown in Table B below in place of 10 g of Macromonomer (M-1). A polymerization ratio of each of the resin grains was in a range of from 98 to 99% and an average grain diameter thereof was in a range of from 0.15 to 0.25 μm with good monodispersity. An Mw of each of the resin grains was in a range of from $2.5 \times 10^4$ to $4 \times 10^4$ and a Tg thereof was in a range of from 40° C. to 70° C.

SYNTHESIS EXAMPLE 10 OF THERMOPLASTIC RESIN GRAIN (ARH): (ARH-10)

A mixture of 5 g of coarse powder of a styrene-butadiene copolymer (48/52 ratio by weight) (Sorprene 303 manufactured by Asahi Kasei Kogyo Kabushiki Kaisha) having a softening point of 45° C. pulverized by a trio-blender, 4 g of a dispersion stabilizing resin (Sorprene 1205 manufactured by Asahi Kasei Kogyo Kabushiki Kaisha) and 51 g of Isopar H was dispersed in a paint shaker (manufactured by Toyo Seiki Seisakusho Co.) with glass beads having a diameter of about 4 mm for 20 minutes. The resulting pre-dispersion was subjected to a wet type dispersion process using Dyno-mill KDL (manufactured by Sinmaru Enterprises Co., Ltd.) with glass beads having a diameter of from 0.75 to 1 mm at a rotation of 4500 r.p.m. for 6 hours, and then passed through a nylon cloth of 200 mesh to obtain a white dispersion which was a latex having an average grain diameter of 0.4 μm.

SYNTHESIS EXAMPLES 11 TO 16 OF THERMOPLASTIC RESIN GRAIN (ARH): (ARH-11) TO (ARH-16)

Each dispersion was prepared according to a wet type dispersion process in the same manner as in Synthesis

TABLE B

| Synthesis Example of Thermoplastic Resin Grain (ARH) | Thermoplastic Resin Grain (ARH) | Macromonomer |
|---|---|---|
| 5 | ARH-5 | M-2: $CH_2=C(CH_3)COO(CH_2)_2OCOCH_2S\text{-}[C(CH_3)(COOCH_2CF_2CF_2H)]\text{-}$ |
| 6 | ARH-6 | M-3: $CH_2=CH\text{-}COO(CH_2)_2OCO(CH_2)_2S\text{-}[CH_2C(COO(CH_2)_3Si(CH_3)(OSi(CH_3)_3)_2)]\text{-}$ |
| 7 | ARH-7 | M-4: $CH_2=C(CH_3)COO(CH_2)_2S\text{-}[CH_2C(CH_3)(COO(CH_2)_2C_8F_{17})]\text{-}$ |
| 8 | ARH-8 | M-5: $CH_2=C(CH_3)COO(CH_2)_2NHCOO(CH_2)_2S\text{-}[CH_2C(CH_2C_2F_5)(COO(CH_2)_3Si(CH_3)_2)]\text{-}$ |
| 9 | ARH-9 | M-6: $CH_2=C(CH_3)COO(CH_2)_2NH\text{-}[CH_2CH_2N(CO-C_7F_{15})]\text{-}CH_3$ |

Example 10 of Thermoplastic Resin Grain (ARH) except for using each of the compounds shown in Table C below in place of Sorprene 303 as resin (A). An average grain diameter of each of the white dispersion obtained was in a range of from 0.3 to 0.6 μm. A softening point of each of the resin grains was in a range of from 40° C. to 100° C.

of the resin grain was $3 \times 10^4$ and a Tg thereof was 18° C.

TABLE C

| Synthesis Example of Thermoplastic Resin Grain (ARH) | Thermoplastic Resin Grain (ARH) | Resin (A) |
| --- | --- | --- |
| 11 | ARH-11 | Ethylene/methacrylic acid copolymer (96.4:3.6 by molar ratio) (Nimacrel N-699 manufactured by Du Pont-Mitsui Polychemicals Co., Ltd.) |
| 12 | ARH-12 | Ethylene/vinyl acetate copolymer (Evaflex 420 manufactured by Du Pont-Mitsui Polychemicals Co., Ltd.) |
| 13 | ARH-13 | Ethylene/ethyl acrylate copolymer (Evaflex-EEA, A-703 manufactured by Du Pont-Mitsui Polychemicals Co., Ltd.) |
| 14 | ARH-14 | Ethylene/vinyl acetate copolymer (Flvax, manufactured by E. I. du pont de Nemous and Co.) |
| 15 | ARH-15 | Cellulose acetate butyrate (Cellidor Bsp. manufactured by Bayer AG) |
| 16 | ARH-16 | Polyvinyl butyral resin (S-Lec manufactured by Sekisui Chemical Co., Ltd.) |

SYNTHESIS EXAMPLE 1 OF THERMOPLASTIC RESIN GRAIN (ARL): (ARL-1)

A mixed solution of 12 g of Dispersion Stabilizing Resin (Q-1) described above, 70 g of vinyl acetate, 30 g of vinyl butyrate and 388 g of Isopar H was heated to a temperature of 80° C. under nitrogen gas stream while stirring. To the solution was added 1.5 g of 2,2'-azobisisobutyronitrile (abbreviated as AIBN) as a polymerization initiator, followed by reacting for 2 hours. Then, 0.8 g of AIBN was added to the reaction mixture, the reaction was carried out for 2 hours and 0.8 g of AIBN was further added thereto, followed by reacting for 2 hours. After cooling, the reaction mixture was passed through a nylon cloth of 200 mesh to obtain a white dispersion which was a latex of good monodispersity having a polymerization ratio of 93% and an average grain diameter of 0.18 μm. An Mw of the resin grain was $8 \times 10^4$ and a Tg thereof was 18° C.

SYNTHESIS EXAMPLE 2 OF THERMOPLASTIC RESIN GRAIN (ARL): (ARL-2)

A mixed solution of 18 g of Dispersion Stabilizing Resin (Q-3) described above and 549 g of Isopar H was heated to a temperature of 55° C. under nitrogen gas stream with stirring. To the mixture was added dropwise a mixture of 70 g of benzyl methacrylate, 30 g of methyl acrylate, 2.6 g of methyl 3-mercaptopropionate and 1.0 g of AIVN over a period of one hour, followed by further reacting for one hour. Then 0.8 g of AIVN was added to the reaction mixture, the temperature thereof was raised to 75° C. and the reaction was conducted for 2 hours. Further, 0.8 g of AIVN was added thereto, followed by reacting for 3 hours. After cooling, the reaction mixture was passed through a nylon cloth of 200 mesh to obtain a white dispersion which was a latex of good monodispersity having a polymerization ratio of 98% and an average grain diameter of 0.18 μm. An Mw

SYNTHESIS EXAMPLES 3 TO 12 OF THERMOPLASTIC RESIN GRAIN (ARL): (ARL-3) TO (ARL-12)

Each of the thermoplastic resin grains (ARL) was synthesized in the same manner as in Synthesis Example 2 of Thermoplastic Resin Grain (ARL) except for using each of the monomers shown in Table D below in place of 70 g of benzyl methacrylate and 30 g of methyl acrylate. A polymerization ratio of each of the white dispersions obtained was in a range of from 90 to 99% and an average grain diameter thereof was in a range of from 0.13 to 0.20 μm with good monodispersity. A Tg of each of the resin grains was in a range of from 10° C. to 25° C.

TABLE D

| Synthesis Example of Thermoplastic Resin Grain (ARL) | Thermoplastic Resin Grain (ARL) | Monomer | |
| --- | --- | --- | --- |
| 3 | ARL-3 | Phenetyl methacrylate | 70 g |
| | | Methyl acrylate | 30 g |
| 4 | ARL-4 | 3-Phenylpropyl methacrylate | 80 g |
| | | Ethyl acrylate | 20 g |
| 5 | ARL-5 | Methyl methacrylate | 60 g |
| | | 2-Methoxyethyl methacrylate | 40 g |
| 6 | ARL-6 | Vinyl toluene | 20 g |
| | | 2-Ethylhexyl methacrylate | 15 g |
| | | Methyl methacrylate | 65 g |
| 7 | ARL-7 | Vinyl acetate | 70 g |
| | | Vinyl valerate | 30 g |
| 8 | ARL-8 | Methyl methacrylate | 60 g |
| | | Butyl methacrylate | 20 g |
| | | 2,3-Dipropoxypropyl methacrylate | 20 g |
| 9 | ARL-9 | Methyl methacrylate | 65 g |
| | | Ethyl methacrylate | 30 g |
| | | Macromonomer (M-1) | 5 g |
| 10 | ARL-10 | Benzyl methacrylate | 60 g |

TABLE D-continued

| Synthesis Example of Thermoplastic Resin Grain (ARL) | Thermoplastic Resin Grain (ARL) | Monomer | |
|---|---|---|---|
| 11 | ARL-11 | Benzyl acrylate | 30 g |
| | | Macromonomer (M-3) | 10 g |
| | | Benzyl methacrylate | 70 g |
| | | Ethylene glycol monomethyl ether | 25 g |
| 12 | ARL-12 | Macromonomer (M-4) | 5 g |
| | | 2-Phenyl-2-methylethyl methacrylate | 75 g |
| | | Methyl acrylate | 25 g |

SYNTHESIS EXAMPLE 1 OF RESIN GRAIN (AR): (AR-1)

A mixed solution of 12 g of Dispersion Stabilizing Resin (Q-1) described above, 70 g of vinyl acetate, 30 g of vinyl butyrate and 388 g of Isopar H was heated to a temperature of 80° C. under nitrogen gas stream while stirring. To the solution was added 1.5 g of AIBN as a polymerization initiator, followed by reacting for 2 hours. Then, 0.8 g of AIBN was added to the reaction mixture, the reaction was carried out for 2 hours and 0.8 g of AIBN was further added thereto, followed by reacting for 2 hours. After cooling, the reaction mixture was passed through a nylon cloth of 200 mesh to obtain a white dispersion which was a latex of good monodispersity having a polymerization ratio of 93% and an average grain diameter of 0.18 μm. An Mw of the resin grain was $8 \times 10^4$ and a Tg thereof was 18° C.

A mixture of the whole amount of the resin dispersion (as seed) and 10 g of Dispersion Stabilizing Resin (Q-5) having the structure shown below was heated to a temperature of 60° C. under nitrogen gas stream with stirring. To the mixture was added dropwise a mixture of 10 g of Macromonomer (M-1) described above, 50 g of methyl methacrylate, 40 g of methyl acrylate, 2.0 g of methyl 3-mercaptopropionate, 0.8 g of AIVN and 400 g Isopar H over a period of 2 hours, followed by further reacting for 2 hours. Then 0.8 g of AIVN was added to the reaction mixture, the temperature thereof was raised to 70° C., and the reaction was conducted for 2 hours. Further, 0.6 g of AIVN was added thereto, followed by reacting for 3 hours. After cooling, the reaction mixture was passed through a nylon cloth of 200 mesh to obtain a white dispersion which was a latex of good monodispersity having a polymerization ratio of 98% and an average grain diameter of 0.25 μm. The resin grain thus-obtained had a core/shell structure comprising the resin of a relatively low glass transition point forming a core portion and the resin of a relatively high glass transition point forming a shell portion.

Dispersion Stabilizing Resin (Q-5)

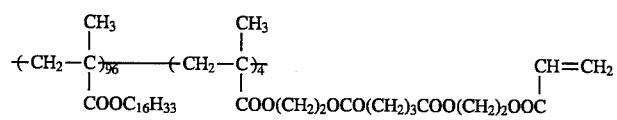

Mw: $4 \times 10^4$

SYNTHESIS EXAMPLE 1 OF RESIN (P): (P-1)

A mixed solution of 80 g of methyl methacrylate, 20 g of a dimethylsiloxane macromonomer (FM-0725 manufactured by Chisso Corp.; Mw: $1 \times 10^4$), and 200 g of toluene was heated to a temperature of 75° C. under nitrogen gas stream. To the solution was added 1.0 g of AIBN, followed by reacting for 4 hours. To the mixture was further added 0.7 g of AIBN, and the reaction was continued for 4 hours. An Mw of the copolymer thus-obtained was $5.8 \times 10^4$.

Resin (P-1)

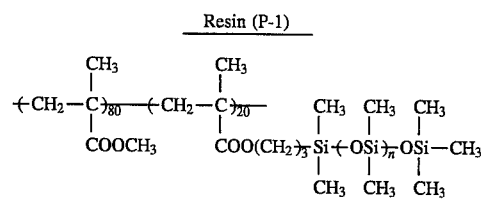

SYNTHESIS EXAMPLES 2 TO 9 OF RESIN (P): (P-2) TO (P-9)

Each of copolymers was synthesized in the same manner as in Synthesis Example 1 of Resin (P), except for replacing methyl methacrylate and the macromonomer (FM-0725) with each monomer corresponding to the polymer component shown in Table E below. An Mw of each of the resulting polymers was in a range of from $4.5 \times 10^4$ to $6 \times 10^4$.

Synthesis Examples of Resin (P):

TABLE E $$+CH_2-C\underset{\underset{COOR}{|}}{\overset{\overset{CH_3}{|}}{|}}+_a+Y+_y+CH_2-C\underset{\underset{W+Z+}{|}}{\overset{\overset{b}{|}}{|}}_z$$

| Synthesis Example of Resin (P) | Resin (P) | —R— | —Y— | —b— | —W— | —Z— | x/y/z (weight ratio) |
|---|---|---|---|---|---|---|---|
| 2 | P-2 | —C$_2$H$_5$ | —CH$_2$—C(CH$_3$)(COOCH$_2$CHCH$_2$O)— | —CH$_3$ | —COO(CH$_2$)$_2$S— | —CH$_2$—C(CH$_3$)(COO(CH$_2$)$_2$C$_8$F$_{17}$)— | 65/15/20 |
| 3 | P-3 | —CH$_3$ | —CH$_2$—CH(COOCH$_3$)— | —H | COO(CH$_2$)$_2$OCO—(CH$_2$)$_2$S— | —CH$_2$—C(CH$_3$)(COOCH$_2$CF$_2$CFHCF$_3$)— | 60/10/30 |
| 4 | P-4 | —CH$_3$ | —CH$_2$—C(CH$_3$)(COOCH$_2$CHCH$_2$OH)— | —CH$_3$ | —COOCH$_2$CHCH$_2$—OOC(CH$_2$)$_2$S— (OH) | —CH$_2$—C(CH$_3$)(COO(CH$_2$)$_3$Si—(OSi(CH$_3$)$_3$)$_3$)— | 65/10/25 |
| 5 | P-5 | —C$_3$H$_7$ | —CH$_2$—C(CH$_3$)(COO(CH$_2$)$_2$NHCOOCH(CF$_3$)$_2$)— | —CH$_3$ | —COOCH$_2$CHCH$_2$—OOC(CH$_2$)$_2$S— (OH) | —CH$_2$—C(CH$_3$)(COO(CH$_2$)$_2$Si—(CH$_3$)$_2$—O—Si(CH$_3$)$_2$—OSi—CH$_3$)— | 65/15/20 |
| 6 | P-6 | —CH$_3$ | —CH$_2$—C(CH$_3$)(COO(CH$_2$)$_3$Si(OC$_2$H$_5$)$_3$)— | —CH$_3$ | —COOCH$_2$CHCH$_2$—OOC(CH$_2$)$_2$—S— (OH) | —CH$_2$—C(CH$_3$)(COO(CH$_2$)$_3$Si(OSi(CH$_3$)$_3$)$_3$)— | 50/20/30 |
| 7 | P-7 | —C$_2$H$_5$ | —CH$_2$—CH(succinic anhydride)— | —H | —CONH(CH$_2$)$_2$S— | —CH$_2$—C(CH$_3$)(COOCH(CF$_3$)$_2$)— | 57/8/35 |

TABLE E-continued $$+CH_2-C \underset{COOR}{\overset{CH_3}{|}}\!\!)_{\!x}+Y)_y+CH_2-C \underset{W+Z)}{\overset{b}{|}}\!\!)_{\!z}$$

| Synthesis Example of Resin (P) | Resin (P) | —R— | —Y— | —b | —W— | —Z— | x/y/z (weight ratio) |
|---|---|---|---|---|---|---|---|
| 8 | P-8 | —CH$_3$ | —CH$_2$—CH—<br>\|<br>CONH(CH$_2$)$_6$OH | —H | —COO(CH$_2$)$_2$OCO—CH$_2$S— | —CH$_2$—CH—<br>\|<br>CONHC$_{17}$F$_{35}$ | 70/15/15 |
| 9 | P-9 | —C$_2$H$_5$ | CH$_3$    COCH$_3$<br>\|        \|<br>—CH$_2$—C—<br>\|<br>COO(CH$_2$)$_2$NHCOCH<br>                  \|<br>                  COCH$_3$ | —CH$_3$ | —COO(CH$_2$)$_2$OCO—CH$_2$—S— | CH$_3$<br>\|<br>—CH$_2$—C—<br>\|<br>COO(CH$_2$)$_3$SO$_2$NHC$_{12}$F$_{25}$ | 70/10/20 |

SYNTHESIS EXAMPLE 10 OF RESIN (P): (P-10)

A mixed solution of 60 g of 2,2,3,4,4,4-hexafluorobutyl methacrylate, 40 g of a methyl methacrylate macromonomer (AA-6 manufactured by Toagosei Co., Ltd.; Mw: $1\times10^4$), and 200 g of benzotrifluoride was heated to a temperature of 75° C. under nitrogen gas stream. To the solution was added 1.0 g of AIBN, followed by reacting for 4 hours. To the mixture was further added 0.5 g of AIBN, and the reaction was continued for 4 hours. An Mw of the copolymer thus-obtained was $6.5\times10^4$.

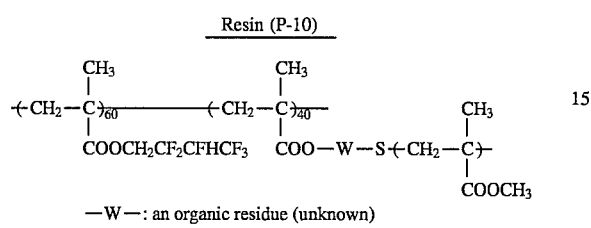

—W—: an organic residue (unknown)

SYNTHESIS EXAMPLES 11 TO 15 OF RESIN (P):

Each of copolymers was synthesized in the same manner as in Synthesis Example 10 of Resin (P), except for replacing the monomer and the macromonomer used in Synthesis Example 10 of Resin (P) with each monomer and each macromonomer both corresponding to the polymer components shown in Table F below. An Mw of each of the resulting copolymers was in a range of from $4.5\times10^4$ to $6.5\times10^4$.

TABLE F $$-(CH_2-\underset{\underset{COO-R}{|}}{\overset{\overset{a}{|}}{C}})_x-(CH_2-\overset{b}{C})_z-COO(CH_2)_2OCO(CH_2)_2S\left[-(CH_2-\underset{\underset{COOR'}{|}}{\overset{\overset{CH_3}{|}}{C}})_p-(Z')_q-\right]$$

| Synthesis Example of Resin (P) | Resin (P) | −a | −R | −Y− | −b | −R' | −Z'− | x/y/z (weight ratio) | p/q (weight ratio) |
|---|---|---|---|---|---|---|---|---|---|
| 11 | P-11 | −CH₃ | −(CH₂)₂C_nF_{2n+1}  n=8−10 | — | −CH₃ | −CH₃ | −CH₂−C(CH₃)(COOCH₂CHCH₂O)− | 70/0/30 | 70/30 |
| 12 | P-12 | −CH₃ | −(CH₂)₂CF₂CFHCF₃ | — | −H | −CH₃ | −CH₂−C(CH₃)(COO(CH₂)₃Si(OCH₃)₂)− | 60/0/40 | 70/30 |
| 13 | P-13 | −CH₃ | −CH₂CF₂CF₂H | −CH₂−C(CH₃)(COO(CH₂)₂SiOSi(CH₃)₂OSi(CH₃)−CH₃)(CH₃)− | −CH₃ | −CH₃ | −CH₂−C(CH₃)(COOCH₂CH=CH₂)− | 40/30/30 | 90/10 |
| 14 | P-14 | −H | −CH₂CF₂CFHCF₃ | −CH₂−C(CH₃)(COO(CH₂)₃Si(CF₃)(C₂H₅)CF₃)− | −C₂H₅ | −CH₂−C(CH₃)(COO(CH₂)₂OH)− | 30/45/25 | 60/40 |
| 15 | P-15 | −CH₃ | −(CH₂)₃Si(OSi(CH₃)₃)₃ | — | −CH₃ | −C₂H₅ | −CH₂−CH(COOH)− | 80/0/20 | 90/10 |

SYNTHESIS EXAMPLE 16 OF RESIN (P): (P-16)

A mixed solution of 67 g of methyl methacrylate, 22 g of methyl acrylate, 1 g of methacrylic acid, and 200 g of toluene was heated to a temperature of 80° C. under nitrogen gas stream. To the solution was added 10 g of Polymer Azobis Initiator (PI-1) having the structure shown below, followed by reacting for 8 hours. After completion of the reaction, the reaction mixture was poured into 1.5 l of methanol, and the precipitate thus-deposited was collected and dried to obtain 75 g of a copolymer having an Mw of $3 \times 10^4$.

Polymer Initiator (PI-1)

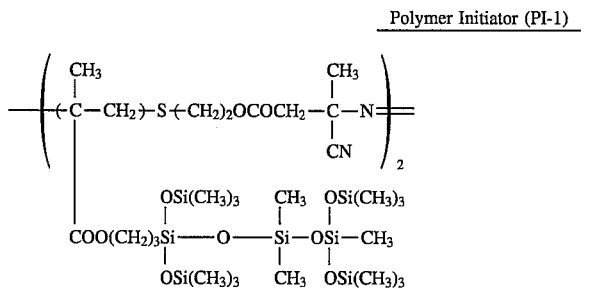

Polymer Initiator (PI-16)

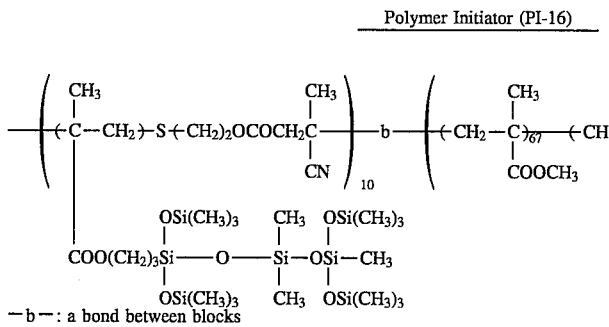

—b—: a bond between blocks

SYNTHESIS EXAMPLE 17 OF RESIN (P): (P-17)

A mixed solution of 70 g of methyl methacrylate and 200 g of tetrahydrofuran was thoroughly degassed under nitrogen gas stream and cooled to −20° C. To the solution was added 0.8 g of 1,1-diphenylbutyl lithium, followed by reacting for 12 hours. To the reaction mixture was then added a mixed solution of 30 g of Monomer (m-1) shown below and 60 g of tetrahydrofuran which had been thoroughly degassed under nitrogen gas stream, followed by reacting for 8 hours.

After rendering the mixture to 0° C., 10 ml of methanol was added thereto to conduct a reaction for 30 minutes, and then the polymerization was terminated. The resulting polymer solution was heated to a temperature of 30° C. with stirring, and 3 ml of a 30% ethanol solution of hydrogen chloride was added thereto, followed by stirring for 1 hour. The reaction mixture was distilled under reduced pressure to remove the solvent until the volume was reduced to half and the residue was reprecipitated in 1 l of petroleum ether. The precipitate was collected and dried under reduced pressure to obtain 76 g of a polymer having an Mw of $6.8 \times 10^4$.

Monomer (m-1)

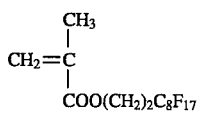

Resin (P-17)

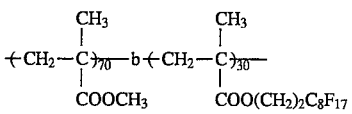

SYNTHESIS EXAMPLE 18 OF RESIN (P): (P-18)

A mixed solution of 52.5 g of methyl methacrylate, 22.5 g of methyl acrylate, 0.5 g of methylaluminum tetraphenylporphynate, and 200 g of methylene chloride was heated to a temperature of 30° C. under nitrogen gas stream. The solution was irradiated with light from a xenon lamp of 300 W at a distance of 25 cm through a glass filter for 20 hours. To the mixture was added 25 g of Monomer (m-2) shown below, and the resulting mixture was further irradiated with light under the same conditions as above for 12 hours. To the reaction mixture was added 3 g of methanol, followed by stirring for 30 minutes to stop the reaction. The reaction mixture was reprecipitated in 1.5 l of methanol, and the precipitate was collected and dried to obtain 78 g of a polymer having an Mw of $9 \times 10^4$.

Monomer (m-2)

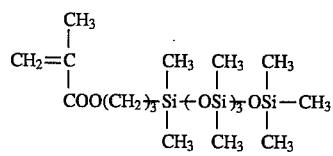

Resin (P-18)

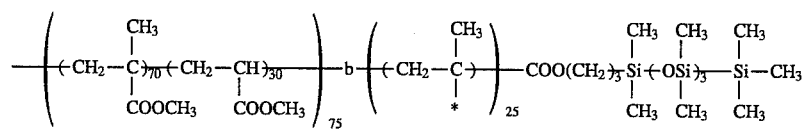

SYNTHESIS EXAMPLE 19 OF RESIN (P): (P-19)

A mixture of 50 g of ethyl methacrylate, 10 g of glycidyl methacrylate, and 4.8 g of benzyl N,N-diethyldithiocarbamate was sealed into a container under nitrogen gas stream and heated to a temperature of 50° C. The mixture was irradiated with light from a high-pressure mercury lamp of 400 W at a distance of 10 cm through a glass filter for 6 hours to conduct photopolymerization. The reaction mixture was dissolved in 100 g of tetrahydrofuran, and 40 g of Monomer (m-3) shown below was added thereto. After displacing the atmosphere with nitrogen, the mixture was again irradiated with light for 10 hours. The reaction mixture obtained was reprecipitated in 1 l of methanol, and the precipitate was collected and dried to obtain 73 g of a polymer having an Mw of $4.8 \times 10^4$.

to a temperature of 50° C. The mixture was irradiated with light from a high-pressure mercury lamp of 400 W at a distance of 10 cm through a glass filter for 6 hours to conduct photopolymerization. To the mixture was added 25 g of Monomer (m-1) described above. After displacing the atmosphere with nitrogen, the mixture was again irradiated with light for 10 hours. The reaction mixture obtained was reprecipitated in 2 l of methanol, and the precipitate was collected and dried to obtain 63 g of a polymer having an Mw of $6 \times 10^4$.

Monomer (m-3)

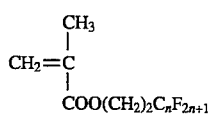

(n: an integer of from 8 to 10)

Resin (P-19)

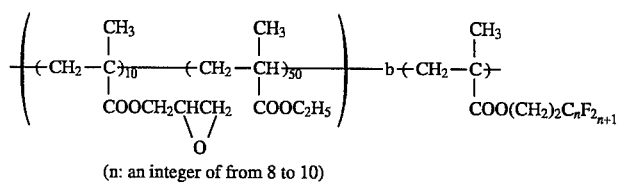

(n: an integer of from 8 to 10)

SYNTHESIS EXAMPLE 20 OF RESIN (P): (P-20)

A mixture of 50 g of methyl methacrylate, 25 g of ethyl methacrylate, and 1.0 g of benzyl isopropylxanthate was sealed into a container under nitrogen gas stream and heated Resin (P-20)

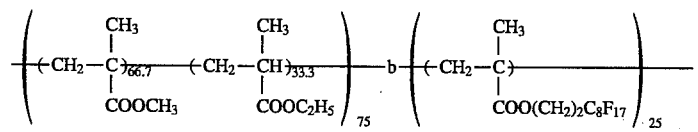

SYNTHESIS EXAMPLES 21 TO 27 OF RESIN (P): (P-21) TO (P-27)

Each of copolymers shown in Table G below was prepared in the same manner as in Synthesis Example 19 of Resin (P), An Mw of each of the resulting polymers was in a range of from $3.5 \times 10^4$ to $6 \times 10^4$.

with 18 g of Initiator (I-11) having the structure shown below.

TABLE G

| Synthesis Example of Resin (P) | Resin (P) | A—B Type Block Copolymer (weight ratio) |
|---|---|---|
| 21 | P-21 | $\left[\!\!\left(CH_2-\underset{COOCH_2C_6H_5}{\overset{CH_3}{\underset{|}{C}}}\right)_{\!99}\!\!\left(CH_2-\underset{COOH}{\overset{CH_3}{\underset{|}{C}}}\right)_{\!1.0}\right]_{80}\!\!-b-\!\left[CH_2-\underset{COOCH_2CF_2CFHCF_3}{\overset{CH_3}{\underset{|}{C}}}\right]_{20}$ |
| 22 | P-22 | $\left[\!\!\left(CH_2-\underset{COOCH_3}{\overset{CH_3}{\underset{|}{C}}}\right)_{\!70}\!\!\left(CH_2-\underset{COOCH_3}{\overset{}{\underset{|}{CH}}}\right)_{\!22}\!\!\left(CH_2-CH\right)_{\!8}\right]_{75}\!\!-b-\!\left[CH_2-\underset{COOCH_2CH_2C_6F_{13}}{\overset{CH_3}{\underset{|}{C}}}\right]_{25}$ with side group $COO(CH_2)OCO$—phenyl—$(O=C\diagdown_O\diagup C=O)$ |
| 23 | P-23 | $\left[\!\!\left(CH_2-\underset{COOC_2H_5}{\overset{CH_3}{\underset{|}{C}}}\right)_{\!90}\!\!\left(CH_2-\underset{COO(CH_2)_2CN}{\overset{}{\underset{|}{CH}}}\right)_{\!10}\right]_{50}\!\!-b-\!\left[CH_2-\underset{COO(CH_2)_2OSi(CH_3)_2-CF_3}{\overset{CH_3}{\underset{|}{C}}}\right]_{50}$ |
| 24 | P-24 | $\left[CH_2-\underset{COOCH_3}{\overset{CH_3}{\underset{|}{C}}}\right]_{40}\!\!-b-\!\left[\!\!\left(CH_2-\underset{COO(CH_2)_2C_8F_{17}}{\overset{CH_3}{\underset{|}{C}}}\right)_{\!90}\!\!\left(CH_2-\underset{COOCH_3}{\overset{CH_3}{\underset{|}{C}}}\right)_{\!10}\right]_{60}$ |
| 25 | P-25 | $\left[\!\!\left(CH_2-\underset{COOCH_3}{\overset{CH_3}{\underset{|}{C}}}\right)_{\!55}\!\!\left(CH_2-\underset{\text{Ph-}CH_2NHCOOCH_2CF_3}{\overset{}{\underset{|}{CH}}}\right)_{\!15}\!\!\left(CH_2-\underset{COOC_2H_5}{\overset{}{\underset{|}{CH}}}\right)_{\!30}\right]_{60}\!\!-b-\!\left[CH_2-\underset{COO(CH_2)_2SO_2NHC_8F_{17}}{\overset{CH_3}{\underset{|}{C}}}\right]_{40}$ |
| 26 | P-26 | $\left[CH_2-\underset{COOCH_2C_6H_5}{\overset{CH_3}{\underset{|}{C}}}\right]_{70}\!\!-b-\!\left[CH_2-\underset{COO(CH_2)_2OCOC_7F_{15}}{\overset{CH_3}{\underset{|}{C}}}\right]_{30}$ |
| 27 | P-27 | $\left[\!\!\left(CH_2-\underset{COOCH_2C_6H_5}{\overset{CH_3}{\underset{|}{C}}}\right)_{\!97}\!\!\left(CH_2-\underset{COO(CH_2)_2O-P(=O)(OH)_2}{\overset{CH_3}{\underset{|}{C}}}\right)_{\!3}\right]_{75}\!\!-b-\!\left[CH_2-\underset{COO(CH_2)_2OSi(CH_3)_2-C_8F_{17}}{\overset{CH_3}{\underset{|}{C}}}\right]_{25}$ |

SYNTHESIS EXAMPLE 28 OF RESIN (P): (P-28)

A copolymer having an Mw of $4.5 \times 10^4$ was prepared in the same manner as in Synthesis Example 19 of Resin (P), except for replacing benzyl N,N-diethyldithio-carbamate Initiator (I-11)

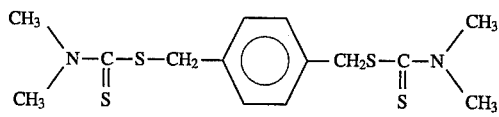

Resin (P-28)

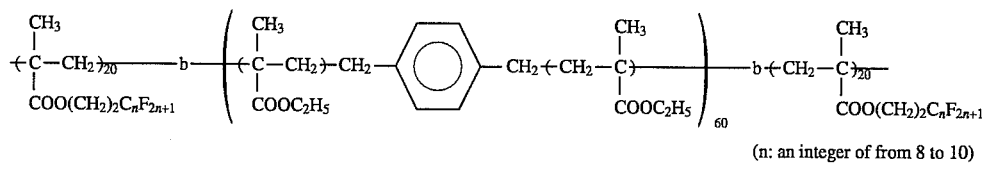

(n: an integer of from 8 to 10)

SYNTHESIS EXAMPLE 29 OF RESIN

A copolymer having an Mw of $2.5 \times 10^4$ was prepared in the same manner as in Synthesis Example 20 of Resin (P), except for replacing benzyl isopropylxanthate with 0.8 g of Initiator (I-12) having the structure shown below.

Initiator (I-12)

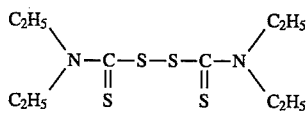

Resin (P-29)

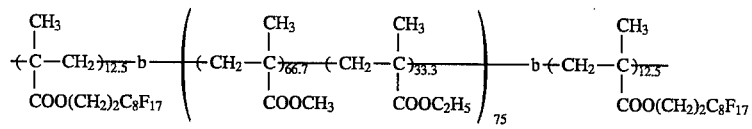

SYNTHESIS EXAMPLE 30 OF RESIN (P): (P-30)

A mixed solution of 68 g of methyl methacrylate, 22 g of methyl acrylate, 10 g of glycidyl methacrylate, 17.5 g of Initiator (I-13) having the structure shown below, and 150 g of tetrahydrofuran was heated to a temperature of 50° C. under nitrogen gas stream. The solution was irradiated with light from a high-pressure mercury lamp of 400 W at a distance of 10 cm through a glass filter for 10 hours to conduct photopolymerization. The reaction mixture obtained was reprecipitated in 1 l of methanol, and the precipitate was collected and dried to obtain 72 g of a polymer having an Mw of $4.0 \times 10^4$.

A mixed solution of 70 g of the resulting polymer, 30 g of Monomer (m-2) described above, and 100 g of tetrahydrofuran was heated to a temperature of 50° C. under nitrogen gas stream and irradiated with light under the same conditions as above for 13 hours. The reaction mixture was reprecipitated in 1.5 l of methanol, and the precipitate was collected and dried to obtain 78 g of a copolymer having an Mw of $6 \times 10^4$.

Initiator (I-13)

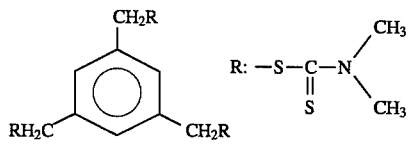

Resin (P-30)

-continued
Initiator (I-13)
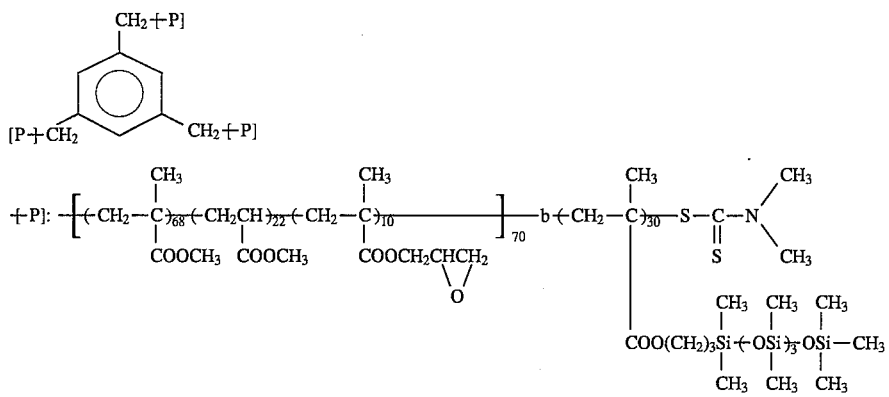
SYNTHESIS EXAMPLES 31 TO 38 OF RESIN (P): (P-31) TO (P-38)
In the same manner as in Synthesis Example 30 of Resin (P), except for replacing 17.5 g of Initiator (I-13) with 0.031 mol of each of the initiators shown in Table H below, each of the copolymers shown in Table H was obtained. A yield thereof was in a range of from 70 to 80 g and an Mw thereof was in a range of from $4 \times 10^4$ to $6 \times 10^4$.

TABLE H
| Synthesis Example of Resin (P) | Resin (P) | Initiator (I) | —R |
|---|---|---|---|
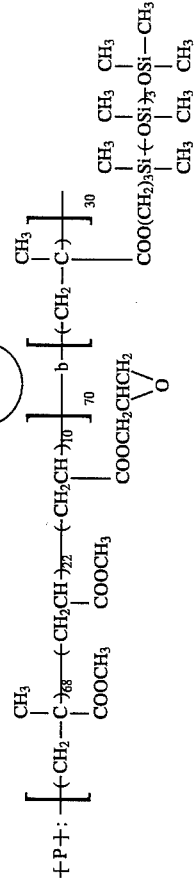

TABLE H-continued

| Synthesis Example of Resin (P) | Resin (P) | Initiator (I) | —R |
|---|---|---|---|
| 34 | P-34 | R(CH₂)₂HNOC—[benzene ring]—CONH(CH₂)₂—R (I-17) | —S—C(=S)—N(C₄H₉)(C₄H₉) on HNOC—[benzene ring]—CONH(CH₂)₂— with (CH₂)₂ bridge |
| 35 | P-35 | R—(CH₂)₃—Si[(CH₂)₃R]—(CH₂)₃R (I-18) | —S—C(=S)—O—C₄H₉ on (CH₂)₃—Si—(CH₂)₃ structure |
| 36 | P-36 | R—(CH₂)₃NHCO—[benzene ring]—CONH(CH₂)₃R with CONH(CH₂)₃R (I-19) | —S—C(=S)—N(C₄H₉)(C₄H₉) on (CH₂)₃NHCO—[benzene ring]—CONH(CH₂)₃ with CONH(CH₂)₃ |

{P}: {(P—R)ₙ}  n: an integer

X:

+P+: {+(CH₂—C(CH₃))₆₈+(CH₂CH)₂₂+(CH₂CH)₇₀+(CH₂—C(CH₃))₃₀}
       COOCH₃    COOCH₃    COOCH₂CHCH₂(O)    COO(CH₂)₃Si+(OSi(CH₃)₂)₇OSi(CH₃)₃

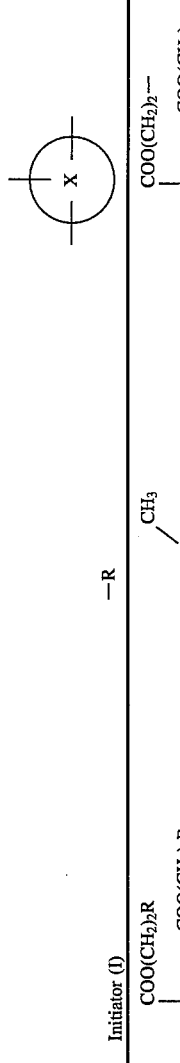

Synthesis Examples of Resin Grain (L):

SYNTHESIS EXAMPLE 1 OF RESIN GRAIN (L): (L-1)

A mixed solution of 40 g of Monomer (LM-1) having the structure shown below, 2 g of ethylene glycol dimethacrylate, 4.0 g of Dispersion Stabilizing Resin (LP-1) having the structure shown below, and 180 g of methyl ethyl ketone was heated to a temperature of 60° C. with stirring under nitrogen gas stream. To the solution was added 0.3 g of AIVN, followed by reacting for 3 hours. To the reaction mixture was further added 0.1 g of AIVN, and the reaction was continued for 4 hours. After cooling, the reaction mixture was passed through a nylon cloth of 200 mesh to obtain a white dispersion. The average grain diameter of the latex was 0.25 μm.

Monomer (LM-1)

$$CH_2=\underset{\underset{COO(CH_2)_2NHCOC_7F_{15}}{|}}{\overset{\overset{CH_3}{|}}{C}}$$

Dispersion Stabilizing Resin (LP-1)

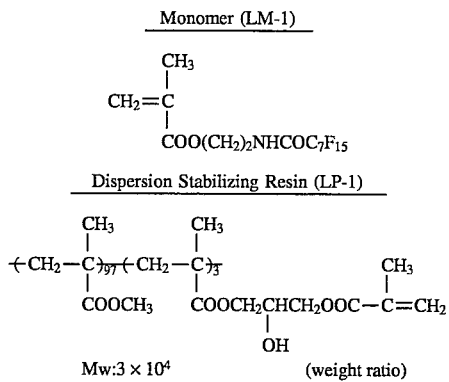

Mw:3 × 10⁴ (weight ratio)

SYNTHESIS EXAMPLE 2 OF RESIN GRAIN (L): (L-2)

A mixed solution of 5 g of AB-6 (a monofunctional macromonomer comprising a butyl acrylate unit, manufactured by Toagosei Chemical Industry Co., Ltd.) as a dispersion stabilizing resin and 140 g of methyl ethyl ketone was heated to a temperature of 60° C. under nitrogen gas stream while stirring. To the solution was added dropwise a mixed solution of 40 g of Monomer (LM-2) having the structure shown below, 1.5 g of ethylene glycol diacrylate, 0.2 g of AIVN, and 40 g of methyl ethyl ketone over a period of one hour. After the addition, the reaction was continued for 2 hours. To the reaction mixture was further added 0.1 g of AIVN, followed by reacting for 3 hours to obtain a white dispersion. After cooling, the dispersion was passed through a nylon cloth of 200 mesh. The average grain diameter of the dispersed resin grains was 0.35 μm.

Monomer (LM-2)

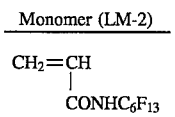

SYNTHESIS EXAMPLES 3 TO 11 OF RESIN GRAIN (L): (L-3) TO (L-11)

Each of resin grains was synthesized in the same manner as in Synthesis Example 1 of Resin Grain (L), except for replacing Monomer (LM-1), ethylene glycol dimethacrylate and methyl ethyl ketone with each of the compounds shown in Table I below, respectively. An average grain diameter of each of the resulting resin grains was in a range of from 0.15 to 0.30 μm.

TABLE I

| Synthesis Example of Resin Grain (L) | Resin Grain (L) | Monomer (LM) | | Crosslinking Polyfunctional Monomer | Amount | Reaction Solvent |
|---|---|---|---|---|---|---|
| 3 | L-3 | (LM-3) | $CH_2=\underset{\underset{COO(CH_2)_2SO_2NHC_{10}F_{21}}{|}}{\overset{\overset{CH_3}{|}}{C}}$ | Ethylene glycol dimethacrylate | 2.5 g | Methyl ethyl ketone |
| 4 | L-4 | (LM-4) | $CH_2=CH-C_6H_4-CONHC_{12}F_{25}$ | Divinylbenzene | 3 g | Methyl ethyl ketone |
| 5 | L-5 | (LM-5) | $CH_2=CH-CONHC_{12}F_{25}$ | — | — | Methyl ethyl ketone |

TABLE I-continued

| Synthesis Example of Resin Grain (L) | Resin Grain (L) | Monomer (LM) | Crosslinking Polyfunctional Monomer | Amount | Reaction Solvent |
|---|---|---|---|---|---|
| 6 | L-6 | (LM-6)<br><br>$\quad\quad CH_3$<br>$\quad\quad\ \|$<br>$CH_2=C\quad\quad CH_3$<br>$\quad\quad\ \|\quad\quad\ \|$<br>$\quad\quad CONH(CH_2)_3Si-C_4F_9$<br>$\quad\quad\quad\quad\quad\quad\ \|$<br>$\quad\quad\quad\quad\quad\quad CH_3$ | Diethylene glycol diacrylate | 5 g | n-Hexane |
| 7 | L-7 | (LM-7)<br><br>$\quad\quad CH_3$<br>$\quad\quad\ \|$<br>$CH_2=C\quad\quad CF_3$<br>$\quad\quad\ \|\quad\ /$<br>$\quad\quad COOCH$<br>$\quad\quad\quad\quad\ \backslash$<br>$\quad\quad\quad\quad\ CF_3$ | Ethylene glycol dimethacrylate | 3.5 g | n-Hexane |
| 8 | L-8 | (LM-8)<br><br>$CH_2=CH$<br>$\quad\ \|$<br>$\quad COO(CH_2)_2CONHC_8F_{17}$ | Trimethylolpropane trimethyacrylate | 2.5 g | Methyl ethyl ketone |
| 9 | L-9 | (LM-9)<br><br>$CH_2=CH$<br>$\quad\ \|$<br>$\quad CONH(CH_2)_3Si[OSi(CH_3)_3]_3$ | Trivinylbenzene | 3.3 g | Ethyl acetate/ n-Hexane (4/1 by weight) |
| 10 | L-10 | (LM-10)<br><br>$\quad\quad CH_3$<br>$\quad\quad\ \|$<br>$CH_2=C$<br>$\quad\quad\ \|$<br>$\quad\quad COO(CH_2)_2NHCONH(CH_2)_3Si[OSi(CH_3)_3]_3$ | Divinyl glutaconate | 4 g | Ethyl acetate/ n-Hexane (2/1 by weight) |
| 11 | L-11 | (LM-11)<br><br>$\quad\quad CH_3$<br>$\quad\quad\ \|$<br>$CH_2=C$<br>$\quad\quad\ \|$<br>$\quad\quad CONHCOOCH_2CF_2CFHCF_3$ | Propylene glycol diacrylate | 3 g | Methyl ethyl ketone |

SYNTHESIS EXAMPLES 12 TO 17 OF RESIN GRAIN (L): (L-12) TO (L-17)

Each of resin grains was synthesized in the same manner as in Synthesis Example 2 of Resin Grain (L), except for replacing 5 g of AB-6 (dispersion stabilizing resin) with each of Resins (LP) shown in Table J below. An average grain diameter of each of the resulting resin grains was in a range of from 0.10 to 0.25 μm.

TABLE J

| Synthesis Example of Resin Grain (L) | Resin Grain (L) | Dispersion Stabilizing Resin (LP) | Amount |
|---|---|---|---|
| 12 | L-12 | (LP-2)  $-(-CH_2-\underset{\underset{COOCH_3}{\|}}{\overset{\overset{CH_3}{\|}}{C}})_{67}(CH_2-\underset{\underset{COOCH_3}{\|}}{\overset{}{CH}})_{30}(CH_2-\overset{\overset{CH_3}{\|}}{\underset{\underset{COO(CH_2)_2OCO(CH_2)_2COOCH_2CHCH_2OCO}{\|}}{C}})_{3}$  $CH=CH_2$, $OH$   Mw $3.3 \times 10^4$ | 4 g |
| 13 | L-13 | (LP-3)  $-(-CH_2-\overset{\overset{CH_3}{\|}}{\underset{\underset{COOC_2H_5}{\|}}{C}})_{97}(CH_2-\underset{\underset{COOH}{\|}}{\overset{\overset{CH_3}{\|}}{CH}})_{1.0}(CH_2-\overset{\overset{CH_3}{\|}}{\underset{\underset{CONH(CH_2)_{10}OCO}{\|}}{C}})_{2}$  $\overset{\overset{CH_3}{\|}}{C}=CH_2$   Mw $2.5 \times 10^4$ | 2 g |
| 14 | L-14 | $CH_2=\overset{\overset{CH_3}{\|}}{\underset{\underset{COO(CH_2)_2OCO(CH_2)_2S}{\|}}{C}}-[(CH_2-\overset{\overset{CH_3}{\|}}{\underset{\underset{COOCH_3}{\|}}{C}})_{70}(CH_2-\underset{\underset{CH_2CHCH_2\backslash\!/O}{\|}}{\overset{}{CH}})_{30}]$   (LP-4)  Mw $8 \times 10^3$ | 6 g |
| 15 | L-15 | $CH_2=\underset{\underset{COO(CH_2)_2OCO(CH_2)_2S}{\|}}{\overset{CH}{}}-[(CH_2-\overset{\overset{CH_3}{\|}}{\underset{\underset{COOC_2H_5}{\|}}{C}})_{55}(CH_2-\underset{\underset{COOCH_3}{\|}}{\overset{\overset{CH_3}{\|}}{CH}})_{20}(CH_2-\overset{\overset{CH_3}{\|}}{\underset{\underset{COO(CH_2)_2NHCOCH}{\|}}{C}})_{25}]$  $\overset{\overset{COCH_3}{\|}}{\underset{\underset{COCH_3}{\|}}{}}$   (LP-5)  Mw $1 \times 10^4$ | 6 g |
| 16 | L-16 | $CH_2=\overset{\overset{CH_3}{\|}}{\underset{\underset{COO(CH_2)_3Si(OSi)_{\overline{n}}OSi-CH_3}{\|}}{C}}$ with $CH_3$ groups on Si   (LP-6)  Mw $1 \times 10^4$ | 4 g |
| 17 | L-17 | $CH_2=\overset{\overset{CH_3}{\|}}{\underset{\underset{COO(CH_2)_2S}{\|}}{C}}-[(CH_2-\overset{\overset{CH_3}{\|}}{\underset{\underset{COOC_4H_9}{\|}}{C}})_{16}(CH_2-\overset{\overset{CH_3}{\|}}{\underset{\underset{COOCH_2C_6H_5}{\|}}{C}})_{80}(CH_2-\overset{\overset{CH_3}{\|}}{\underset{\underset{COO(CH_2)_2COOH}{\|}}{C}})_{4}]$   (LP-7)  Mw $6 \times 10^3$ | 5 g |

SYNTHESIS EXAMPLES 18 TO 23 OF RESIN GRAIN (L): (L-18) TO (L-23)

Each of resin grains was synthesized in the same manner as in Synthesis Example 2 of Resin Grain (L), except for replacing 40 g of Monomer (LM-2) with each of the monomers shown in Table K below and replacing 5 g of AB-6 (dispersion stabilizing resin) with 6 g of Dispersion Stabilizing Resin (LP-8) having the structure shown below. An average grain diameter of each of the resulting resin grains was in a range of from 0.05 to 0.20 μm.

Dispersion Stabilizing Resin (LP-8)

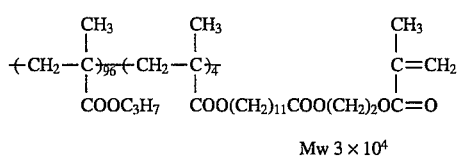

Mw $3 \times 10^4$

TABLE K

| Synthesis Example of Resin Grain (L) | Resin Grain (L) | Monomer (LM) | Amount | Other Monomer | Amount |
|---|---|---|---|---|---|
| 18 | L-18 | (LM-12) $CH_2=C(CH_3)COO(CH_2)_2C_8F_{17}$ | 30 g | $CH_2=CH\text{-}CONHCH_2OCH_3$ | 10 g |
| 19 | L-19 | (LM-13) $CH_2=C(CH_3)COO(CH_2)_3Si(CH_3)_2(OSi(CH_3)_2)_2OSi(CH_3)_3$ | 25 g | Glycidyl methacrylate | 15 g |
| 20 | L-20 | (LM-14) $CH_2=CH\text{-}COOCH_2CF_2CF_2H$ | 20 g | Acrylonitrile | 20 g |
| 21 | L-21 | (LM-15) $CH_2=CH\text{-}C_6H_4\text{-}COOCH_2CH_2C_7F_{15}$ | 25 g | $CH_2=CH\text{-}C_6H_4\text{-}CH_2NHCOCH(COCH_3)_2$ | 15 g |
| 22 | L-22 | (LM-16) $CH_2=C(CH_3)COO(CH_2)_2OSi(CH_3)_2\text{-}C_6F_{13}$ | 20 g | Methyl methacrylate | 20 g |
| 23 | L-23 | (LM-17) $CH(CH_3)=CH\text{-}COOCH_2CF_2CFHCF_3$ | 20 g | Vinyl acetate | 20 g |

EXAMPLE 1

A mixture of 2 g of X-form metal-free phthalocyanine (manufactured by Dainippon Ink and Chemicals, Inc.), 10 g of Binder Resin (B-1) having the structure shown below, 0.3 g of Resin (P-1), 0.15 g of Compound (A) having the structure shown below, and 80 g of tetrahydrofuran was put into a 500 ml-volume glass container together with glass beads and dispersed in a paint shaker (manufactured by Toyo Seiki Seisakusho Co.) for 60 minutes. To the dispersion were added 0.03 g of phthalic anhydride and 0.01 g of phthalic acid, followed by further dispersing for 2 minutes. The glass beads were separated by filtration to prepare a dispersion for a light-sensitive layer.

Binder Resin (B-1)

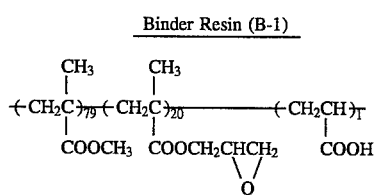

Mw $4.5 \times 10^5$

Compound (A)

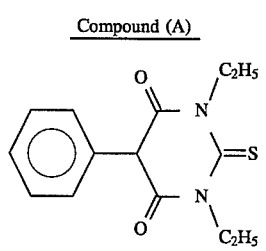

The resulting dispersion was coated on base paper for a paper master having a thickness of 0.2 mm, which had been subjected to electrically conductive treatment and solvent-resistant treatment, by a wire bar, set to touch, and heated in a circulating oven at 120° C. for 2 hours to form a light-sensitive layer having a thickness of 8 μm. The adhesion strength of the surface of the resulting electrophotographic light-sensitive element measured according to JIS Z 0237-1980 "Testing methods of pressure sensitive adhesive tapes and sheets" was 3 gram.force (g.f).

For comparison, an electrophotographic light-sensitive element was prepared in the same manner as described above except for eliminating 0.3 g of Resin (P-1) according to the present invention. The adhesive strength of the surface thereof was more than 450 g.f and did not exhibit releasability at all.

The light-sensitive element having the surface of releasability was installed in an apparatus as shown in FIG. 2 as a light-sensitive element 11. On the other hand, a drum wound with a blanket for offset printing (9600-A manufactured by Meiji Rubber & Co., Ltd.) having the adhesive strength of 80 g.f and a thickness of 1.6 mm was installed as a primary receptor 20, and on the surface thereof a transfer layer 22 was formed by the electrodeposition coating method using an electrodeposition unit as a transfer layer-forming device 21. Specifically, on the surface of primary receptor which was rotated at a circumferential speed of 10 mm/sec, Dispersion of Resin (A) (L-1) shown below was supplied using a slit electrodeposition device, while putting the primary receptor to earth and applying an electric voltage of −250 V to an electrode of the slit electrodeposition device, whereby the resin grains were electrodeposited. The dispersion medium was removed by air-squeezing, and the resin grains were fused by an infrared line heater to form a film, whereby a transfer layer 22 composed of a thermoplastic resin was prepared on the printing receptor. A thickness of the transfer layer was 5 μm.

| Dispersion of Resin (A) (L-1) | |
|---|---|
| Thermoplastic Resin Grain (ARH-4) | 5 g (solid basis) |
| Thermoplastic Resin Grain (ARL-1) | 5 g (solid basis) |
| Charge Control Agent (D-1) (octadecyl vinyl ether/N-tert-octyl maleic monoamide copolymer (1:1 by molar ratio)) | 0.03 g |
| Silicone oil (KF-69 manufactured by Shin-Etsu Silicone K.K.) | 5 g |
| Isopar H | up to make 1 liter |

An electrophotographic process was then performed. Specifically, the light-sensitive element was charged to +450 V with a corona charger 18 in dark and image-exposed to light using a semiconductor laser having an oscillation wavelength of 788 nm as an exposure device 19 at an irradiation dose on the surface of the light-sensitive element of 30 erg/cm$^2$. The image exposure was in a negative mirror image mode based on digital image data on an information for yellow color separation among digital image data on informations for yellow, magenta, cyan and black color separations which had been obtained by reading an original by a color scanner, conducting several corrections relating to color reproduction peculiar to color separation system and memorized in a hard disc.

Thereafter, the exposed light-sensitive element was subjected to reversal development using a liquid developer prepared by diluting a yellow liquid developer for Signature System (manufactured by Eastman Kodak Co.) with 75-fold by weight Isopar H (manufactured by Esso Standard Oil Co.) while a bias voltage of +350 V was applied to a yellow liquid developing unit 14Y to thereby electrodeposit toner particles on the exposed areas. The light-sensitive element was then rinsed in a bath of Isopar H alone to remove any stains in the non-image areas, and dried by passing under a suction/exhaust unit 15 and a pre-heating means 16.

The above procedure was repeated using each information for magenta, cyan and black in place of the information for yellow to form color toner images.

The light-sensitive element was then heated using the pre-heating means 16 and a temperature controller 17 so as to maintain the surface temperature of light-sensitive element at 60° C. The drum of light-sensitive element 11 and the drum of primary receptor 20 whose surface temperature had been adjusted at 110° C. by the temperature controller 17, were brought into contact with each other under the condition of a nip pressure of 5 kgf/cm$^2$ and a drum circumferential speed of 5 mm/sec, whereby the color toner images were wholly transferred onto the transfer layer 22 on the primary receptor 20.

Then, coated paper was introduced as a receiving material 30 on a back-up roller for transfer 31 adjusted at 130° C. and a back-up roller for release 32 adjusted at 10° C. and the coated paper was brought into contact with the primary receptor 20 of drum type, the surface temperature of which had been adjusted at 60° C. by the temperature controller 17 under a nip pressure of 5 kgf/cm$^2$ and at a drum circumferential speed of 10 mm/sec. The color toner images were wholly transferred onto the coated paper and thus clear color images of good image quality were obtained.

For comparison, the same procedure as above was performed except that the transfer layer was not formed on the primary receptor. In the resulting color images on coated paper, cuttings of toner image and unevenness in image density were observed. Further, as a result of visual evaluation of the color images using an optical microscope of 200 magnifications, cuttings of fine image, for example, fine lines and fine letters were recognized. Also, the residue of toner image was found on the surface of light-sensitive element.

These results indicate that cleaning of the surface of light-sensitive element is necessary for removing the residual toner when the light-sensitive element is repeatedly employed. Consequently, a device for the cleaning must be provided and a problem in that the surface of light-sensitive element is damaged due to the cleaning arises. On the contrary, the method according to the present invention has advantages in that the release of toner image from the light-sensitive element is sufficiently performed by utilizing the transfer layer composed of a resin, in that the toner image is easily and sufficiently transferred from the primary receptor to the receiving material and in that the toner image is protected by the transfer layer on the receiving material.

EXAMPLE 2

An amorphous silicon electrophotographic light-sensitive element was installed in an apparatus as shown in FIG. 2 as a light-sensitive element 11. In order to impart the desired releasability onto the surface of light-sensitive element, the light-sensitive element was brought into contact with a solution containing 1 g of a polyether-modified silicone oil (Compound (S-1)) having the structure shown below dissolved in one liter of Isopar G for 10 seconds while the light-sensitive element was rotated at a circumferential speed of 30 mm/sec, squeezed by a squeezing roll and dried by a pre-heating means 16. As a result, the adhesive strength of the surface of light-sensitive element was reduced from 203 g.f to 8 g.f.

Compound (S-1)

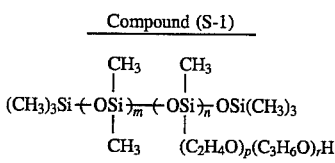

On the other hand, an ethylene-vinyl acetate copolymer (content of vinyl acetate: 20% by weight; softening point measured by ring and ball method: 90° C.) was coated as a thermoplastic resin on the surface of primary receptor at a rate of 20 mm/sec by a hot melt coater adjusted at 120° C. and cooled by blowing cool air from a suction/exhaust unit to form a transfer layer 22. A thickness of the transfer layer was 2.5 μm.

The amorphous silicon electrophotographic light-sensitive element having the releasability was charged to +700 V with a corona discharge in a dark place and exposed to light using a semiconductor laser having an oscillation wavelength of 780 nm on the basis of digital image data on an information for yellow color separation among digital image data on informations for yellow, magenta, cyan and black color separations which had been obtained by reading an original by a color scanner, conducting several corrections relating to color reproduction peculiar to color separation system and stored in a hard disc. The potential in the exposed area was +220 V while it was +600 V in the unexposed area.

The exposed light-sensitive element was pre-bathed with Isopar H (manufactured by Esso Standard Oil Co.) by a pre-bathing means installed in a developing unit and then subjected to reversal development by supplying a liquid developer prepared by diluting a positively charged yellow toner for an electrostatic color plotter (Versateck 3000 manufactured by Xerox Corp.) with 50-fold Isopar H from the developing unit to the surface of light-sensitive element while applying a bias voltage of +500 V to the developing unit side to thereby electrodeposite yellow toner particles on the unexposed areas. The light-sensitive element was then rinsed in a bath of Isopar H alone to remove stains in the non-image areas and dried by a suction/exhaust unit.

The above procedure was repeated using each information for magenta, cyan and black in place of the information for yellow.

The light-sensitive element having yellow, magenta, cyan and black toner images on the transfer layer thereof was passed under an infrared line heater to maintain a surface temperature thereof measured by a radiation thermometer at about 80° C., the primary receptor having provided thereon the transfer layer was heated at 100° C. and the light-sensitive element was brought into contact with the primary receptor under the condition of a nip pressure of 4 kgf/cm² and a drum circumferential speed of 5 mm/sec, whereby the color toner images were wholly transferred onto the transfer layer on the primary receptor.

Then, coated paper was brought into contact with the transfer layer bearing the toner image thereon of the primary receptor and they were passed between a pair of heating rubber rollers which were in contact with each other under a pressure of 10 kgf/cm² and whose surface temperature was constantly maintained at 120° C. at a transportation speed of 15 mm/sec.

After cooling the sheets while being in contact with each other by passing under a cooling roller, the coated paper was stripped from the primary receptor, whereby the toner images on the primary receptor were wholly heat-transferred together with the transfer layer onto the coated paper. The toner images were completely covered with the thermoplastic resin of transfer layer on the coated paper and thus they did not fall off when they were rubbed.

EXAMPLE 3

A mixture of 2 g of X-form metal-free phthalocyanine (manufactured by Dainippon Ink and Chemicals, Inc.), 10 g of Binder Resin (B-2) having the structure shown below, 0.15 g of Compound (B) having the structure shown below, and 80 g of tetrahydrofuran was put into a 500 ml-volume glass container together with glass beads and dispersed in a paint shaker (manufactured by Toyo Seiki Seisakusho Co.) for 60 minutes. The glass beads were separated by filtration to prepare a dispersion for a light-sensitive layer.

Binder Resin (B-2)

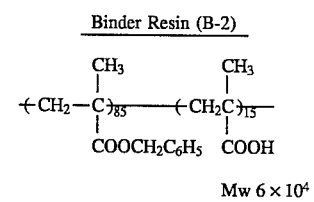

Mw 6 × 10⁴

Compound (B)

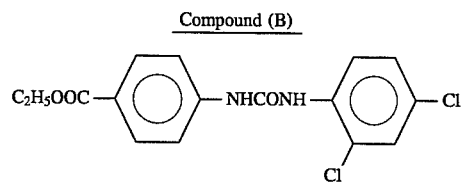

The resulting dispersion was coated on base paper for a paper master having a thickness of 0.2 mm, which had been subjected to electrically conductive treatment and solvent-resistant treatment, by a wire bar, set to touch, and heated in a circulating oven at 110° C. for 20 seconds to form a light-sensitive element comprising a light-sensitive layer having a thickness of 8 μm.

The resulting light-sensitive element was installed in an apparatus as shown in FIG. 3. In an applying part of compound (S) 110, a metering roll having a silicone rubber layer on the surface thereof was brought into contact with a bath containing an oil of Compound (S-2) having the structure shown below on one side and with the light-sensitive element on the other side and they were rotated at a circumferential speed of 15 mm/sec for 20 seconds. The adhesive strength of the surface of resulting light-sensitive element was 5 g.f.

Compound (S-2)

Carboxy-modified silicone oil (TSF 4770 manufactured by Toshiba Silicone Co., Ltd.)

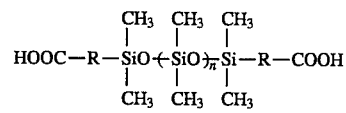

Further, a transfer roll having a styrene-butadiene layer on the surface thereof was placed between the metering roll dipped in the silicone oil bath of Compound (S-2) and the light-sensitive element, and the treatment was conducted in the same manner as above. Good releasability of the surface of light-sensitive element similar to the above was obtained.

Figure 5:
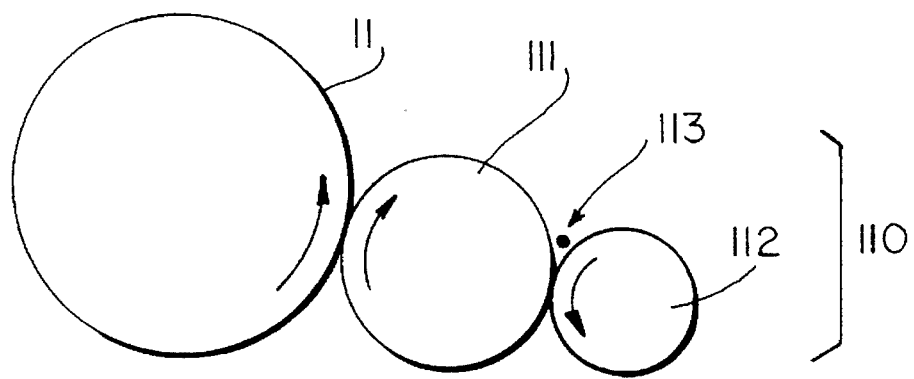
FIG. 5 is a schematic view of a device for applying Compound (S).

Moreover, Compound (S-2) 113 was supplied between the metering roll 112 and the transfer roll 111 as shown in FIG. 5 and the treatment was conducted in the same manner as above. Again, good result similar to the above was obtained.

The formation of transfer layer 22 on a primary receptor 20 was performed by the transfer method from release paper using a device as shown in FIG. 4. Specifically, on Separate Shi (manufactured by Oji Paper Co., Ltd.) as release paper 24, was coated a mixture of poly(vinyl acetate) and poly(phenetyl methacrylate) (1:1 by weight) to prepare a transfer layer having a thickness of 3 μm. The resulting paper was brought into contact with the primary receptor same as described in Example 1 under the condition of a pressure between rollers of 3 kgf/cm$^2$, a surface temperature of 60° C. and a transportation speed of 10 mm/sec, whereby the transfer layer 22 having a thickness of 3 μm was formed on the primary receptor 20.

Using the light-sensitive element and primary receptor having the transfer layer, a color duplicate was formed in the same manner as in Example 1. The color images obtained on coated paper were good and free from stain and had excellent strength similar to those in Example 2.

EXAMPLE 4

Color images were formed on coated paper in the same manner as in Example 1 except for using a transfer layer having a two-layered structure shown below on the primary receptor.

Formation of Transfer Layer

A first transfer layer having a thickness of 2.5 μm was formed on the primary receptor using Dispersion of Resin (A) (L-2) shown below, while charging the primary receptor to −150 V.

| Dispersion of Resin (A) (L-2) | |
|---|---|
| Resin Grain (ARH-1) | 10 g (solid basis) |
| Charge Control Agent (D-2) having the structure shown below | 0.02 g |
| Branched Tetradecyl Alcohol (FOC-1400 manufactured by Nissan Chemical Industries, Ltd.) | 8 g |
| Isopar G | up to make 1 liter |

Charge Control Agent (D-2)

$$\begin{array}{c}+CH_2-CH\rightarrow_{50}-(-CH-CH)_{\overline{25}}-(-CH-CH)_{\overline{25}}-\\ \quad | \quad\quad\quad | \quad\quad | \quad\quad | \quad\quad | \\ C_{12}H_{25} \quad\quad C \underset{O}{\diagdown} N \underset{O}{\diagup} C \quad COOH\ CONHC_{16}H_{33}\\ \quad\quad\quad\quad\quad | \\ \quad\quad\quad\quad C_{16}H_{33}\end{array}$$

On the first transfer layer, was formed a second transfer layer having a thickness of 2 μm using Dispersion of Resin (A) (L-3) shown below, while charging the printing receptor to −150 V.

Dispersion of Resin (A) (L-3).

The same composition as Dispersion of Resin (A) (L-2) except for using 10 g of Resin Grain (ARL-7) in place of 10 g of Resin Grain (ARH-1).

The color duplicate obtained on coated paper had clear image free from background stain and sufficient image strength.

Further, the transfer of toner image from the light-sensitive element to the primary receptor and the transfer from the primary receptor to the receiving material were conducted under condition of lower temperature and higher transportation speed as follows:

Surface temperature of primary receptor: 80° C.

Circumferential speed of the drum: 15 mm/sec

The color images obtained on coated paper according to the method under the condition as described above were also good. The residue of transfer layer was not observed on the surface of primary receptor.

Moreover, the same procedure as above was repeated using commercially available copying paper instead of coated paper as a receiving material. The color images obtained were almost the same as those on coated paper. These results illustrate that excellent color duplicates can be obtained irrespective of quality of paper used as receiving material.

EXAMPLES 5 TO 14

Color images were formed in the same manner as in Example 1 except for using Resin Grains (AR) shown in Table L below in place of 5 g of Resin Grain (ARH-4) and 5 g of Resin Grain (ARL-1) in Dispersion of Resin (A) (L-1) respectively.

TABLE L

| Example | Resin Grain (AR) | Amount (g) |
|---|---|---|
| 5 | ARH-2/ARL-1 | 8/2 |
| 6 | ARH-4/ARL-2 | 5/5 |
| 7 | ARH-5/ARL-3 | 6/4 |
| 8 | ARH-8/ARL-4 | 7/3 |
| 9 | ARH-9/ARL-5 | 4/6 |
| 10 | ARH-10/ARL-7 | 5/5 |
| 11 | ARH-11/ARL-8 | 8/2 |
| 12 | ARH-12/ARL-11 | 5/5 |
| 13 | ARH-14/ARL-10 | 4/6 |
| 14 | ARH-15/ARL-12 | 4/6 |

The color duplicates obtained had clear image free from background stain. Specifically, the toner images formed on the light-sensitive element had good reproducibility and no fog in the non-image portion, and were wholly transferred together with the transfer layer to receiving material without the formation of unevenness. Further, on the duplicate, retouching and sealing can be made same as on plain paper.

EXAMPLES 15 TO 30

The procedure for the formation of transfer image same as in Example 2 was repeated except that each of the resins shown in Table M below was used for the transfer layer in place of the thermoplastic resin, i.e., ethylene-vinyl acetate copolymer used in Example 2. Similar results to those in Example 2 were obtained.

TABLE M

| Example | Thermoplastic Resin |
|---|---|
| 15 | Cellulose Acetate Butyrate (Cellidor Bsp manufactured by Bayer AG) |
| 16 | Polyvinyl Butyral Resin (S-Lec manufactured by Sekisui Chemical Co., Ltd.) |
| 17 | Cellulose Propionate (Cellidoria manufacture Daicel Co., Ltd.) |
| 18 | Polyvinyl Acetate |
| 19 | Mixture of Vinyl Acetate/Crotonic Acid (99/1 by weight) Copolymer and Cellidor Bsp (8/2 by weight) |
| 20 | Methyl Methacrylate/Methyl Acrylate (60/40 by weight) Copolymer |
| 21 | Polypropyl Methacrylate |

TABLE M-continued

| Example | Thermoplastic Resin |
|---------|---------------------|
| 22 | Mixture of Polyvinyl Methyl Ether and Polyvinyl Acetate (5/5 by weight) |
| 23 | Polyester Resin (Kemit R-185 manufactured by Toray Industries, Inc.) |
| 24 | Styrene/Butadiene Copolymer (Sorprene 1204 manufactured by Asahi Kasei Kogyo K.K.) |
| 25 | Polydecamethylene Terephthalate |
| 26 | Polydecamethylene Isophthalate |
| 27 | Styrene/Vinyl Acetate (20/80 by weight) Copolymer |
| 28 | Polyhexamethylene Succinate |
| 29 | Poly-4-methylpentene-1 |
| 30 | Polypentamethylene Carbonate |

EXAMPLES 31 TO 37

Color images were formed in the same manner as in Example 3 except for using release paper (Sanrelease manufactured by Sanyo-Kokusaku Pulp Co., Ltd.) in place of Separate Shi and a transfer layer having a thickness of 3.5 μm composed of each of the resins (A) shown in Table N below in place of the transfer layer used in Example 3.

TABLE N

| Example | Resin (A) |
|---------|-----------|
| 31 | Mixture of Vinyl Acetate/Vinyl Butyrate (8/2 by weight) Copolymer and Benzyl Methacrylate/Methyl Methacrylate (8/2 by weight) Copolymer (60/40 by weight) |
| 32 | $\left(CH_2-C(CH_3)(COOCH_3)\right)_{70}-b-\left(CH_2-CH(COOCH_3)\right)_{30}$<br>Mw $4 \times 10^4$ (—b—: bond connecting blocks) |
| 33 | $\left(CH_2-C(CH_3)(COOCH_3)\right)_{60}\left(CH_2CH(COOCH_3)\right)_{25}\left(CH_2-C(CH_3)(COO-[C_7H_{15} / CH_2(CH_2)_9COO])\right)_{15}-CH_3$<br>Mw $4 \times 10^4$ (Mw of graft portion $4 \times 10^3$) |
| 34 | $\left(CH_2-C(CH_3)(COOC_2H_5)\right)_{70}\left(CH_2-CH(COO(CH_2)_2OOCCH_2S-[CH_2CH(COOC_4H_9)])\right)_{30}$<br>Mw $4 \times 10^4$ (Mw of graft portion $6 \times 10^3$) |
| 35 | Mixture of Vinyl Acetate/Vinyl Propionate (7/3 by weight) Copolymer and Ethylene/Vinyl Acetate Copolymer (Evaflex 420 manufactured by Du Pont-Mitsui Polychemicals Co., Ltd.) (70/30 by weight) |
| 36 | Mixture of<br>$\left(CH_2C(CH_3)(COOCH_3)\right)_{50}\left(CH_2C(CH_3)(COOC_2H_5)\right)_{35}\left(CH_2C(CH_3)(COO(CH_2)_3Si(CH_3)_2(OSi(CH_3)_2)_n CH_3)\right)_{15}$<br>Mw $5 \times 10^4$ (Mw of graft portion $1 \times 10^4$)<br>and Polyvinyl Acetate (40/60 by weight) |
| 37 | Mixture of<br>$\left[\left(CH_2-C(CH_3)(COOC_2H_5)\right)_{80}\left(CH_2CH(C_6H_4CH_3)\right)_{20}\right]_{90}-b-\left[\left(CH_2-C(CH_3)(COOCH_2CF_2CF_2H)\right)_{10}\right]$<br>Mw $4 \times 10^4$<br>and Vinyl Acetate/Ethylene (46/54 by weight) Copolymer (Evaflex 45X |

TABLE N-continued

| Example | Resin (A) |
|---|---|
| | manufactured by Du Pont-Mitsui Polychemicals Co., Ltd.) (70/30 by weight) |

The color images obtained were clear and free from background stain, and degradation of image quality was not substantially observed when compared with the original.

These results illustrate that in a case wherein a transfer layer is formed on the surface of primary receptor using release paper and transferred onto coated paper after the formation of toner image thereon, the transfer layer is uniformly and completely transferred at each transfer step without any adverse effect on image quality.

EXAMPLE 38

5 g of 4,4'-bis(diethylamino)-2,2'-dimethyltriphenylmethane as an organic photoconductive substance, 4 g of Binder Resin (B-3) having the structure shown below, 0.4 g of Resin (P-27), 40 mg of Dye (D-1) having the structure shown below, and 0.2 g of Anilide Compound (C) having the structure shown below as a chemical sensitizer were dissolved in a mixed solvent of 30 ml of methylene chloride and 30 ml of ethylene chloride to prepare a solution for light-sensitive layer.

Binder Resin (B-3)

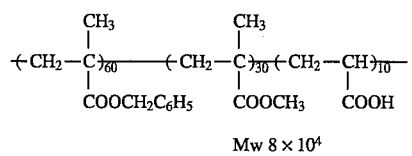

Mw $8 \times 10^4$

Dye (D-1)

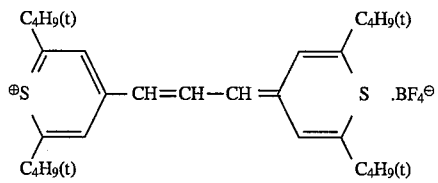

Anilide Compound (B)

-continued
Binder Resin (B-3)

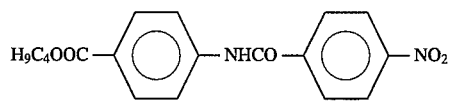

The resulting solution for light-sensitive layer was coated on a conductive transparent substrate composed of a 100 μm-thick polyethylene terephthalate film having a deposited layer of indium oxide thereon (surface resistivity: $10^3 \Omega$) by a wire round rod to prepare a light-sensitive element having an organic light-sensitive layer having a thickness of about 4 μm. The adhesive strength of the surface of light-sensitive element was 8 g.f.

The procedure same as in Example 1 was repeated except for using the resulting light-sensitive element in place of the light-sensitive element employed in Example 1 to prepare transferred images. The color images obtained on coated paper were clear and free from background stain and had good image strength.

EXAMPLE 39

A mixture of 5 g of a bisazo pigment having the structure shown below, 95 g of tetrahydrofuran and 5 g of a polyester resin (Vylon 200 manufactured by Toyobo Co., Ltd.) was thoroughly pulverized in a ball mill. The mixture was added to 520 g of tetrahydrofuran with stirring. The resulting dispersion was coated on a conductive transparent substrate used in Example 38 by a wire round rod to prepare a charge generating layer having a thickness of about 0.7 μm.

Bisazo Pigment

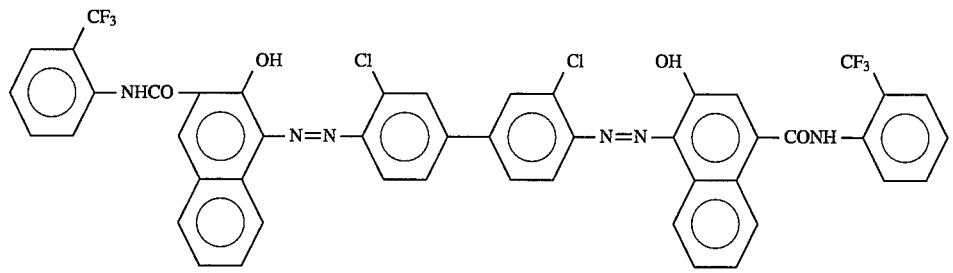

A mixed solution of 20 g of a hydrazone compound having the structure shown below, 20 g of a polycarbonate resin (Lexan 121 manufactured by General Electric Co., Ltd.) and 160 g of tetrahydrofuran was coated on the above-described charge generating layer by a wire round rod, dried at 60° C. for 30 seconds and then heated at 100° C. for 20 seconds to form a charge transporting layer having a thickness of about 18 μm whereby an electrophotographic light-sensitive layer of a double-layered structure was prepared.

Hydrazone Compound

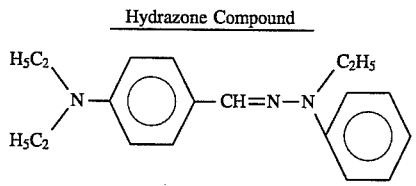

A mixed solution of 13 g of Resin (P-39) having the structure shown below, 0.2 g of phthalic anhydride, 0.002 g of o-chlorophenol and 100 g of toluene was coated on the light-sensitive layer at a dry thickness of 1 μm by a wire round rod, set to touch and heated at 120° C. for one hour to prepare a surface layer for imparting releasability. The adhesive strength of the surface of the resulting light-sensitive element was 5 g.f.

Resin (P-39)

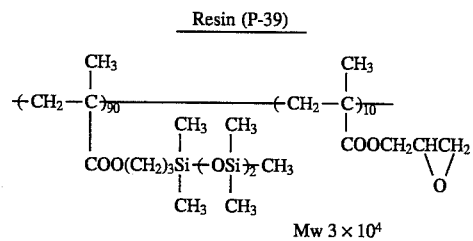

The resulting light-sensitive element was charged to a surface potential of +500 V in dark and exposed imagewise using a helium-neon laser of 633 nm at an irradiation dose on the surface of the light-sensitive element of 30 erg/cm$^2$, followed by conducting the same procedure as in Example 1 to form color toner images on the light-sensitive element. Then, according to the same procedure as in Example 1, full-color images were formed on coated paper. The color duplicate obtained exhibited good characteristics similar to those in Example 1.

EXAMPLE 40

A mixture of 100 g of photoconductive zinc oxide, 15 g of Binder Resin (B-4) having the structure shown below, 5 g of Binder Resin (B-5) having the structure shown below, 2 g of Resin (P-28), 0.01 g of Dye (D-2) having the structure shown below, 0.1 g of salicylic acid and 150 g of toluene was dispersed in a ball mill for 2 hours to prepare a light-sensitive dispersion.

Binder Resin (B-4)

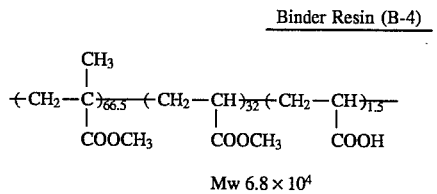

Binder Resin (B-5)

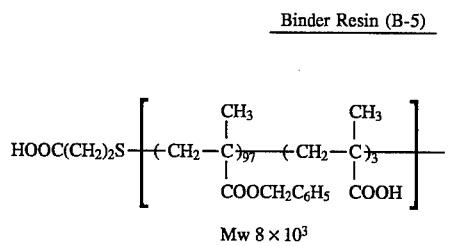

Dye (D-2)

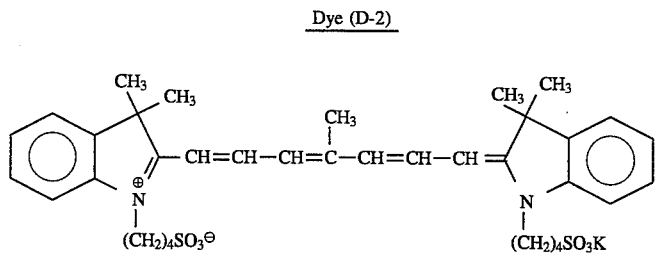

The resulting dispersion was coated on base paper for a paper master having a thickness of 0.2 mm, which had been subjected to electrically conductive treatment and solvent-resistant treatment, by a wire bar at a coverage of 25 g/m$^2$ set to touch, heated in a circulating oven at 110° C. for 20 seconds and allowed to stand in a dark place under conditions of 25° C. and 65% RH for 24 hours. The adhesive strength of the surface of resulting light-sensitive element was 8 g.f.

The light-sensitive element was charged to −600 V with a corona discharge in a dark place and exposed to light using a semiconductor laser having an oscillation wavelength of 780 nm at an irradiation dose of 25 erg/cm$^2$ on the surface of the light-sensitive element in a positive mirror image mode based on an information for yellow color separation of digital image data same as those described in Example 1. The residual potential of the exposed areas was −120 V. Then, the exposed light-sensitive element was subjected to normal development using a liquid developer prepared by diluting a yellow toner for an electrostatic color plotter (Versateck 3000 manufactured by Xerox Corp.) with 50-fold Isopar H (manufactured by Esso Standard Oil Co.) in a developing machine having a pair of flat development electrodes while a bias voltage of −200 V was applied to the electrode on the side of the light-sensitive element to thereby electrodeposit toner particles on the unexposed areas. The light-sensitive element was then rinsed in a bath of Isopar H alone to remove stains in the non-image areas.

The above procedure was repeated using each information for magenta, cyan and black in place of the information for yellow.

The formation of transfer layer on a primary receptor, transfer of the toner image to the transfer layer of primary receptor and transfer of the transfer layer to a receiving material were performed in the same manner as in Example 1 to prepare color images on coated paper. The color duplicate obtained had clear image free from background stain and good image strength.

EXAMPLES 41 TO 60

Each light-sensitive element was prepared in the same manner as in Example 1 except for using each of the resins (P) and/or resin grains (L) shown in Table O below in place of 0.3 g of Resin (P-1) employed in Example 1.

TABLE O

| Example | Resin (P) and/or Resin Grain (L) | Amount |
|---|---|---|
| 41 | P-2 | 0.2 g |
| 42 | L-14 | 0.5 g |
| 43 | P-6 | 0.3 g |
| 44 | P-11 | 0.3 g |
| 45 | L-19 | 0.4 g |
| 46 | P-19 | 0.2 g |
|  | L-23 | 0.3 g |
| 47 | P-13 | 0.8 g |
| 48 | P-15 | 1.0 g |
| 49 | P-32 | 1.2 g |
| 50 | P-17 | 0.6 g |
| 51 | P-22 | 0.2 g |
|  | L-9 | 0.4 g |
| 52 | P-28 | 0.4 g |
| 53 | P-30 | 0.3 g |
| 54 | L-2 | 0.6 g |
| 55 | P-34 | 0.3 g |
| 56 | P-36 | 0.25 g |
| 57 | P-31 | 0.1 g |
|  | L-15 | 0.3 g |
| 58 | P-35 | 0.3 g |
| 59 | L-22 | 0.3 g |
| 60 | P-38 | 0.25 g |

The image forming performance and transferability were evaluated in the same manner as in Example 1 with respect to each of these light-sensitive elements. The color duplicates obtained on coated paper had clear images free from background stain and good image strength.

EXAMPLES 61 TO 71

A mixture of 3.5 g of X-form metal-free phthalocyanine, 10 g of Binder Resin (B-6) having the structure shown below, and 80 g of tetrahydrofuran was put in a 500 ml-volume glass container together with glass beads and dispersed in a paint shaker (manufactured by Toyo Seiki Seisakusho Co.) for 60 minutes. To the dispersion were added 0.3 g of each of the resins (P) or resin grains (L) shown in Table P below and the compounds for crosslinking shown in Table P below, followed by further dispersing for 10 minutes. The glass beads were separated by filtration to prepare a dispersion for a light-sensitive layer.

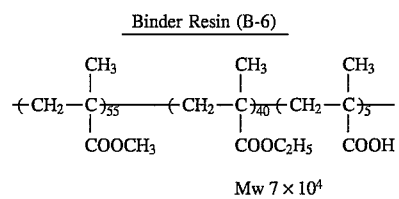

Binder Resin (B-6)

Mw $7 \times 10^4$

TABLE P

| Example | Resin (P) or Resin Grain (L) | Compound for Crosslinking | Amount |
|---|---|---|---|
| 61 | P-30 | Phthalic anhydride | 0.2 g |
|  |  | Zirconium acetylacetone | 0.01 g |
| 62 | P-22 | Gluconic acid | 0.008 g |
| 63 | P-25 | N-Methylaminopropanol | 0.25 g |
|  |  | Dibutyltin dilaurate | 0.001 g |
| 64 | P-9 | N,N'-Dimethylpropanediamine | 0.3 g |
| 65 | P-7 | Propylene glycol | 0.2 g |
|  |  | Tetrakis(2-ethylhexane-diolato)titanium | 0.008 g |
| 66 | L-18 | — |  |
| 67 | L-15 | N,N-Dimethylpropanediamine | 0.25 g |
| 68 | P-13 | Divinyl adipate | 0.3 g |
|  |  | 2,2'-Azobis(isobutyronitrile) | 0.001 g |
| 69 | P-14 | Propyltriethoxysilane | 0.01 g |
| 70 | L-21 | N,N-Diethylbutanediamine | 0.3 g |
| 71 | P-5 | Ethylene diglycidyl ether | 0.2 g |
|  |  | o-Chlorophenol | 0.001 g |

The resulting dispersion was coated on an aluminum support by a wire bar at a dry thickness of 8 μm, set to touch, dried in a circulating oven at 110° C. for 30 seconds and then heated at 140° C. for one hour.

The same procedure as in Example 3 was conducted except for using the resulting light-sensitive element in place of the light-sensitive element employed in Example 3 to prepare transferred images. The color duplicates obtained on coated paper had clear images free from background stain and good image strength.

EXAMPLE 72

Color images were formed on coated paper in the same manner as in Example 2, except for replacing the means for imparting releasability to the surface of light-sensitive element with the following method. Specifically, an AW-treated felt (material: wool having a thickness of 15 mm and a width of 20 mm) impregnated uniformly with 2 g of Compound (S-3), i.e., dimethyl silicone oil KF-96L-2.0 (manufactured by Shin-Etsu Silicone Co., Ltd.) was pressed under a pressure of 200 g on the surface of light-sensitive element and the light-sensitive element was rotated at a circumferential speed of 20 mm/sec for 30 seconds. The adhesive strength of the surface of light-sensitive element thus-treated was 5 g.f. The color images obtained on coated paper were good similar to those in Example 2.

EXAMPLE 73

Color images were formed on coated paper in the same manner as in Example 2, except for replacing the means for imparting releasability to the surface of light-sensitive element with the following method. Specifically, a roller having a heating means integrated therein and covered with cloth impregnated with Compound (S-4), i.e., fluorine-containing surface active agent (Sarflon S-141 manufactured by Asahi Glass Co., Ltd.) was heated to a surface temperature of 60° C., then brought into contact with the light-sensitive element and they were rotated at a circumferential speed of 20 mm/sec for 30 seconds. The adhesive strength of the surface of light-sensitive element thus-treated was 12 g.f. The color images on coated paper were good similar to those in Example 2.

EXAMPLE 74

Color images were formed on coated paper in the same manner as in Example 2, except for replacing the means for imparting releasability to the surface of light-sensitive element with the following method. Specifically, a silicone rubber roller comprising a metal axis covered with silicone rubber (manufactured by Kinyosha K.K.) was pressed on the light-sensitive element at a nip pressure of 500 gf/cm$^2$ and rotated at a circumferential speed of 15 mm/sec for 10 seconds. The adhesive strength of the surface of light-sensitive element thus-treated was 15 g.f. The color images on coated paper were good similar to those in Example 2.

EXAMPLES 75 TO 95

Color images were formed on coated paper in the same manner as in Example 2, except for using each of the solutions containing the compound (S) shown in Table Q below dissolved in one liter of Isopar G in place of the solution of Compound (S-1) as the means for imparting releasability to the surface of amorphous silicon light-sensitive element used in Example 2. The adhesive strength of the surface of each of the light-sensitive element thus-treated was in a range of from 3 to 20 g.f. The color images obtained on coated paper were clear and free from background stain and had good image strength similar to those in Example 2.

TABLE Q

| Example | | Compound (S) Containing Fluorine and/or Silicon Atom | Amount (g/l) |
|---|---|---|---|
| 75 | (S-5) | Polyether-modified silicone (TSF 4446 manufactured by Toshiba Silicone Co., Ltd.) $$CH_3-\underset{\underset{CH_3}{\mid}}{\overset{\overset{CH_3}{\mid}}{Si}}O(\underset{\underset{CH_3}{\mid}}{\overset{\overset{CH_3}{\mid}}{SiO}})_x(\underset{\underset{POA}{\mid}}{\overset{\overset{CH_3}{\mid}}{SiO}})_y\underset{\underset{CH_3}{\mid}}{\overset{\overset{CH_3}{\mid}}{Si}}-CH_3$$ (presumptive structure) POA portion: polyoxyalkylene comprising ethylene oxide (EO) and propylene oxide (PO) (EO/PO: 100/0 by mole) | 0.5 |
| 76 | (S-6) | Polyether-modified silicone (TSF 4453 manufactured by Toshiba Silicon Co., Ltd.) $$CH_3-\underset{\underset{CH_3}{\mid}}{\overset{\overset{CH_3}{\mid}}{Si}}O(\underset{\underset{CH_3}{\mid}}{\overset{\overset{CH_3}{\mid}}{SiO}})_x(\underset{\underset{POA}{\mid}}{\overset{\overset{CH_3}{\mid}}{SiO}})_y\underset{\underset{CH_3}{\mid}}{\overset{\overset{CH_3}{\mid}}{Si}}-CH_3$$ (presumptive structure) POA portion: (EO/PO: 75/25 by mole) | 0.8 |
| 77 | (S-7) | Polyether-modified silicone (TSF 4460 manufactured by Toshiba Silicone Co., Ltd.) $$CH_3-\underset{\underset{CH_3}{\mid}}{\overset{\overset{CH_3}{\mid}}{Si}}O(\underset{\underset{CH_3}{\mid}}{\overset{\overset{CH_3}{\mid}}{SiO}})_x(\underset{\underset{POA}{\mid}}{\overset{\overset{CH_3}{\mid}}{SiO}})_y\underset{\underset{CH_3}{\mid}}{\overset{\overset{CH_3}{\mid}}{Si}}-CH_3$$ (presumptive structure) POA portion: (EO/PO: 0/100 by mole) | 0.5 |
| 78 | (S-8) | Higher fatty acid-modified silicone (TSF 411 manufactured by Toshiba Silicone Co., Ltd.) $$R'OCORSiO(SiO)_nSiRCOOR'$$ with $CH_3$ groups (presumtive structure) | 1.0 |
| 79 | (S-9) | Epoxy-modified silicone (XF42-A5041 manufactured by Toshiba Silicone Co., Ltd.) $$(CH_3)_3SiO(SiO)_x(SiO)_y(SiO)_zSi(CH_3)$$ with side groups $CH_3$, $R$, $POA$ and $OCH_2CHCH_2$ with epoxide O (presumptive structure) | 1.2 |
| 80 | (S-10) | Fluorine containing oligomer (Sarflon S-382 manufactured by Asahi Glass Co., Ltd.) (Structure unknown) | 0.3 |

TABLE Q-continued

| Example | | Compound (S) Containing Fluorine and/or Silicon Atom | Amount (g/l) |
|---|---|---|---|
| 81 | (S-11) | $+CH_2-\underset{COOC_8H_{17}}{\underset{|}{\overset{CH_3}{\overset{|}{C}}}})_{60}-b-(CH_2\underset{COO(CH_2)_2C_8F_{17}}{\underset{|}{\overset{CH_3}{\overset{|}{C}}}})_{40}-$  Mw $6 \times 10^3$<br>—b—: bond connecting blocks | 1.5 |
| 82 | (S-12) | $+CH_2-\overset{CH_3}{\underset{|}{C}})_{75}-(CH_2-\overset{CH_3}{\underset{|}{C}})_{25}-$<br>with side chains: $COO(CH_2)_2S+CH_2CH+$, $COO(CH_2CH_2O)_2OCH_3$, $COO(CH_2)_3Si-CH_3$ with $OSi(CH_3)_3$ groups<br>Mw $8 \times 10^3$ (Mw of graft portion $3 \times 10^3$) | 2 |
| 83 | (S-13) | $R_fO(C_2H_4O)_n(C_3H_6O)_pH$<br>$R_f$: $C_8F_{17}$–$C_{12}F_{25}$ | 0.1 |
| 84 | (S-14) | $CH_2OCOC_8F_{17}$<br>$\|$<br>$CHOH$<br>$\|$<br>$CH_2OCOC_8F_{17}$ | 0.5 |
| 85 | (S-15) | $R_fC_2H_4OOCCH_2$ ... $CH_2COOC_2H_4R_f$<br>$R_fC_2H_4OOC-COOCNHC_6H_{12}NHCOOC-COOC_2H_4R_f$   $R_f$: $C_4F_9$<br>$R_fC_2H_4OOCCH_2$ ... $CH_2COOC_2H_4R_f$ | 0.3 |
| 86 | (S-16) | SH<br>$\|$<br>$CHCOOC_8H_{17}$<br>$\|$<br>$CH_2COOC_2H_4C_{10}F_{21}$ | 1.0 |
| 87 | (S-17) | $+SiO)_a-(SiO)_b-(Si-O)_c$ with $CH_3$, $C_2H_4CF_3$, $C_3H_6(OC_2H_4)_pOH$ substituents | 0.5 |
| 88 | (S-18) | $CF_3$<br>$\|$<br>$F+CFCF_2O)_n-(C_3H_6O)_m-CH_3$ | 0.4 |
| 89 | (S-19) | Carboxy-modified silicone (X-22-3701E manufactured by Shin-Etsu Silicone Co., Ltd.)<br>$(CH_3)_3SiO-[SiO(CH_3)_2]_m-[SiO(CH_3)(RCOOH)]_n-Si(CH_3)_3$<br>(presumptive structure) | 0.5 |
| 90 | (S-20) | Carbinol-modified silicone (X-22-176B manufactured by Shin-Stsu Silicone Co., Ltd.)<br>$(CH_3)_3SiO-(Si(CH_3)_2-O)_n-Si(CH_3)_2-R(OH)_2$<br>(presumptive structure) | 1.0 |
| 91 | (S-21) | Mercapto-modified silicone (X-22-167B manufactured by Shin-Etsu Silicone Co., Ltd.) | |

TABLE Q-continued

| Example | Compound (S) Containing Fluorine and/or Silicon Atom | Amount (g/l) |
|---|---|---|
| | $HS-R-\underset{\underset{CH_3}{\mid}}{\overset{\overset{CH_3}{\mid}}{Si}}O-\left(\underset{\underset{CH_3}{\mid}}{\overset{\overset{CH_3}{\mid}}{Si}}-O\right)_n-\underset{\underset{CH_3}{\mid}}{\overset{\overset{CH_3}{\mid}}{Si}}-R-SH$ (presumptive structure) | 2 |
| 92 (S-22) | Amino-modified silicone (KF-804 manufactured by Shin-Etsu Silicone Co., Ltd.) $(CH_3)_3SiO-\left(\underset{\underset{CH_3}{\mid}}{\overset{\overset{CH_3}{\mid}}{SiO}}\right)_n-\left(\underset{\underset{R-NH_2}{\mid}}{\overset{\overset{CH_3}{\mid}}{SiO}}\right)_n-Si(CH_3)_3$ (presumptive structure) | 2.5 |
| 93 (S-23) | $+CH_2-\underset{\underset{COOCH}{\mid}}{\overset{\overset{CH_3}{\mid}}{C}}\xrightarrow{70}+CH_2-\underset{\underset{COOCH_2S}{\mid}}{\overset{\overset{CH_3}{\mid}}{C}}\xrightarrow{30}\left[+CH_2-\underset{\underset{COOC_4H_9}{\mid}}{\overset{\overset{CH_3}{\mid}}{C}}\xrightarrow{95}+CH_2-\underset{\underset{COOH}{\mid}}{\overset{\overset{CH_3}{\mid}}{C}}\xrightarrow{5}\right]$ with $CF_3$ / $CF_3$ on COOCH Mw $1 \times 10^4$ (Mw of graft portion $6 \times 10^3$) | 5 |
| 94 (S-24) | $+CH_2-\underset{\underset{COOC_8H_{17}}{\mid}}{\overset{\overset{CH_3}{\mid}}{C}}\xrightarrow{60}+CH_2-\underset{\underset{COO(CH_2)_2S}{\mid}}{\overset{\overset{CH_3}{\mid}}{C}}\xrightarrow{40}-\left[CH_2-\underset{\underset{COO(CH_2)_3Si(OSi(CH_3)_3)_3}{\mid}}{\overset{\overset{CH_3}{\mid}}{C}}\right]-$ Mw $8 \times 10^4$ (Mw of graft portion $4 \times 10^3$) | 10 |
| 95 (S-25) | $+CH_2-\overset{\overset{CH_3}{\mid}}{C}\xrightarrow{43}-b-\left[+CH_2-\overset{\overset{CH_3}{\mid}}{\underset{\underset{COOC_{10}H_{21}}{\mid}}{C}}\xrightarrow{11}+CH_2-\overset{\overset{CH_3}{\mid}}{\underset{\underset{COO(CH_2)_2OP-OH}{\mid}}{C}}\xrightarrow{3}\right]-b+CH_2-\overset{\overset{CH_3}{\mid}}{\underset{\underset{COO(CH_2)_2Si(OSi)_3CH_3}{\mid}}{C}}\xrightarrow{43}-$ with $COO(CH_2)_3Si(OSi)_3CH_3$ and $CH_3\ CH_3$ groups; Mw $1.5 \times 10^4$ | 8 |

EXAMPLE 96

Full-color duplicate was prepared in the same manner as in Example 1 except for using 10 g of Thermoplastic Resin Grain (AR-1) having a core/shell structure in place of 5 g of Thermoplastic Resin Grain (ARH-4) and 5 g of Thermoplastic Resin Grain (ARL-1). The color duplicate obtained exhibited the excellent characteristics similar to those in Example 1.

Further, the same procedure as above was repeated except for the following modifications on the conditions of transfer.

Conditions of Transfer of Toner Image from Light-Sensitive Element to Primary Receptor Surface temperature of light-sensitive element: 60° C.
Surface temperature of primary receptor: 90° C.
Nip pressure: 4 Kgf/cm²
Circumferential speed: 70 mm/sec Conditions of Transfer of Transfer Layer from Primary Receptor to Receiving Material Surface temperature of primary receptor: 60° C.
Temperature of back-up roller for transfer: 130° C.
Temperature of back-up roller for release: 10° C.
Nip pressure: 3.5 Kgf/cm²
Circumferential speed: 70 mm/sec The color duplicate obtained exhibited the excellent characteristics same as above. These results demonstrate that the increased speed for transfer can be achieved ever under the decreased temperature or the reduced pressure by employing the thermoplastic resin grains of the core/shell structure according to the present invention.

While the invention has been described in detail and with reference to specific embodiments thereof, it will be apparent to one skilled in the art that various changes and modifications can be made therein without departing from the spirit and scope thereof.

What is claimed is:

1. A method of forming a color image comprising forming at least one color toner image on an electrophotographic light-sensitive element whose surface has releasability by an electrophotographic process, transferring the toner image onto a primary receptor having a peelable transfer layer provided thereon, and then transferring the toner image together with the transfer layer from the primary receptor onto a receiving material.

2. A method of forming a color image as claimed in claim 1, wherein the surface of electrophotographic light-sensitive element has an adhesive strength of not more than 100 gram.force, which is measured according to JIS Z 0237-1980 "Testing methods of pressure sensitive adhesive tapes and sheets".

3. A method of forming a color image as claimed in claim 2, wherein the electrophotographic light-sensitive element comprises amorphous silicon as a photoconductive substance.

4. A method of forming a color image as claimed in claim 2, wherein the electrophotographic light-sensitive element contains a polymer having a polymer component containing at least one of a silicon atom and a fluorine atom in a region near to the surface thereof.

5. A method of forming a color image as claimed in claim 4, wherein the polymer is a block copolymer comprising at least one polymer segment (A) containing at least 50% by weight of a fluorine atom and/or silicon atom-containing polymer component and at least one polymer segment (B) containing 0 to 20% by weight of a fluorine atom and/or silicon atom-containing polymer component, the polymer segments (A) and (B) being bonded in the form of blocks.

6. A method of forming a color image as claimed in claim 5, wherein the polymer further contains a polymer component containing a photo- and/or heat-curable group.

7. A method of forming a color image as claimed in claim 4, wherein the polymer further contains a polymer component containing a photo- and/or heat-curable group.

8. A method of forming a color image as claimed in claim 4, wherein the electrophotographic light-sensitive element further contains a photo- and/or heat-curable resin.

9. A method of forming a color image as claimed in claim 2, wherein the electrophotographic light-sensitive element includes a surface having thereon a compound which contains a fluorine atom and/or a silicon atom.

10. A method of forming a color image as claimed in claim 9, wherein the compound (S) is soluble at least 0.01 g in one liter of an electrically insulating organic solvent having an electric resistance of not less than $10^8$ $\Omega \cdot cm$ and a dielectric constant of not more than 3.5 at 25° C.

11. A method of forming a color image as claimed in claim 1, wherein the electrophotographic process comprises a scanning exposure system using a laser beam based on digital information and a development system using a liquid developer.

12. A method of forming a color image as claimed in claim 1, wherein the transfer layer comprises a resin which is peelable from a primary receptor at a temperature of not more than 180° C. or at a pressure not more than 20 kgf/cm$^2$.

13. A method of forming a color image as claimed in claim 12, wherein the resin has a glass transition point of not more than 140° C. or a softening point of not more than 180° C.

14. A method of forming a color image as claimed in claim 12, wherein the transfer layer comprises a resin (AH) having a glass transition point of not less than 30° C. or a softening point of not less than 35° C. and a resin (AL) having a glass transition point or a softening point at least 2° C. lower than the glass transition point or the softening point, respectively, of the resin (AH).

15. A method of forming a color image as claimed in claim 1, wherein the transfer layer is composed of a first layer which is in contact with the surface of primary receptor and which comprises a resin having a relatively high glass transition point or softening point, and a second layer provided thereon comprising a resin having a relatively low glass transition point or softening point, and in which the difference in the glass transition point or softening point therebetween is at least 2° C.

16. A method of forming a color image comprising forming at least one color toner image on an electrophotographic light-sensitive element whose surface has releasability by an electrophotographic process, forming a peelable transfer layer on a primary receptor, transferring the toner image onto the primary receptor having the peelable transfer layer provided thereon, and then transferring the toner image together with the transfer layer from the primary receptor onto a receiving material.

17. A method of forming a color image as claimed in claim 16, wherein the transfer layer is formed by a hot-melt coating method.

18. A method of forming a color image as claimed in claim 16, wherein the transfer layer is formed by an electrodeposition coating method.

19. A method of forming a color image as claimed in claim 18, wherein grains mainly comprising a resin (A) are supplied as a dispersion thereof in an electrical insulating solvent having an electric resistance of not less than $10^8$ $\Omega \cdot cm$ and a dielectric constant of not more than 3.5.

20. A method of forming a color image as claimed in claim 19, wherein the grains have a core/shell structure.

21. A method of forming a color image as claimed in claim 16, wherein the transfer layer is formed by a transfer method from a releasable support.

22. An apparatus for forming a color image comprising a means for forming at least one color toner image on an electrophotographic light-sensitive element whose surface has releasability by an electrophotographic process, a means for providing a peelable transfer layer on a primary receptor, a means for transferring the toner image onto the primary receptor, and a means for transferring the toner image together with the transfer layer from the primary receptor onto a receiving material.

23. An apparatus for forming a color image as claimed in claim 22, wherein the apparatus further comprises a means for applying a compound (S) which contains a fluorine atom and/or a silicon atom to the surface of electrophotographic light-sensitive element.

* * * * *